United States Patent

Yudasaka et al.

[11] Patent Number: 5,989,945
[45] Date of Patent: Nov. 23, 1999

[54] THIN FILM DEVICE PROVIDED WITH COATING FILM, LIQUID CRYSTAL PANEL AND ELECTRONIC DEVICE, AND METHOD FOR MAKING THE THIN FILM DEVICE

[75] Inventors: Ichio Yudasaka; Tatsuya Shimoda; Sadao Kanbe; Wakao Miyazawa, all of Suwa, Japan

[73] Assignee: Seiko Epson Corporation, Tokyo, Japan

[21] Appl. No.: 08/983,036

[22] PCT Filed: May 14, 1997

[86] PCT No.: PCT/JP97/01618

§ 371 Date: Feb. 13, 1998

§ 102(e) Date: Feb. 13, 1998

[87] PCT Pub. No.: WO97/43689

PCT Pub. Date: Nov. 20, 1997

[30] Foreign Application Priority Data

May 15, 1996 [JP] Japan .................................. 8-120653
Sep. 19, 1996 [JP] Japan .................................. 8-248071
Nov. 14, 1996 [JP] Japan .................................. 8-303387

[51] Int. Cl.⁶ .......................... H01L 29/04; G02F 1/136; G02F 1/1333; B05C 5/02
[52] U.S. Cl. .......................... 438/149; 438/608; 438/609; 438/626; 257/72; 257/59; 257/64; 257/347; 428/1; 428/447; 346/140 R; 427/419.2
[58] Field of Search .............................. 257/59, 347, 348, 257/349, 350, 72, 64; 349/39, 139; 438/149, 608, 609, 626, 627, 789, 790, 787; 118/56, 58, 255, 267; 347/20, 37, 40; 427/419.2, 419.8; 346/140 R

[56] References Cited

U.S. PATENT DOCUMENTS

| | | |
|---|---|---|
| 4,569,305 | 2/1986 | Ferri et al. . |
| 4,687,352 | 8/1987 | Igi et al. . |
| 4,792,817 | 12/1988 | Barney . |
| 5,534,716 | 7/1996 | Takemura . |
| 5,645,901 | 7/1997 | Fukuchi et al. . |
| 5,728,626 | 3/1998 | Allman et al. . |
| 5,744,171 | 4/1998 | Schneider . |
| 5,757,453 | 5/1998 | Shin et al. . |
| 5,759,268 | 6/1998 | Begin et al. . |
| 5,770,260 | 6/1998 | Fukuyama et al. . |
| 5,779,799 | 7/1998 | Davis . |
| 5,784,132 | 6/1998 | Hashimoto . |

FOREIGN PATENT DOCUMENTS

| | | |
|---|---|---|
| 61-78165 | 4/1986 | Japan . |
| 62-223727 | 10/1987 | Japan . |
| 3-102324 | 4/1991 | Japan . |
| 3-126921 | 5/1991 | Japan . |
| 4-253033 | 9/1992 | Japan . |
| 5-105486 | 4/1993 | Japan . |
| 5-116941 | 5/1993 | Japan . |
| 6-204168 | 7/1994 | Japan . |
| 6-281958 | 10/1994 | Japan . |
| 7-122475 | 5/1995 | Japan . |
| 8-1065 | 1/1996 | Japan . |
| 8-32085 | 2/1996 | Japan . |

*Primary Examiner*—Charles Bowers
*Assistant Examiner*—Martin Sulsky
*Attorney, Agent, or Firm*—Oliff & Berridge, PLC

[57] ABSTRACT

Any one of an insulating film forming a TFT, a silicon film and a conductive film is formed by applying a solution and annealing it. In a spin coater (102), a coating solution containing a thin film component which is supplied from a solution storage section (105) is spin-coated onto a substrate. The substrate after coating the coating solution is annealed in an annealing section (103) to form a coating film on the substrate. Additional laser annealing improves one of film characteristics, i.e., crystallinity, density and adhesiveness. Application of the coating solution or a resist by an ink jet process increases utilization of the solution and permits forming a patterned coating film. Because a thin film device in accordance with the present invention is inexpensive and has a high throughput, TFT production by a production system having high utilization of the coating solution drastically reduces initial investment and production cost of a liquid crystal display device.

57 Claims, 39 Drawing Sheets

-- PRIOR ART --

-- PRIOR ART --

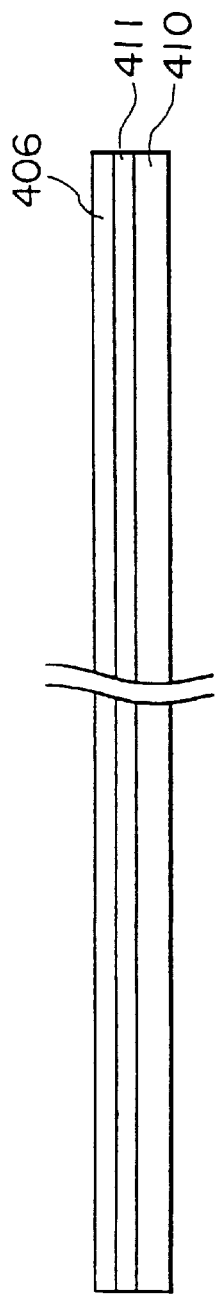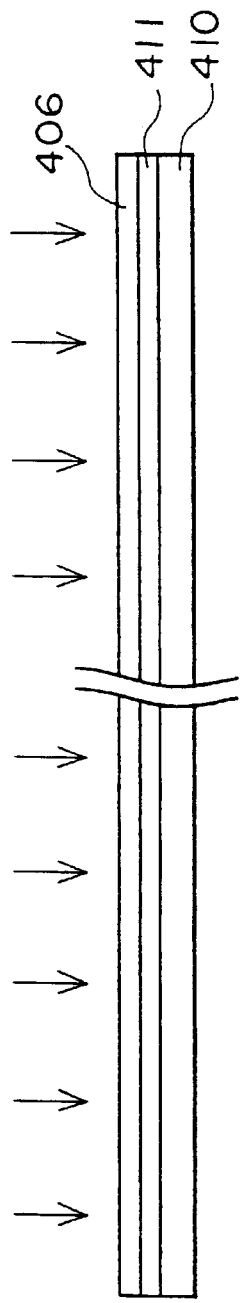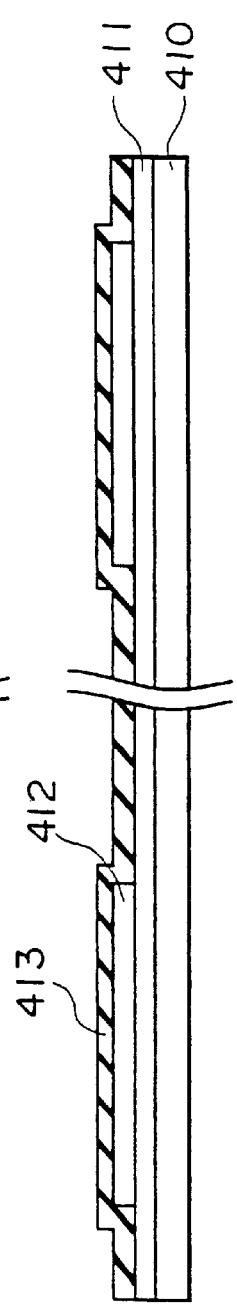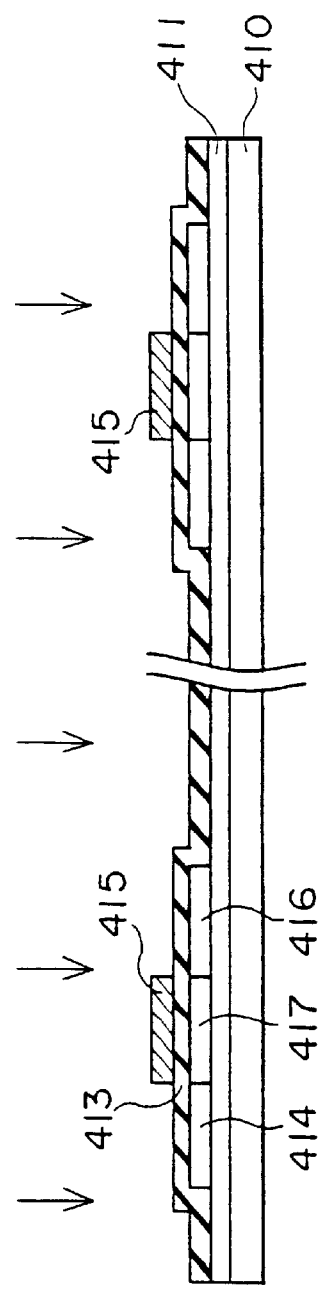

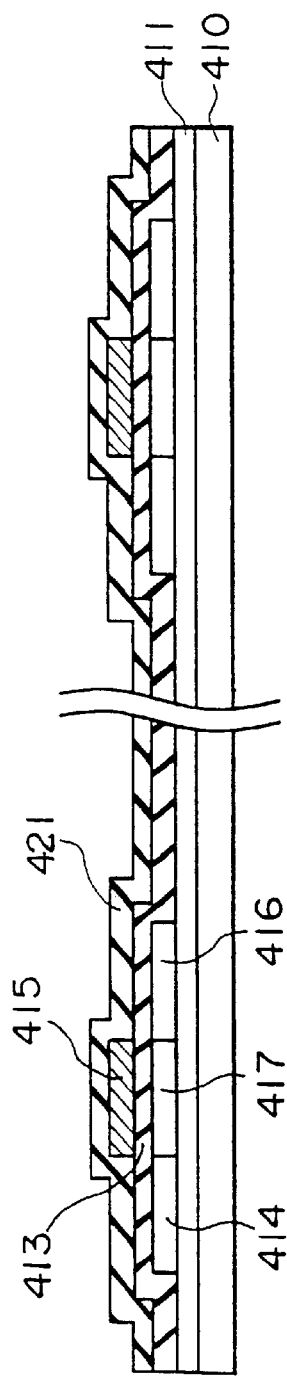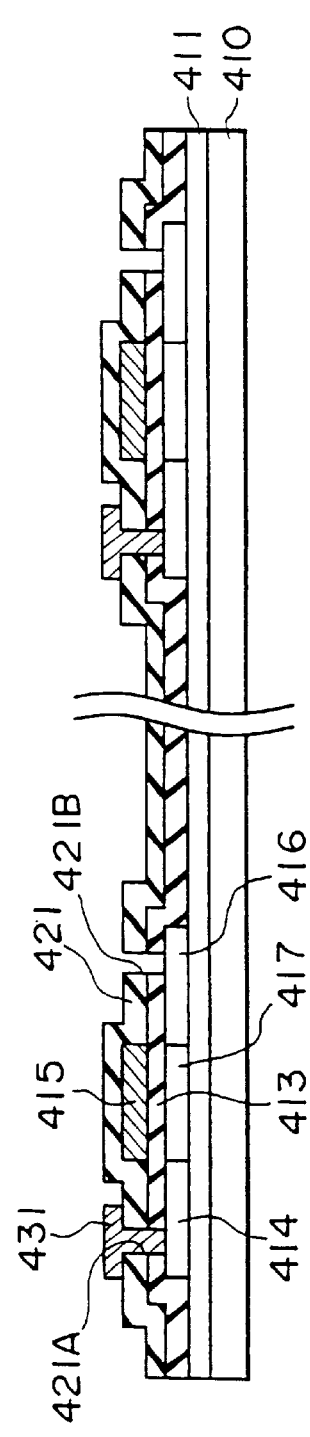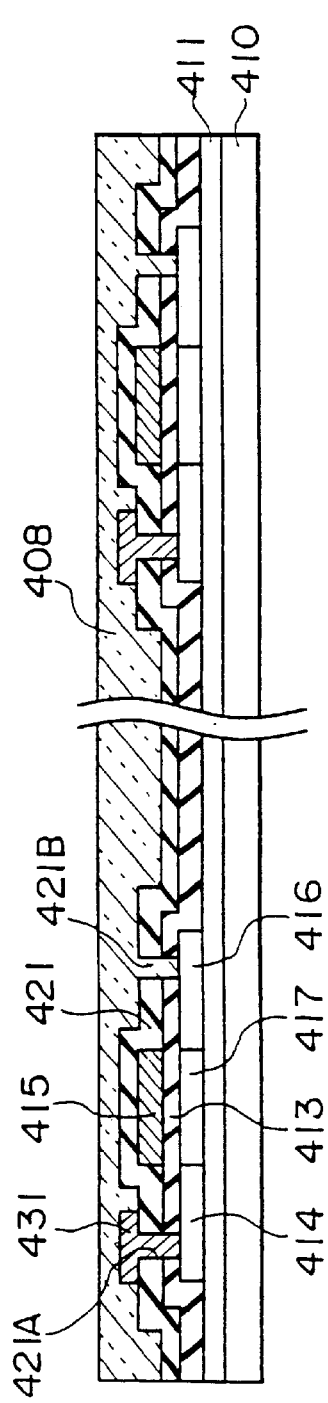

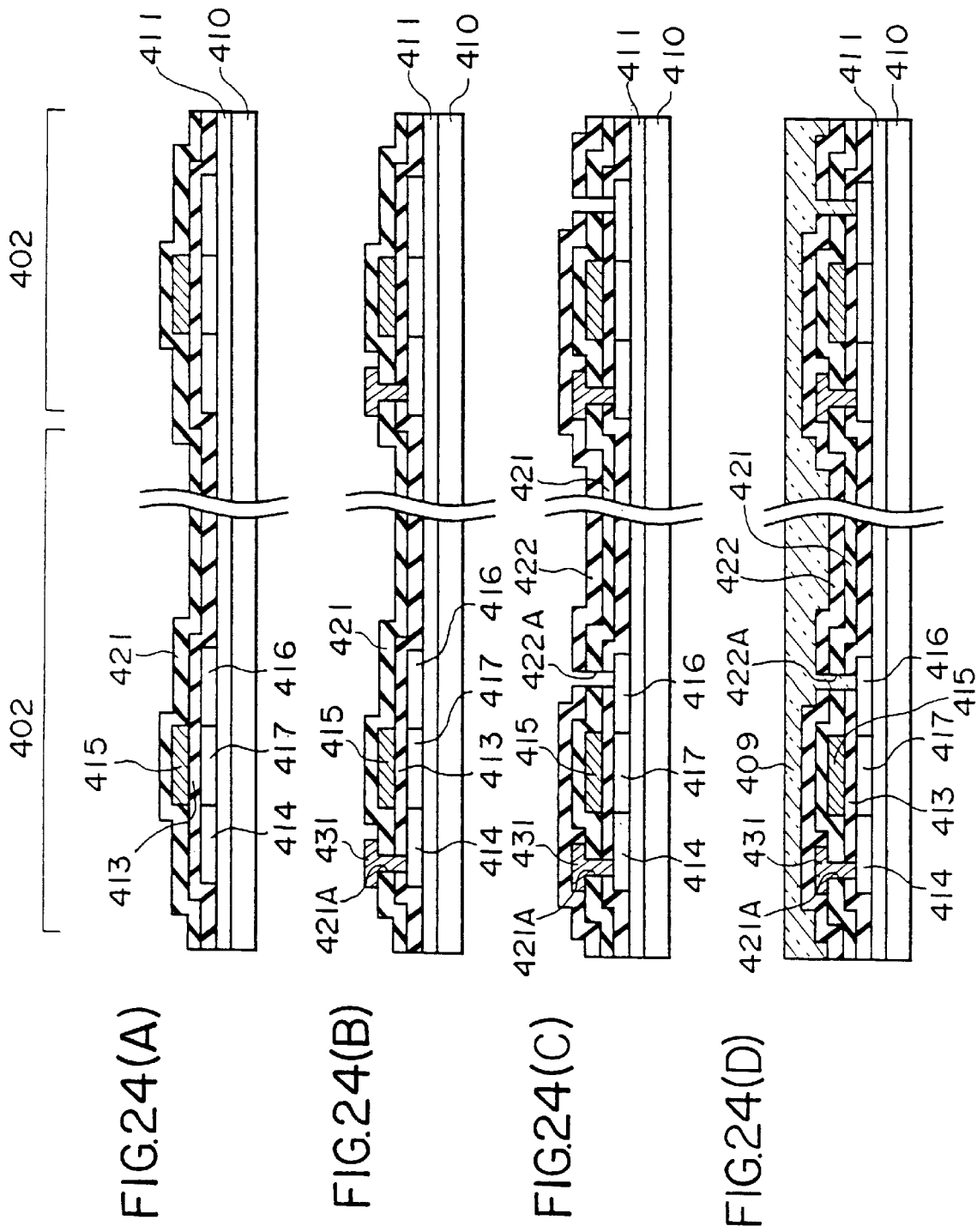

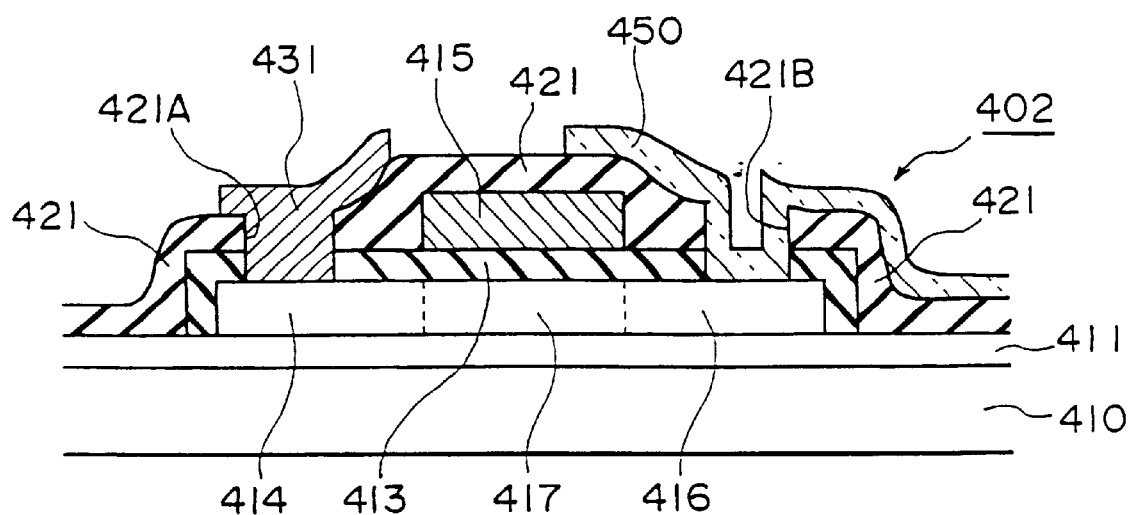
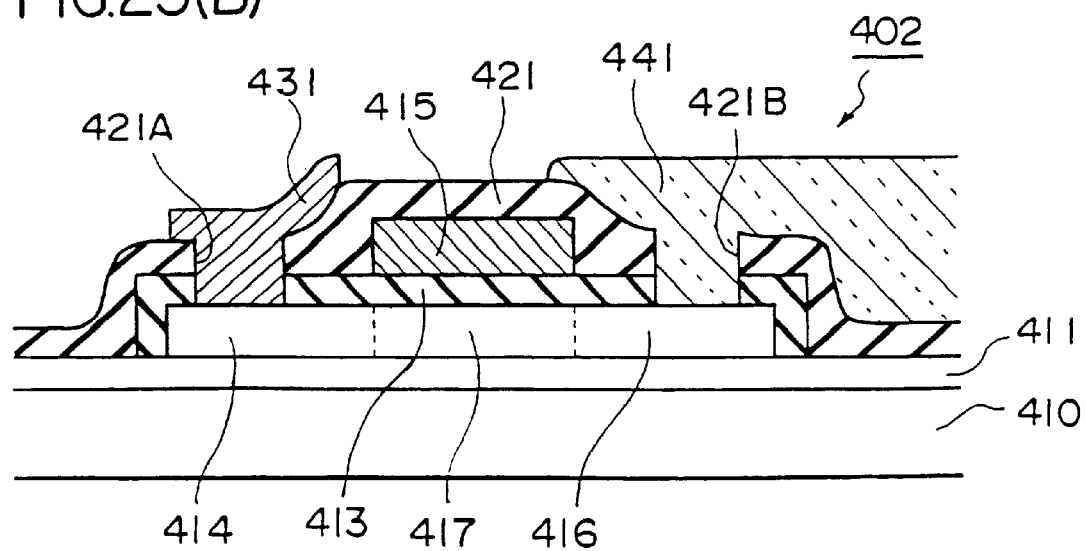

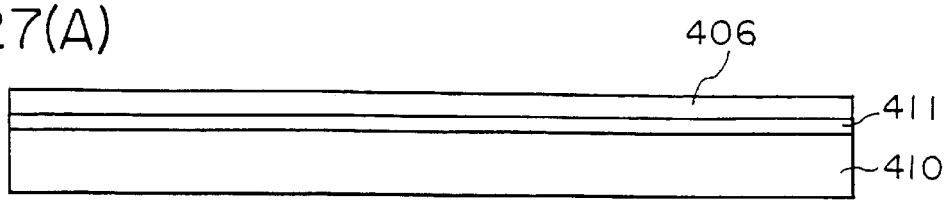
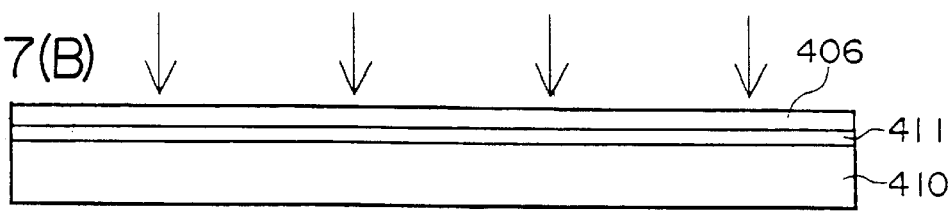
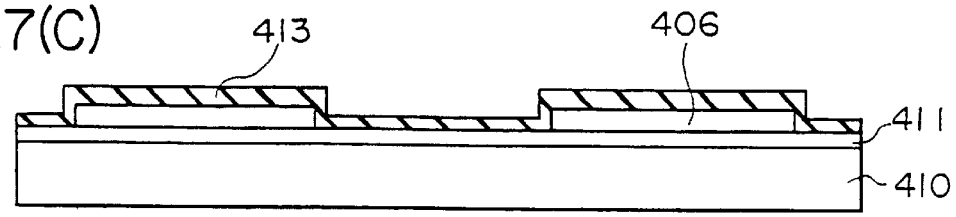
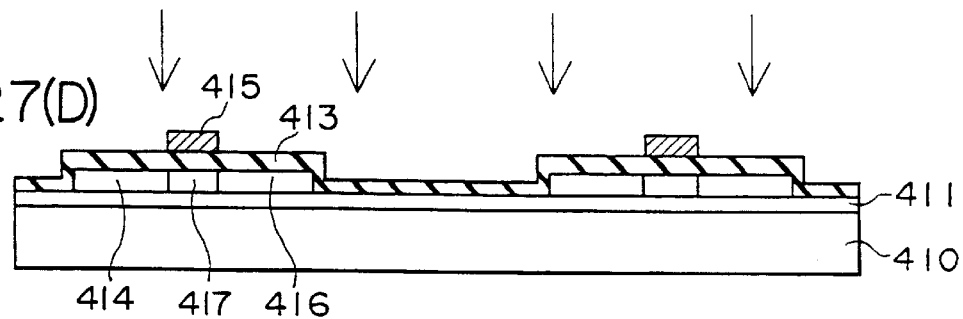
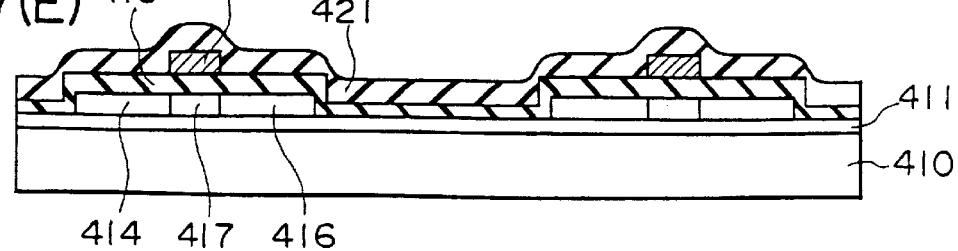

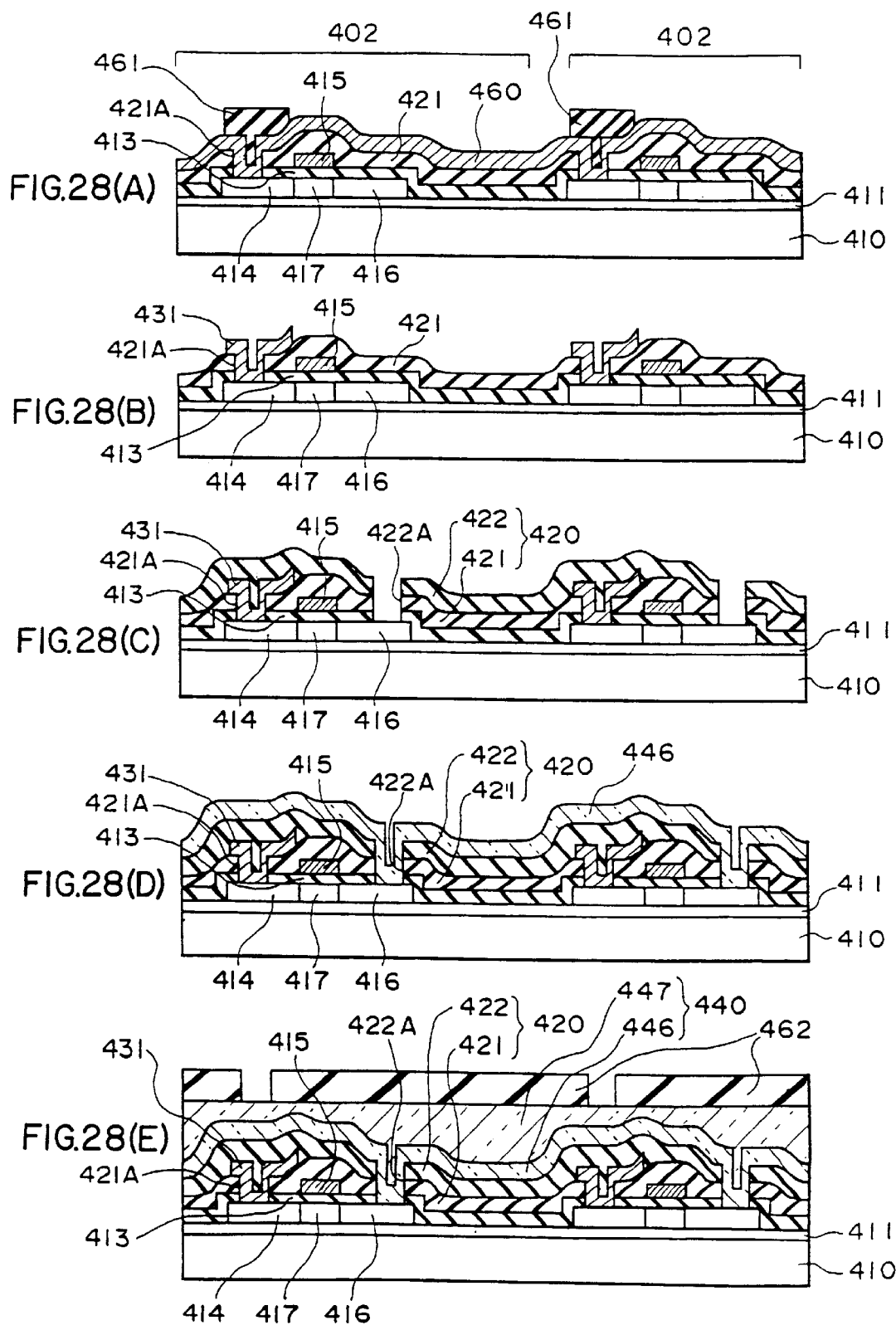

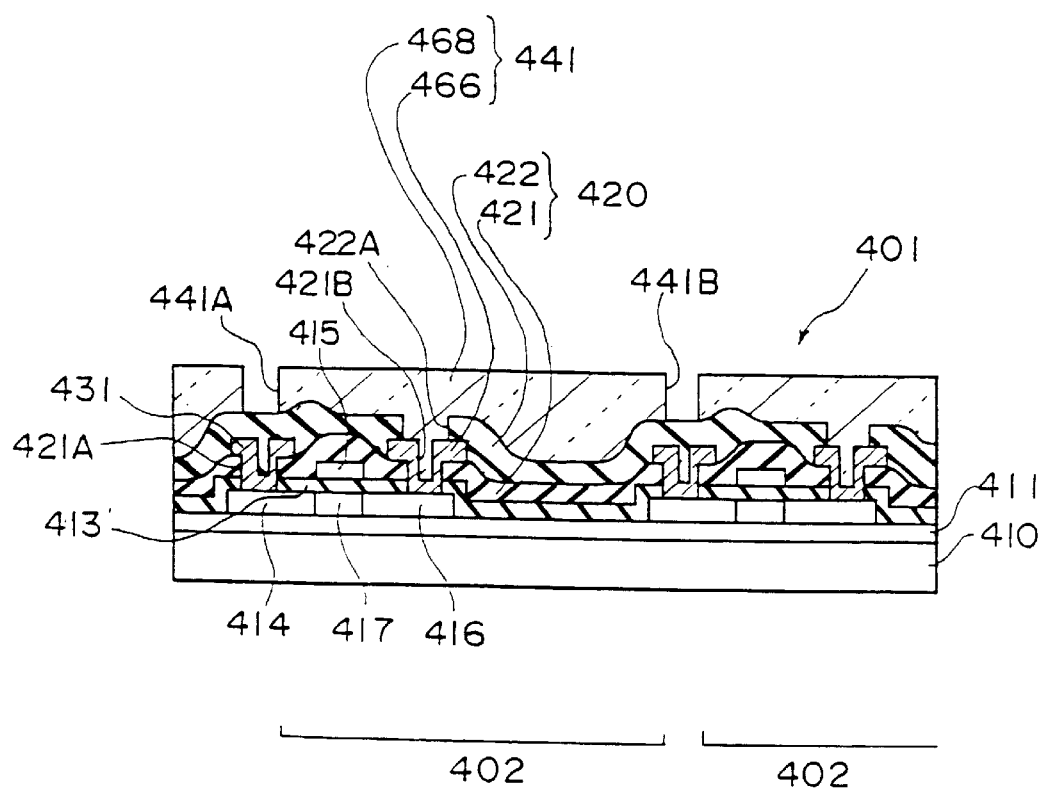

THIN FILM DEVICE PROVIDED WITH COATING FILM, LIQUID CRYSTAL PANEL AND ELECTRONIC DEVICE, AND METHOD FOR MAKING THE THIN FILM DEVICE

BACKGROUND OF THE INVENTION

1. Field of the Invention

The present invention relates to a thin film device including a thin film laminate structure such as a thin film transistor (hereinafter referred to as a TFT) and a method for making the same, and in particular relates to a thin film device capable of low cost production due to a decreased initial investment and a method for making the same. Also, the present invention relates to a liquid crystal panel and an electronic device using the thin film device.

2. Background Art

In recent years, liquid crystal display devices using such types of thin film devices have been used in notebook-type personal computers, car navigation systems, video cameras and various portable information devices, and their range of applications and production is drastically increasing. Such phenomena are due to improved performance including reduced price of the liquid crystal display devices, enlarged screen size, improved image resolution and low electrical power consumption. Further cost reduction is, however, required for further expansion of the market and range of applications.

The mainstream of the liquid crystal devices is active matrix liquid crystal devices using TFTs as switching elements for pixels. Each liquid crystal device includes TFTs, a TFT substrate on which a matrix of pixel electrodes connected to the TFTs are formed, a counter substrate provided with a common electrode, and a liquid crystal encapsulated between these two substrates. FIG. 17 shows the main section of a TFT substrate 60. In FIG. 17, TFTs 61 are formed at pixel positions near the intersections of a plurality of source or data signal lines S1, S2, . . . Sn arranged in columns with a plurality of gate or scanning signal lines G1, G2, . . . Gm arranged in rows. Source electrodes of the TFTs 61 are connected to their respective data lines, and drain electrodes are connected to their respective pixel electrodes 62. The data signal supplied from a data line is applied to a pixel electrode 62 through its corresponding TFT 61 based on the scanning timing signals supplied through the corresponding gate line. The state of the liquid crystal is changed and driven for displaying by an electric field between the pixel electrode 62 and the common electrode, not shown in the drawing.

The liquid crystal display device is fabricated by panel assembling including encapsulation of the liquid crystal between the TFT substrate 60 and the counter electrode, and packaging of driving circuits for driving the data lines and the gate lines. The cost of the liquid crystal display device greatly depends on the cost of the TFT substrate 60. The cost of the TFT substrate 60 depends on the manufacturing method of the TFTs. A part of driving circuits may be formed on the TFT substrate 60 by forming the active elements with the TFTs, and in this case, the cost of the TFT substrate represents a high proportion of the cost of the liquid crystal display device.

A TFT has a thin film monolithic structure including a plurality of thin films which include at least a silicon semiconductor layer having an insulating layer, a conductive layer, a source, a drain and a channel region. The cost of the TFT greatly depends on the production cost of the thin film monolithic structure.

The insulation layer in the thin film monolithic structure is formed by a low pressure chemical vapor deposition (LPCVD) process or a plasma enhanced CVD (PECVD) process, because a normal pressure CVD (NPCVD) process results in low uniformity of the film thickness. The conductive layer, or typically the metal layer, is formed by a sputtering process. The silicon film for forming the silicon semiconductor layer is also formed by the PECVD or LPCVD process. Further, a method for implanting an impurity into the silicon film by an ion implanting process or an ion doping process is used. Alternatively, the high concentration impurity region which functions as a source-drain region is formed of an impurity-doped silicon film in a CVD system.

The CVD systems and the sputtering system used in the above-mentioned film deposition processes belong to vacuum units for processing materials under vacuum pressures, and require large vacuum systems, resulting in an increase in initial investment. In the vacuum system, a substrate is transferred to a vacuum evacuation chamber, a substrate heating chamber, a film deposition chamber and a vent chamber, in that order, to form a film. The substrate atmosphere therefore must be changed from open air to vacuum, and this limits the throughput. Because the ion implanter and the ion-doping system are also vacuum systems, the same problems as above occur. Further, the ion implanter and the ion-doping system require complex mechanisms for generating plasma, extracting ions, mass-separating the ions (for the ion implanter), accelerating ions, collimating ions, scanning ions and so on, resulting in a remarkably high initial investment cost.

As described above, the thin film deposition technology and the processing technology for producing a thin film monolithic structure are basically similar to the manufacturing technology for LSI circuits. The main means for cost reduction of the TFT substrate include scaling-up of the substrate size for forming TFTs, improvement in efficiency of the thin film deposition and its processing step, and improvement in yield.

Scaling-up of the substrate size for producing large liquid crystal display devices with reduced costs is an obstacle to high speed transfer of the substrates in the vacuum system, and causes breakage of the substrate due to thermal stress during the deposition steps, hence it is significantly difficult to improve the throughput of the film deposition system. Also, the scaling-up of the substrate size inevitably requires scaling-up of the film deposition system. An increased cost accompanied by the increased volume in the vacuum system further increases the initial investment, and as a result, it is difficult to achieve drastic cost reduction.

Although an increased yield is a valuable means for cost reduction, a yield near the limit has been achieved, and thus drastic cost reduction is difficult in view of the yield.

Patterning of each layer is performed by a photolithographic process. The photolithographic process essentially includes a coating step, an exposure step and a developing step of a resist film. After these steps, an etching step and a resist-removing step are required, hence the steps for patterning is a factor in increasing the number of steps for thin film deposition. This is a factor in the increased cost of thin film device production.

Regarding the resist-coating step in the photolithographic process, only less than 1% of the resist solution dropped onto the substrate remains on the substrate as the resist film after spin coating, reducing the efficiency of the use of the resist solution.

Although a printing process has been proposed as a low cost process instead of a large scale exposure system used in the exposure step, it has not yet reached practical use due to problems such as processing accuracy.

As described above, it is not possible to drastically reduce the cost of the TFT substrate, although the market requires drastic price reduction of the liquid crystal display devices.

It is an object of the present invention to provide a thin film device and a method for making the same, in which a part, or all of, the films in a thin film monolithic structure used for a liquid crystal display device are deposited without a vacuum system in order to decrease initial investment and operation costs, increase the throughput and significantly decrease the production costs.

It is another object of the present invention to provide a thin film device and a method for making the same, in which a thin film having characteristics similar to those of a CVD or sputtered film is formed of a coating film while achieving cost reduction.

It is a further object of the present invention to provide a thin film device and a method for making the same, in which the consumption of a coating solution is decreased in the formation of the thin coating film for achieving cost reduction.

It is still another object of the present invention to provide a thin film device and a method for making the same, which is capable of patterning the formed film without a photo-lithographic process and, thus, reducing the cost.

It is a still further object of the present invention to provide a thin film device, a liquid crystal panel and an electronic device using the same, in which a plane in contact with the liquid crystal can be planarized by forming a pixel electrode with a coating film.

It is another object of the present invention to provide a thin film device, a liquid crystal panel, and an electronic device using the same, in which a wiring layer can be used as a light-shielding layer for a black matrix and the thin film device has a high aperture ratio.

It is still another object of the present invention to provide a liquid crystal panel and an electronic device which enable cost reduction due to use of an inexpensive thin film device.

SUMMARY OF INVENTION

According to an embodiment of the present invention, a thin film device has a thin film monolithic structure comprising a plurality of thin films including at least one insulating layer and at least one conductive layer, wherein at least one thin film in the thin film monolithic structure is formed of a coating film (excluding a spin-on-glass film having a basic structure comprising siloxane bonds), which is obtained by applying a solution containing a constituent of the thin film followed by annealing.

A method for making the thin film device comprises the following steps of:

applying a coating solution containing a constituent of the thin film onto a substrate; and forming a coating film (excluding a spin-on-glass film having a basic structure comprising siloxane bonds) by annealing the coated surface of the substrate.

In the present invention, at least one layer in the thin film monolithic structure is formed as a coating film without a vacuum system. As such a coating film, a spin-on-glass (SOG) film having a basic structure comprising siloxane bonds, which has been used as a planarization layer, has been known. The organic SOG film is, however, readily etched during an oxygen plasma process, whereas the inorganic SOG film readily cracks even if the film has a thickness of several thousand angstroms, hence it is rarely used solely as an interlevel insulating film, and is used as only a planarization layer above a CVD insulating film.

In the present invention, an insulating layer and a conductive layer composing a thin film monolithic structure are formed of a coating film other than the SOG film, and the thin film can be planarized at the same time. Because the coating film can be formed without a vacuum system such as a CVD system or a sputtering system, a mass-production line can be constructed with a significantly smaller investment compared to conventional systems, the throughput of the system can be increased, and the cost of the thin film device can be drastically reduced.

The thin film monolithic structures include various structures, for example, those including semiconductor layers, those including thin film transistors, and those including an underlying insulating layer and an upper protective insulating layer.

In these cases, it is preferable that all of the insulating layers contained in the thin film monolithic structure be formed of a coating film. A gate insulating layer requiring a critical film quality for ensuring desired thin film transistor characteristics, however, may be formed by a method other than a coating process.

It is preferable that at least two thin films in the thin film monolithic structure be formed by a coating process in order to reduce the device cost which is a purpose of the present invention.

The insulating layer can be formed of a $SiO_2$ coating film, which is obtained by applying a solution containing a polymer having Si-N bonds (polysilazane), followed by a first annealing process in an oxygen atmosphere. Because the polysilazane having the above structure exhibits high cracking resistance and oxygen plasma resistance, a single layer can be used as an insulating layer having a given thickness.

It is preferable that the insulating layer be subjected to a second annealing process at a temperature higher than that in the first annealing process to further clean its surface. The second annealing process may be performed at a high temperature for a short period using a laser or a lamp.

The semiconductor layer is formed by implanting an impurity into a silicon coating film, which is formed by applying a solution containing silicon particles, followed by a first annealing process.

It is preferable that the semiconductor layer be subjected to a second annealing process at a temperature higher than that in the first annealing process to improve the crystallinity in the layer. The second annealing process may also be performed at a high temperature for a short period using a laser or a lamp.

Preferably, a method for diffusing an impurity into the silicon coating film comprises the following steps of:

forming by coating an impurity-containing layer onto the silicon coating film; and diffusing the impurity into the silicon coating film by heating the impurity-containing layer.

Conventionally, the high concentration impurity region which functions as a source-drain region has been formed of an impurity-doped silicon film by a CVD system, or formed by introduction of an impurity by an ion implanting process or an ion doping process. In the present invention, a source-drain region is formed by a step of applying and baking a solution to form a thin film containing an impurity, and by a step of annealing the thin film at a high temperature for a short period using a lamp or a laser to form a high concentration impurity region. The ion implanting system and the ion doping system basically belong to vacuum systems, and require extremely complicated mechanisms for generating plasma, extracting ions, mass-separating the ions (for the ion implanter), accelerating ions, collimating ions, scanning ions and so on. Hence these two systems have evidential high prices compared to the system for coating and annealing the thin film containing the impurity.

There are two methods for forming the conductive layer. In one method a thin metal film is formed and in the other method a thin transparent conductive film is formed.

The formation of the thin metal film as a conductive layer includes coating of a solution containing conductive particles and then evaporating the solvent by a first annealing process. A conductive coating film can be thereby formed.

It is preferable that the conductive layer also be subjected to a second annealing process at a temperature higher than that in the first annealing process to reduce the resistance of the layer. The second annealing process may be performed at a high temperature for a short period using a laser or a lamp.

Preferably, a method for forming a transparent conductive film as a conductive layer comprises:

a first annealing step annealing the coated surface in an oxygen or nonreductive atmosphere; and a second annealing step annealing the coated surface in a hydrogen or reductive atmosphere.

When forming the transparent electrode as the conductive layer, for example, an organic acid containing indium and tin is used as a coating solution. Preferably in this case, a solvent used for adjusting the viscosity is evaporated (at, for example, a temperature of approximately 100° C.) after coating, and then the above-mentioned first and second annealing processes are performed. Indium oxide and tin oxide are formed during the first annealing process, and the film is reduced during the second annealing process in a hydrogen or reductive atmosphere.

It is preferable that the temperature in the second annealing process be lower than that in the first annealing process.

The transparent conductive coating film after the first annealing process can be prevented from thermal deterioration in the second annealing process.

Preferably, the substrate is maintained in the nonoxidizing atmosphere after the second annealing process until the substrate temperature is decreased to 200° C. or less. The reoxidation of the transparent conductive coating film reduced during the second annealing process can be thereby suppressed, and thus the sheet resistance of the transparent conductive coating film does not increase. It is preferable that the substrate be introduced into open air at a temperature of 100° C. or less in order to ensure prevention of the reoxidation. Because the resistivity of the coated ITO film decreases in proportion to the oxygen defects in the film, the reoxidation of the transparent conductive coating film due to oxygen in the open air results in an increase in the specific resistivity.

In the formation of the transparent conductive coating film, a coating solution containing indium (In) and tin (Sn) is applied onto the substrate. The coating film is oxidized in the first annealing process to form an ITO film. Using the coated ITO film, the conductive layer is also usable for the transparent electrode.

When the surface of the ITO film is plated with a metal, the film can be used as a conductive layer other than the transparent electrode, and the metal plating can decrease the contact resistance.

It is preferable that a conductive sputtering film be formed on the contact face of the coated ITO film by a sputtering process.

An example of the thin film monolithic structure is an active matrix substrate including pixel switching elements provided on their respective pixels, which are formed near intersections of a plurality of data lines with a plurality of scanning lines, and pixel electrodes connected thereto.

A typical pixel switching element used in the active matrix substrate is a thin film transistor. The thin film transistor as the pixel switching element includes a gate electrode electrically connected to one of the scanning lines and a drain electrode electrically connected to one of the pixel electrodes.

It is preferable that the pixel electrodes be formed of a conductive coating film in such a thin film monolithic structure. The surface in which the pixel electrodes are formed generally has steps, while the surface of the conductive coating film is substantially planarized when the pixel electrode is formed of the conductive coating film. As a result, rubbing can be satisfactorily performed and occurrence of reverse-tilt domains can be prevented.

It is preferable that the conductive coating film used for the pixel electrodes be a coated ITO film. The coated ITO film functions as a transparent electrode and is suitable for producing an active matrix substrate in a transmission liquid crystal display device.

The thin film transistor as the pixel switching element includes an interlevel insulating film formed on the front surface of the gate electrode, and the data line and pixel electrode are electrically connected to the source region and the drain region, respectively, through contact holes formed in the interlevel insulating film.

The interlevel insulating film may be composed of a lower interlevel insulating film which lies at the lower side, and an upper interlevel insulating film which is formed on the surface of the lower interlevel insulating film. In this case, the data line is electrically connected to the source region through a first contact hole formed in the lower interlevel insulating film. On the other hand, the pixel electrode is electrically connected to the drain region through a second contact hole formed in the lower interlevel insulating film and the upper interlevel insulating film.

In such a configuration, the data line and the pixel electrode are formed on different layers from each other, hence these do not short-circuit each other even if they are formed at a position in which they overlap with each other. The periphery of the pixel electrode can therefore be arranged above the data line and the scanning line.

As a result, no planar gap is present between the data line or scanning line and the pixel electrode. The data line and the scanning line can therefore function as a black matrix having a light-shielding function. Accordingly, it is not required to form a light shielding layer as the black matrix by an additional process.

Because the range capable of forming the pixel electrode is expanded, the aperture ratio of the pixel region is increased, resulting in a bright display.

It is preferable that the pixel electrode formed of a conductive coating film be electrically connected to the drain electrode through a conductive sputtering film.

Because the sputtering film has a lower contact resistance than that of the conductive coating film, the contact resistance can be reduced by positioning the conductive sputtering film between the conductive coating film and the source region.

It is preferable the conductive sputtering film be a sputtering ITO film so as not to decrease the aperture ratio.

When the conductive coating film and the conductive sputtering film have the same pattern, the accuracy in the patterning of the pixel electrode can be improved, because a resist film can be formed on only the conductive coating film having high adhesiveness to the resist mask, and the conductive coating film and the conductive sputtering film can be simultaneously patterned. Resist mask formation on the conductive sputtering film having low adhesiveness to the resist mask is not required, and a decrease in accuracy in the patterning can be avoided.

When the conductive coating film and the conductive sputtering film do not have the same pattern, it is preferable that the periphery of the conductive coating film lies outside of the periphery of the conductive sputtering film.

Resist masks are separately formed on the conductive coating film and the conductive sputtering film and are separately subjected to sputtering by different steps. The accuracy of the patterning for the periphery of the pixel electrode depends on the accuracy of the patterning for the conductive coating film having a larger patterning dimension than that of the conductive sputtering film. The low accuracy of the patterning for the conductive sputtering film having low adhesiveness to the resist mask does not affect the accuracy of the patterning for the pixel electrode.

When the conductive sputtering film and the data line are present in the same layer, these can be simultaneously formed of the same metal material.

Alternatively, the conductive sputtering film may lie above the data line. In this case, as these layers are formed by different steps, these layers may be formed of the same material or different materials.

The interlevel insulating film may include a lower interlevel insulating film at the lower side and an upper interlevel insulating film deposited on the surface of the lower interlevel insulating film, and the data line and the conductive sputtering film may be formed on the surface of the upper interlevel insulating film. The data line is electrically connected to the source region through a first contact hole formed in the lower interlevel insulating film. On the other hand, the conductive sputtering film is electrically connected to the drain region through a second contact hole formed in the upper interlevel insulating film and the lower interlevel insulating film. The conductive coating film is deposited on the surface of the conductive sputtering film.

Alternatively, the data line and the conductive sputtering film may be formed in the same layer on the surface of the lower interlevel insulating film. In this case, the data line is electrically connected to the source region through a first contact hole formed in the lower interlevel insulating film. The conductive sputtering film is electrically connected to the drain region through a second contact hole formed in the lower interlevel insulating film. Further, the conductive coating film is deposited on the surface of the upper interlevel insulating film, and electrically connected to the conductive sputtering film through a third contact hole formed in the upper interlevel insulating film.

In accordance with another embodiment, a liquid crystal panel comprises:

an active matrix substrate provided with the above-mentioned thin film device, a counter substrate facing the active matrix substrate, and a liquid crystal layer encapsulated between the active matrix substrate and the counter substrate.

In accordance with a further embodiment, an electronic device comprises the liquid crystal panel.

In these cases, the cost reduction in the thin film device enables drastic cost reduction of the liquid crystal panel and the electronic device using the liquid crystal panel.

In the above-mentioned solution coating step, it is preferable that the solution be applied to only the coating region on the substrate to form a patterned coating film on the substrate, because a photolithographic process including many steps is not required. According to this process, consumption of the coating solution decreases and thus the operation cost can be reduced.

In accordance with still another embodiment of the present invention, a method for making a thin film device is characterized in that a patterned coating film is formed on the substrate by:

preparing a coating solution dispenser head provided with a plurality of liquid discharging nozzles, and discharging the coating solution onto only the coating region on the substrate while relatively changing the positions of the substrate and the liquid discharging nozzles.

This method can be achieved by, for example, an ink jet process. Because the coating solution is not wasted and no photolithographic process is required, this method greatly contributes to the investment cost reduction and improved throughput. For example, in conventional coating techniques only approximately 1% of a dropped resist has been used as a coating film, whereas in the present invention 10% or more of a dropped resist can be used as a coating film. Of course, such a high coating efficiency holds for the other coating films in the present invention, and thus the reduced use of the coating materials and the reduced time in the coating processes enable the cost reduction of liquid crystal display devices.

It is preferable that these nozzles be independently controlled to discharge or not to discharge the coating solution, and positions of the substrate and the discharge nozzles be relatively changed while controlling the coating timing on the nozzle. More precise pattern coating can thereby be achieved.

Such a coating process is applicable to coating of various coating solutions for forming coating films by other than coating of the resist for forming a resist pattern. For example, if an insulating coating film is pattern-coated, a contact hole can be formed simultaneously with the coating.

As described above, in accordance with the present invention, a part or all of the thin films can be formed by applying and annealing a solution, hence a thin film device can be produced with an inexpensive production unit having a high throughput.

BRIEF DESCRIPTION OF DRAWINGS

The present invention will now be described in detail with reference to the drawings, in which:

FIGS. 20(A) to 20(D) are cross-sectional views illustrating a method for making the active matrix substrate shown in FIG. 19;

FIGS. 21(A) to 21(C) are cross-sectional views illustrating the steps performed after the steps shown in FIG. 20;

FIGS. 24(A) to 24(D) are cross-sectional views illustrating the steps performed after the steps shown in FIG. 20 in the production of the active matrix substrate shown in FIG. 22;

FIGS. 25(A) and 25(B) are enlarged longitudinal cross-sectional views near contact holes of a comparative example and an example in accordance with the present invention, respectively;

FIGS. 27(A) to 27(E) are cross-sectional views of a method for making the active matrix substrate shown in FIG. 26;

FIGS. 28(A) to 28(E) are cross-sectional views of the steps performed after the steps shown in FIG. 27;

FIG. 33 is a cross-sectional view taken along section IV-IV' of FIG. 32;

DETAILED DESCRIPTION OF PREFERRED EMBODIMENT

Figure 3:
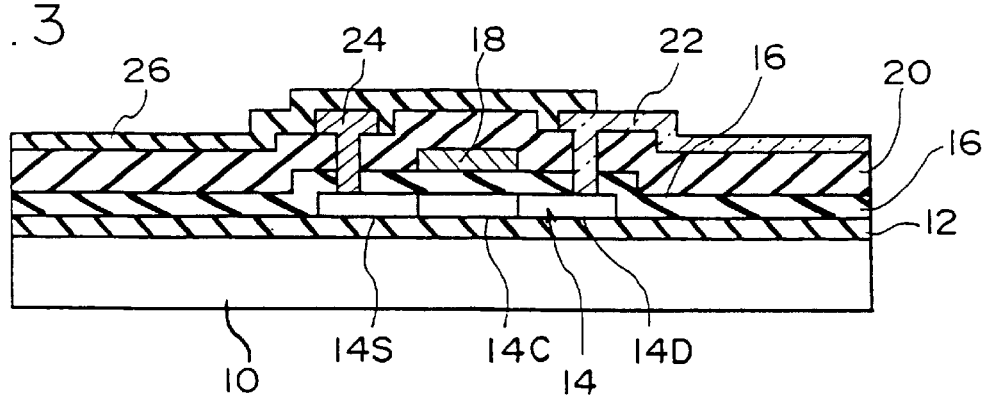
FIG. 3 is a cross-sectional view of a coplanar-type TFT.
Figure 4:
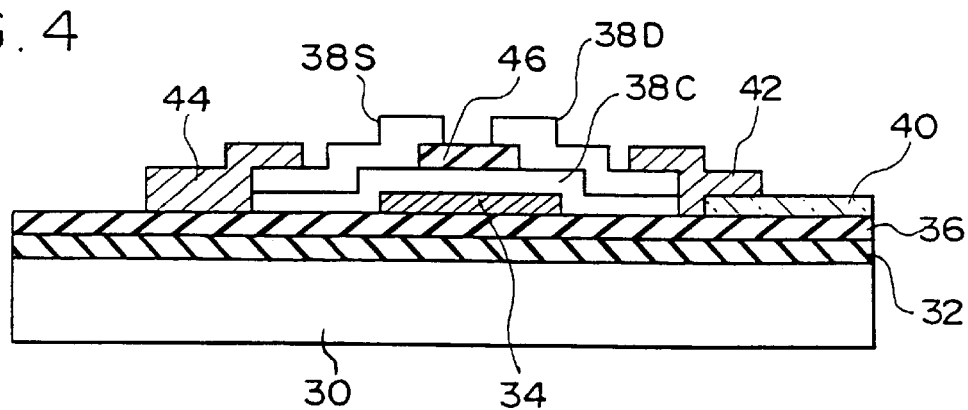
FIG. 4 is a cross-sectional view of a reverse stagger-type TFT.

First Embodiment
Illustration of Thin Film Device Structure
Two examples of thin film devices including TFTs are shown in FIGS. 3 and 4.

FIG. 3 is a cross-sectional view of a TFT using a coplanar-type polycrystalline silicon. An insulating underlayer 12 is formed on a glass substrate, and a polycrystalline silicon TFT is formed thereon. In FIG. 3, the polycrystalline silicon layer 14 comprises a source region 14S and a drain region 14D which are highly doped with an impurity, and a channel region 14C therebetween.

A gate insulating film 16 is formed on the polycrystalline silicon layer 14 and a gate electrode 18 and a gate line (not shown in the drawing) are formed thereon. A pixel electrode 22 composed of a transparent electrode film is connected to the drain region 14D through an opening section formed in an interlevel insulating film 20 and the gate insulating film 16 thereunder, and a data line 24 is connected to the source region 14S. A topmost protective film 26 may be omitted. The insulating underlayer 12 is provided for the purpose of prevention of contamination from the glass substrate 10 and of conditioning of the surface for forming the polycrystalline silicon film 14, and may be omitted in some cases.

FIG. 4 is a cross-sectional view of a reverse stagger-type amorphous silicon TFT. An insulating underlayer 32 is formed on a glass substrate 30, and an amorphous silicon TFT is formed thereon. The insulating underlayer 32 is often omitted. In FIG. 4, a layer or a plurality of layers of gate insulating films 36 are formed under a gate electrode 34 and a gate line connected thereto. On the gate electrode 34, an amorphous silicon channel region 38C is formed, and a source region 38S and a drain region 38D are formed by diffusing an impurity into the amorphous silicon. A pixel electrode 40 is electrically connected to the drain region 38D through a metal lead layer 42, and a data line 44 is electrically connected to the source region 38S. The metal lead layer 42 and the data line 44 are simultaneously formed.

A channel protective film 46 is formed on the channel region 38C to protect the channel region 38C during etching of the source region 38S and the drain region 38D, and may be omitted in some cases.

FIGS. 3 and 4 show basic TFT structures, and these structures may have a very wide range of modifications. For example, in order to increase the aperture ratio in the coplanar-type TFT in FIG. 3, a second interlevel insulating film may be provided between the pixel electrode 22 and the data line 24 to decrease the gap between the pixel electrode 22 and the data line 4. Further, in order to decrease the wiring resistance of the gate line (not shown in the drawing) and the data line 2 which are connected to the gate electrode 18 and to increase the wiring length, the gate line and the data line may be formed of multiple layers. A light shielding layer may be formed on or under the TFT element. In the reverse stagger-type TFT in FIG. 4, the wiring lines and the insulating film may be formed of multiple layers for the purpose of improvement in the aperture ratio, a decrease in the wiring resistance and a decrease in defects.

Most of these modifications to the basic structures in FIG. 3 or 4 involve an increase in the number of thin layers deposited to form the TFT.

The following example shows a case in which various thin films in the thin film monolithic structures shown in FIGS. 3 and 4 are formed by coating films which require no vacuum system.

Method for Forming Insulating Coating Film

Figure 1:
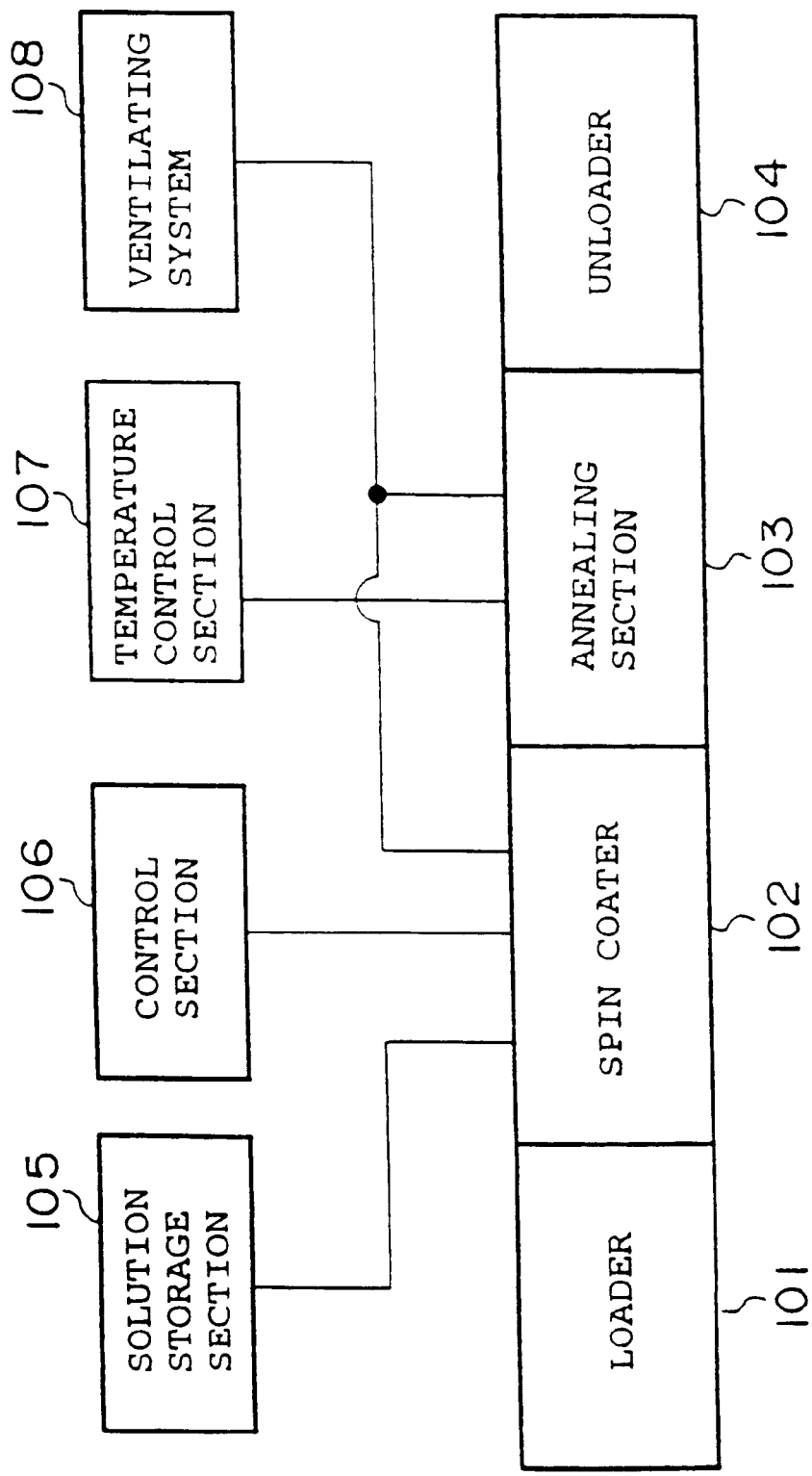
FIG. 1 is a block diagram of a coating film deposition unit used in a first embodiment in accordance with the present invention.

FIG. 1 shows a coating film deposition unit which forms a thin film, e.g. an insulating film, by applying and annealing a solution. The solution which becomes the insulating film by annealing after coating contains a polysilazane (generic name for polymers having Si-N bonds). A typical polysilazane is polyperhydrosilazane represented by $[SiH_2NH]_n$, wherein n is an integer. The compound is commercially available under the commercial name "Tonen Polysilazane", which is manufactured by Tonen Corporation. If alkyl groups, e.g. methyl groups or ethyl groups, are substituted for hydrogen atoms in $[SiH_2NH]_n$, the compound is called organic polysilazane to distinguish it from inorganic polysilazane. In this embodiment, it is preferable that inorganic polysilazanes be used.

After a polysilazane is mixed with a solvent such as xylene, the solution is applied onto a substrate by spin coating. The coating film is converted to $SiO_2$ by annealing in a steam- or oxygen-containing atmosphere.

A film for comparison is a spin-on-glass (SOG) film which is converted to an insulating film by annealing after coating. The SOG film is compose d of a polymer having siloxane bonds as a basic structure. The SOG polymers include organic polymers having alkyl groups and inorganic polymers not having alkyl groups and alcohols and the like are used as solvents. The SOG film is used as an interlevel insulating film in an LSI for the purpose of planarization. The organic SOG film is readily etched during an oxygen plasma process, whereas the inorganic SOG film readily forms cracks even if it has a thickness of several hundred angstroms, hence these films are not used as a single layer of insulating film, but are used as a planarization layer on a CVD insulating film.

In contrast, polysilazane has high crack resistance and oxygen plasma resistance, and can be used as a single layer of insulating film having an appropriate thickness. A case using polysilazane will now be described.

In the present invention, at least one layer, and preferably a plurality of layers, in the thin film monolithic structure are formed of coating films other than the SOG film which has siloxane bonds as a basic structure. Additional SOG films can be used within the range satisfying the above condition.

Figure 12:
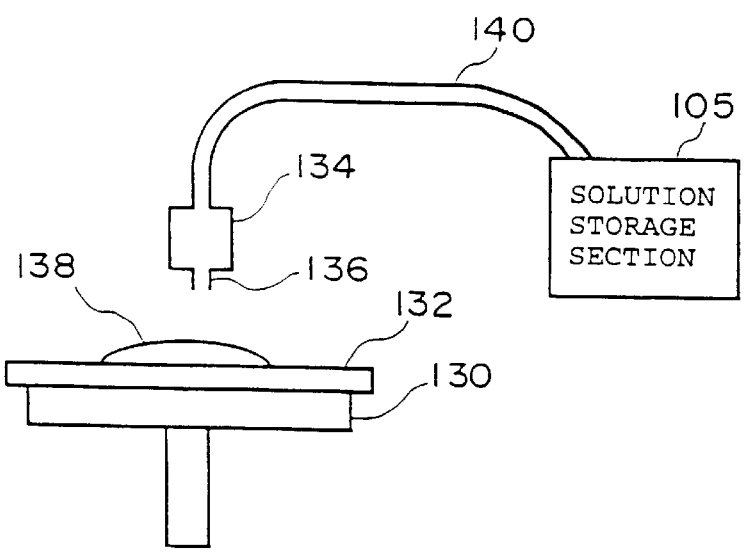
FIG. 12 is a block diagram of a solution coating unit used in a first embodiment in accordance with the present invention.
Figure 13:
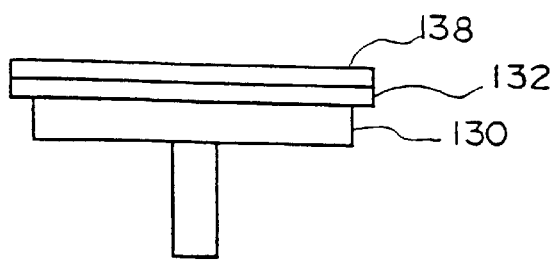
FIG. 13 is an outlined schematic view illustrating a state of the solution coating unit of FIG. 12 after spin coating.

In FIG. 1, a loader 101 separately removes a plurality of substrates stored in a cassette and moves the glass substrates onto a spin coater 102. In the spin coater 102, as shown in FIG. 12, a substrate 132 is fixed by vacuum on a stage 130, and then a polysilazane solution 138 is dropped onto the substrate 132 through a nozzle 136 of a dispenser 134. A mixed solution of polysilazane and xylene is stored in a container called a canister at a solution storage section 105 shown in FIGS. 1 and 12. The mixed solution of polysilazane and xylene is supplied to the dispenser 134 from the solution storage section 105 through a feeding pipe 140 and is coated onto the substrate. Then, as shown in FIG. 13, the polysilazane solution 138 is dispersed onto the entire surface of the glass substrate 132 by the rotation of the stage 130. Most of xylene is evaporated in this process. A control section 106 shown in FIG. 1 controls the speed and time of rotation of the stage 130 to increase the speed to 1,000 rpm in several seconds, to maintain 1,000 rpm for approximately 20 seconds, and to stop the rotation after several seconds. In such a coating condition, the polysilazane coating film has a thickness of approximately 7,000 angstroms. Next, the glass substrate is transferred to an annealing section 103 and annealed at a temperature of 100 to 350° C. for 10 to 60 minutes in a steam atmosphere to modify the polysilazane to $SiO_2$. A temperature control section 107 controls the annealing step. The length of the annealing section 103 and the capacity for holding the substrates in the annealing section 103 is determined so as to match the tact time of the spin coater 102 with the annealing time in order to enhance the performance of the coating-type insulating film deposition unit. Because the polysilazane solution contains, for example, xylene, and because hydrogen and ammonia form during the modification, at least the spin coater 102 and the annealing section 103 require a ventilating system 108. The glass substrate provided with the insulating film formed during the annealing process is stored into a cassette by an unloader 104.

The coating-type insulating film deposition unit of the present invention shown in FIG. 1 has a significantly simplified system configuration compared to conventional CVD systems, and thus the price of the unit is remarkably decreased. Further, the unit has a higher throughput than the CVD systems, decreased maintenance, and a high net working rate. These advantages enables drastic cost reduction of liquid crystal display devices.

The coating-type insulating film deposition unit shown in FIG. 1 can form all the insulating films shown in FIG. 3; that is, the insulating underlayer 12, the gate insulating layer 16, the interlevel insulating film 20 and the protective film 26. When an additional insulating layer is formed between the pixel electrode 22 and the source electrode 24, the formation of the coating film using the unit shown in FIG. 1 is particularly effective for planarization of the surface of the additional insulating layer. The insulating underlayer 12 and the protective film 26 may be omitted in some cases.

Because the gate insulating film 16 is an important insulating film determining electrical characteristics of the TFT, interfacial characteristics between the film and the silicon film, as well as the film thickness and the film quality, must be controlled.

Figure 2:
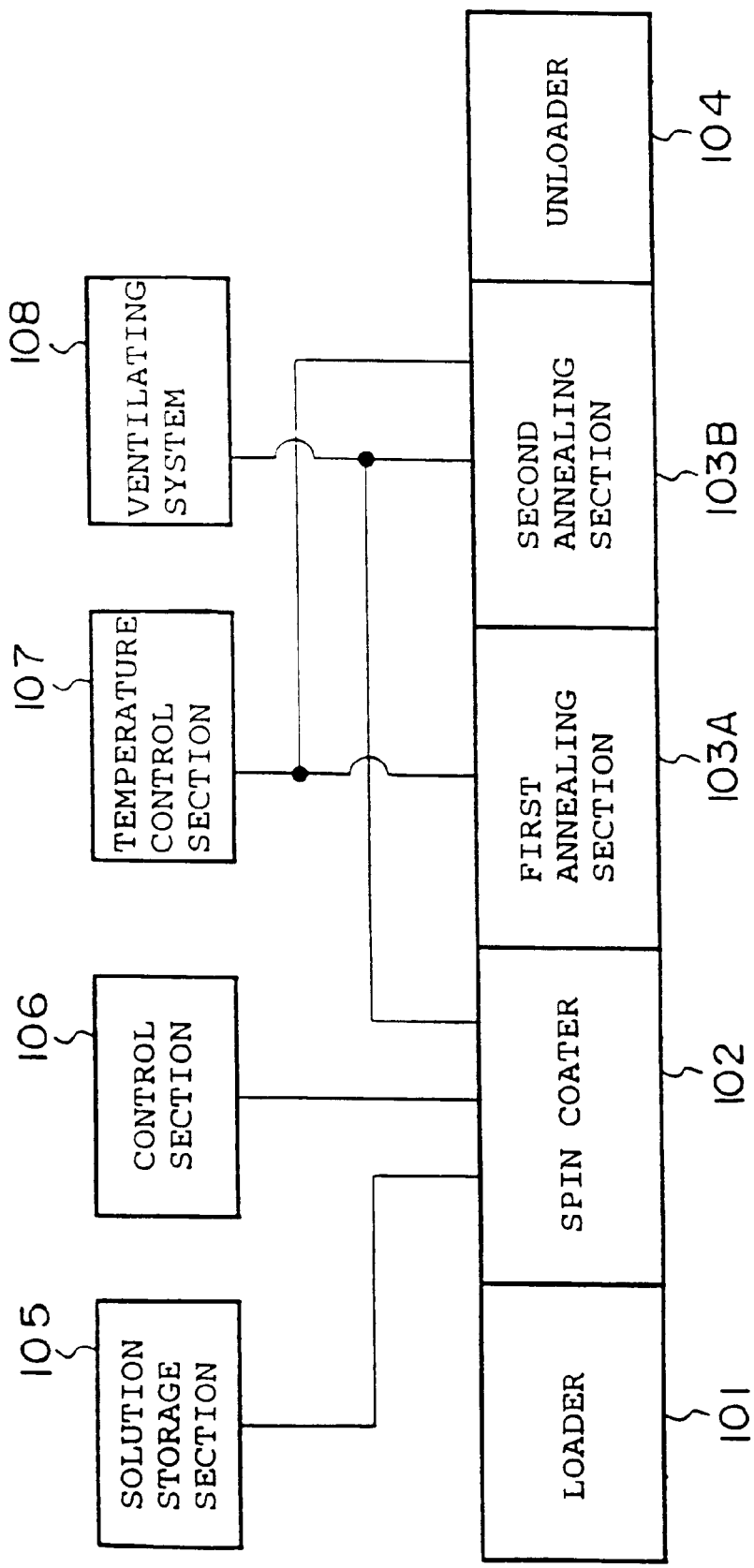
FIG. 2 is a block diagram of another coating film deposition unit used in a first embodiment in accordance with the present invention.

In order to achieve such control, it is preferred to clean the surface of the silicon film 14 before forming the gate insulating film 16 by coating, and to use a coating-type insulating film deposition unit shown in FIG. 2. The unit shown in FIG. 2 is provided with a first annealing section 103A having the same function as the annealing section 103 of the unit shown in FIG. 1, and a second annealing section 103B in front of an unloader 104. After the annealing in the first annealing section 103A, the second annealing section 103B preferably performs an annealing process at a temperature of 400 to 500° C., which is higher than the annealing temperature of the first annealing section 103A, for 30 to 60 minutes, or an annealing process at a high temperature for a short period, such as by lamp annealing or laser annealing.

As a result, the insulating films such as the gate insulating film 16 are further densified and have improved film quality and interfacial characteristics as compared to the annealing only in the annealing section 103 shown in FIG. 1.

Regarding the interfacial characteristics, a CVD film formed in a vacuum atmosphere can be easily controlled compared to the insulating coating film. When a high performance TFT is required, therefore, the gate insulating film may be formed of a CVD film and the other insulating films in the TFT may be formed of insulating coating films in accordance with the present invention.

In the TFT structure in FIG. 4, the insulating underlayer 32, the gate insulating film 36 and the channel protective film 46 can use the insulating coating film of the present invention.

Method for Forming Silicon Coating Film

Using a coating solution containing silicon particles, which is stored in the solution storage section 105 shown in FIG. 1 or 2, a silicon coating film can be formed using the same unit shown in FIG. 1 or 2.

The size of the silicon particles contained in the coating solution ranges, for example, from 0.01 to 10 $\mu$m. The size of the silicon particles is determined by the thickness of the silicon coating film. In the silicon particles obtained by the present inventors, particles of approximately 1 $\mu$m occupy 10%, and those of 10 $\mu$m or less occupy 95%. The silicon particles having such a size distribution are further pulverized with a pulverizer to obtain silicon particles having a desired size distribution.

The silicon particles having a given size distribution are stored in the solution storage section 105 as a suspension in a solvent such as alcohol. The suspension composed of the silicon particles and alcohol is discharged onto a substrate transferred onto the spin coater 102 from the loader 101. The stage 130 is rotated under the same coating condition as in the insulating coating film to disperse the coating film of the silicon particles on the substrate, wherein most of alcohol is evaporated.

Next, the substrate is annealed in the annealing section 103 or the first annealing section 103A under the same annealing condition as in the insulating coating film. The silicon particles react with each other to form a crystallized silicon film on the substrate.

In the case using the unit in FIG. 2, the substrate is further annealed in the second annealing section 103B at a higher temperature than that in the first annealing section 103A. It is preferable that the annealing be performed in a short time by laser annealing or lamp annealing.

Reannealing in the second annealing section 103B improves crystallinity and density in the silicon film and adhesion to other films, as compared to the annealing only in the first annealing section 103A.

Figure 5:
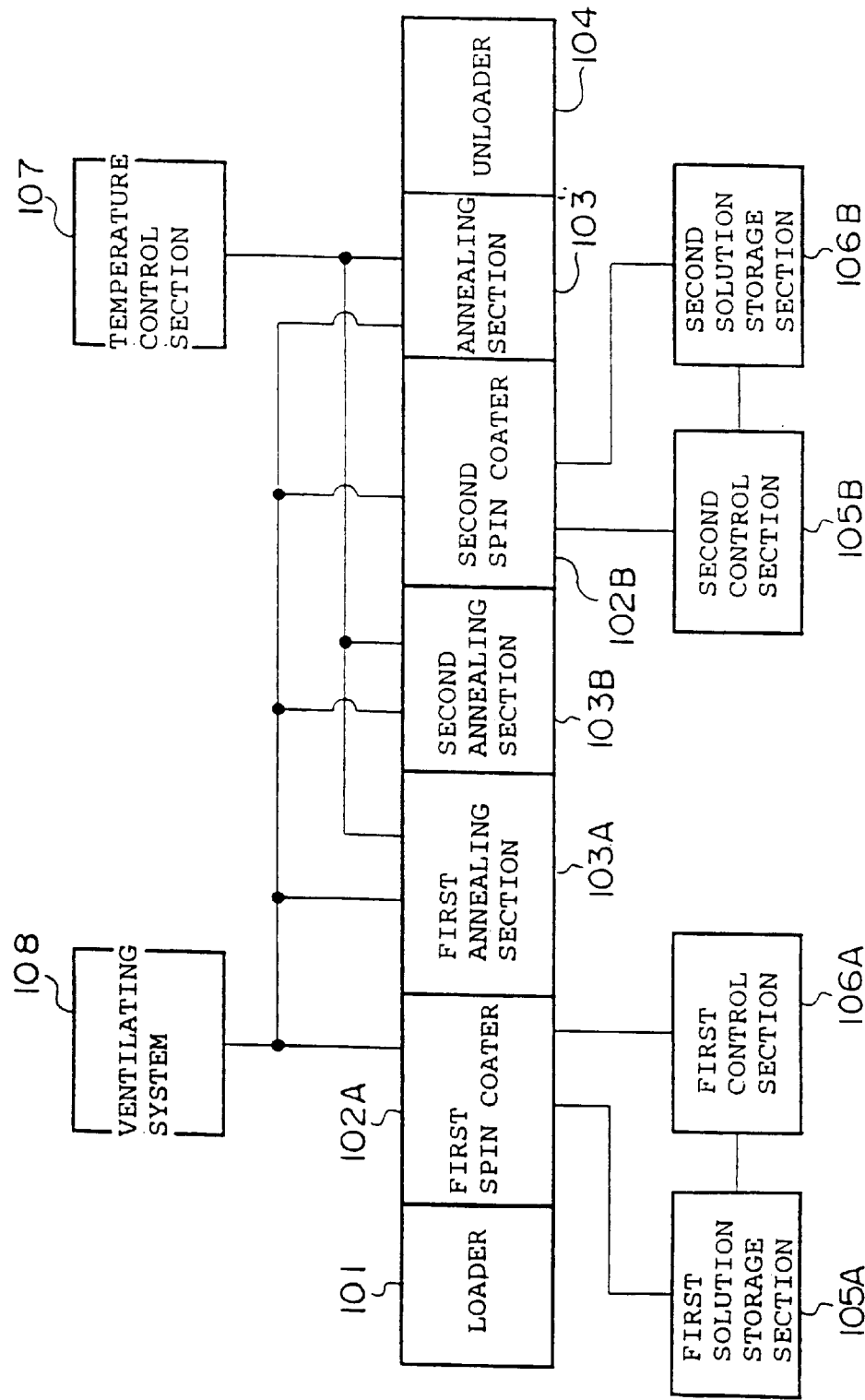
FIG. 5 is a block diagram of an in-line-type coating film deposition unit used in a first embodiment in accordance with the present invention.
Figure 6:
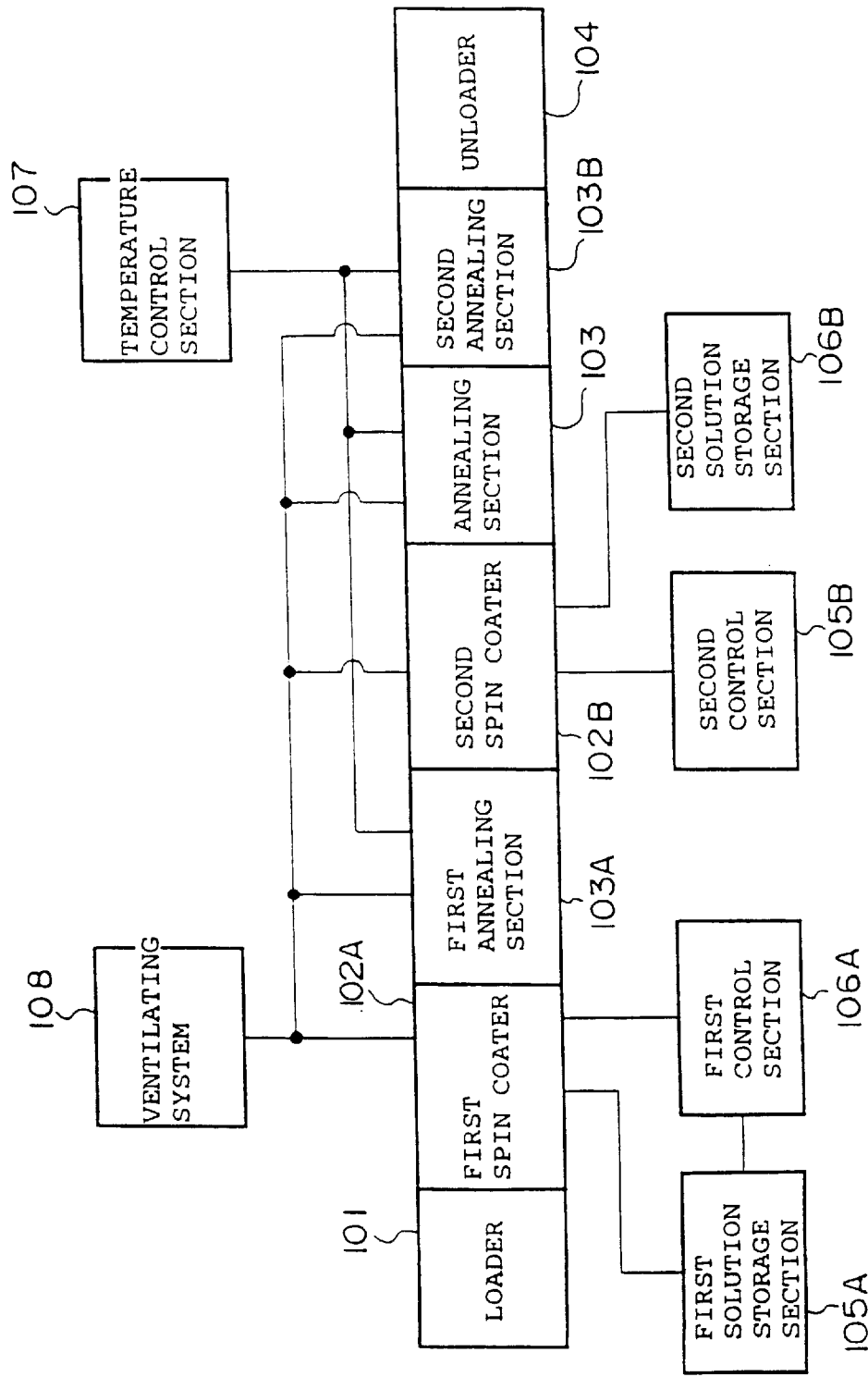
FIG. 6 is a block diagram of another in-line-type coating film deposition unit used in a first embodiment in accordance with the present invention.

FIGS. 5 and 6 are block diagrams of film deposition units for continuously forming a silicon coating film and an insulating coating film.

In the film deposition unit in FIG. 5, a loader 101, a first spin coater 102A, a first annealing section 103A, a second annealing section 103B, a second spin coater 102B, an annealing section 103 and an unloader 104 are in-line-connected. The first spin coater 102A is connected with a first solution storage section 105A storing a suspension of silicon particles and alcohol and with a first control section 106A. The second spin coater 102B is connected with a second solution storage section 105B storing a mixed solution of polysilazane and xylene and with a second control section 106B.

When using the unit in FIG. 5, the number of loading and unloading steps each decreases once and the throughput is further improved.

The film deposition unit in FIG. 6 is a modification of the film deposition unit in FIG. 5, in which the second annealing section 103B is placed after the annealing section 103 for the insulating coating film. In this case, the silicon film provided with an insulating cap layer is crystallized in the second annealing section 103B by laser annealing or the like. Because the insulating layer decreases reflectance of the silicon surface, the laser energy is effectively absorbed in the silicon film. Further, the silicon film has a smooth surface after the laser annealing.

The annealing section 10 and the second annealing section 103B in FIG. 6 may be unified into a common annealing section. In this case, the common annealing section can simultaneously perform firing of the insulating coating film and annealing for crystallization of the silicon film thereon.

Another Method for Forming Silicon Coating Film

Figure 7:
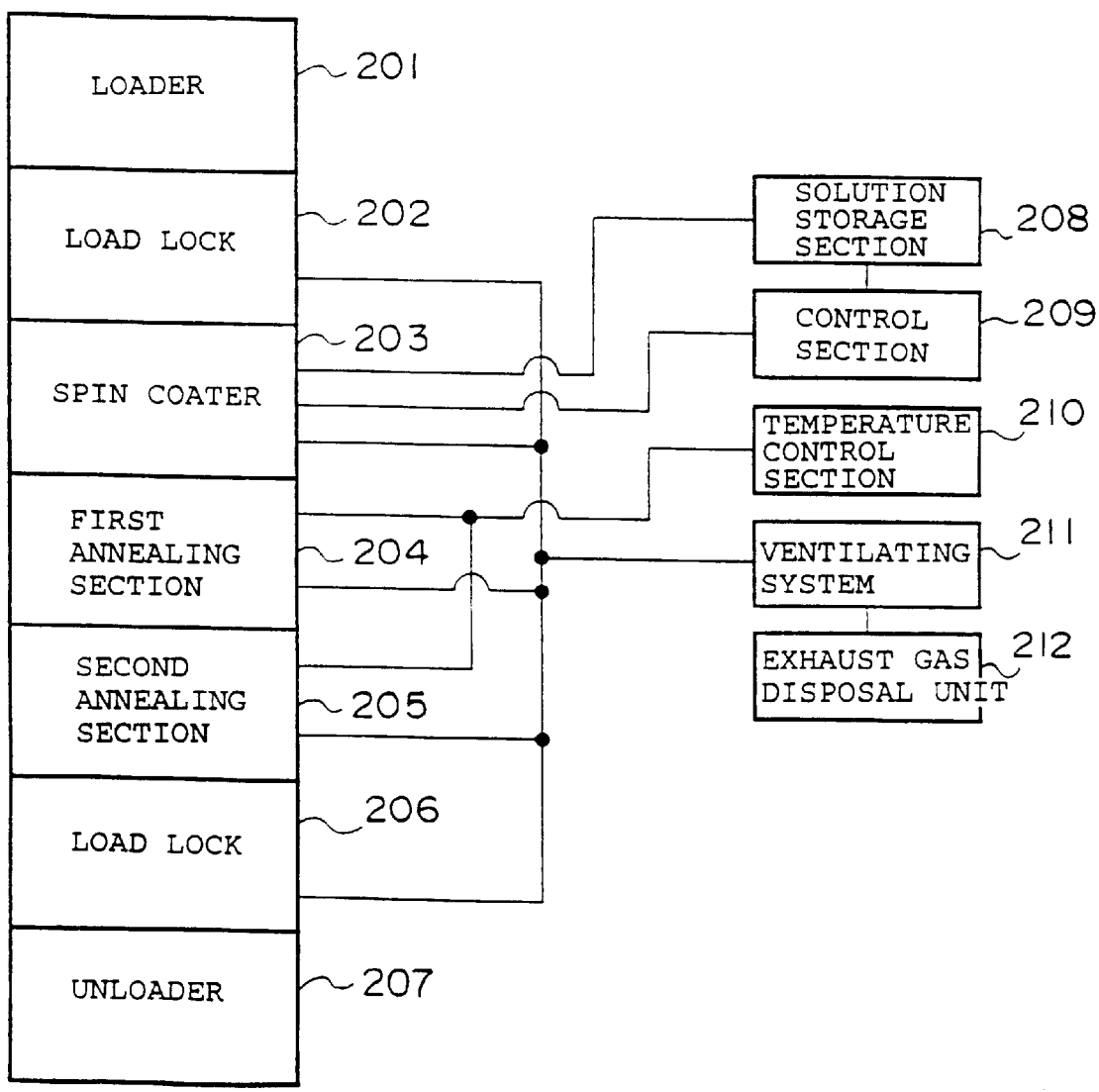
FIG. 7 is a block diagram of a silicon-coating film deposition unit used in a first embodiment in accordance with the present invention.

FIG. 7 shows a coating-type silicon film deposition unit in which a silicon film is formed by coating and annealing of a coating solution. Monosilane ($SiH_4$) and disilane ($Si_2H_6$) are used for forming a silicon film in a CVD process, whereas higher silanes such as disilane and trisilane ($Si_3H_8$) are used in the present invention. Boiling points of silanes are −111.9° C. for monosilane, −14.5° C. for disilane, 52.9° C. for trisilane, and 108.1° C. for tetrasilane ($Si_4H_{10}$), respectively. Monosilane and disilane are therefore gaseous at room temperature and pressure, whereas higher silanes such as trisilane are liquid. As disilane is liquified at minus several tens ° C., it can be used as a coating film. Hereinafter, a case using trisilane will be primarily described.

In FIG. 7, after glass substrates are separately taken out by a loader 201 from a cassette and transferred into a load lock chamber 202, the load lock chamber 202 is evacuated by a ventilating system 211. After evacuating at a given pressure, the glass substrate is transferred onto a spin coater 203 which is also evacuated at a similar pressure, and trisilane in a trisilane storage section 208 is applied onto the glass substrate through a dispenser. The spin coater 203 rotates at a rate of 100 to 2,000 rpm for several seconds to 20 seconds to spin-coat trisilane. The glass substrate after spin-coating trisilane is immediately transferred to a first annealing section 204 having a similar reduced pressure as above, and annealed at 300 to 450° C. for several tens of minutes to form a silicon film with a thickness of several hundred angstroms. Then, the glass substrate is transferred to a second annealing section 205 having a similar reduced pressure as above, and annealed at a high temperature for a short time by laser or lamp annealing. The silicon film is thereby crystallized. After this the glass substrate is transferred to a load lock chamber 206, and is transferred to an unloader 207 to a cassette after the load lock chamber 206 is released to atmospheric pressure with gaseous nitrogen.

Preferably, two ventilating systems 211 are provided, that is, one connected to the two load lock chambers 202 and 206 and the other connected to the spin coater 203 and the first and second annealing sections 204 and 205. The spin coater 203, the first annealing section 204 and the second annealing section 205 are always evacuated by the ventilating system 211 to maintain a reduced pressure (near 1.0 to 0.5 atmospheres) of an inert atmosphere, in order to prevent leakage of gaseous toxic silanes. The threshold limit value (TLV) of monosilane is 5 ppm, and it is considered that higher silanes such as disilane have similar TLVS. Silanes spontaneously burn at room temperature in air and explosively burn at high temperatures. Thus, at least the ventilating system 211 connected to the spin coater 203 and to the first and second annealing sections 204 and 205 is connected to an exhaust gas disposal unit 212 which makes silanes non-toxic. The processing chambers 201 to 207 in FIG. 7 are coupled with each other with gate valves which open and close when the glass substrate is transferred so that gaseous silanes do not flow into the two load lock chambers.

The main section of the spin coater 203 is substantially the same as in FIG. 12, and in FIG. 7. Preferably the temperature at the stage, on which the glass substrate is fixed by vacuum, is controlled by a temperature controlling section 210. The temperature is controlled to room temperature and preferably approximately 0° C. when using trisilane, or at −40° C. or less and preferably −60° C. or less when using disilane. It is preferable that the solution storage section 208 for disilane or trisilane and a feed line (not shown in the drawing) be controlled to a temperature similar to the stage temperature by the temperature control section 210.

Disilane or trisilane must be applied as a liquid at a temperature lower than its boiling point. Because trisilane has a vapor pressure of approximately 0.4 atm at room temperature and pressure and disilane has a vapor pressure of approximately 0.3 atm at −40° C. and ordinary pressure, it is preferable that the temperature of the silane and substrate be decreased as much as possible in order to reduce the vapor pressure as much as possible.

The spin coater 203 and the first and second annealing sections 204 and 205, respectively, may be pressurized with an inert gas in order to further reduce the vapor pressure of disilane or trisilane and improve the uniformity of the coating film. As the boiling temperature of disilane or the like increases in the pressurized state and the vapor pressure decreases at a given temperature, the spin coater 203 can be set at a temperature higher than the above-mentioned temperature and near the room temperature. In this case, it is preferable that each chamber has a double layer structure in view of leakage of trisilane or the like, in which an outer structure is provided out of the pressurized structure and leaked silane or the like in the outer structure is evacuated through another ventilating system. The exhaust gas is disposed in the exhaust gas disposal unit 212.

Also, silane gas remaining in the spin coater 203 and the first and second annealing section 204 and 205, respectively, is evacuated by the ventilating system 211.

Figure 8:
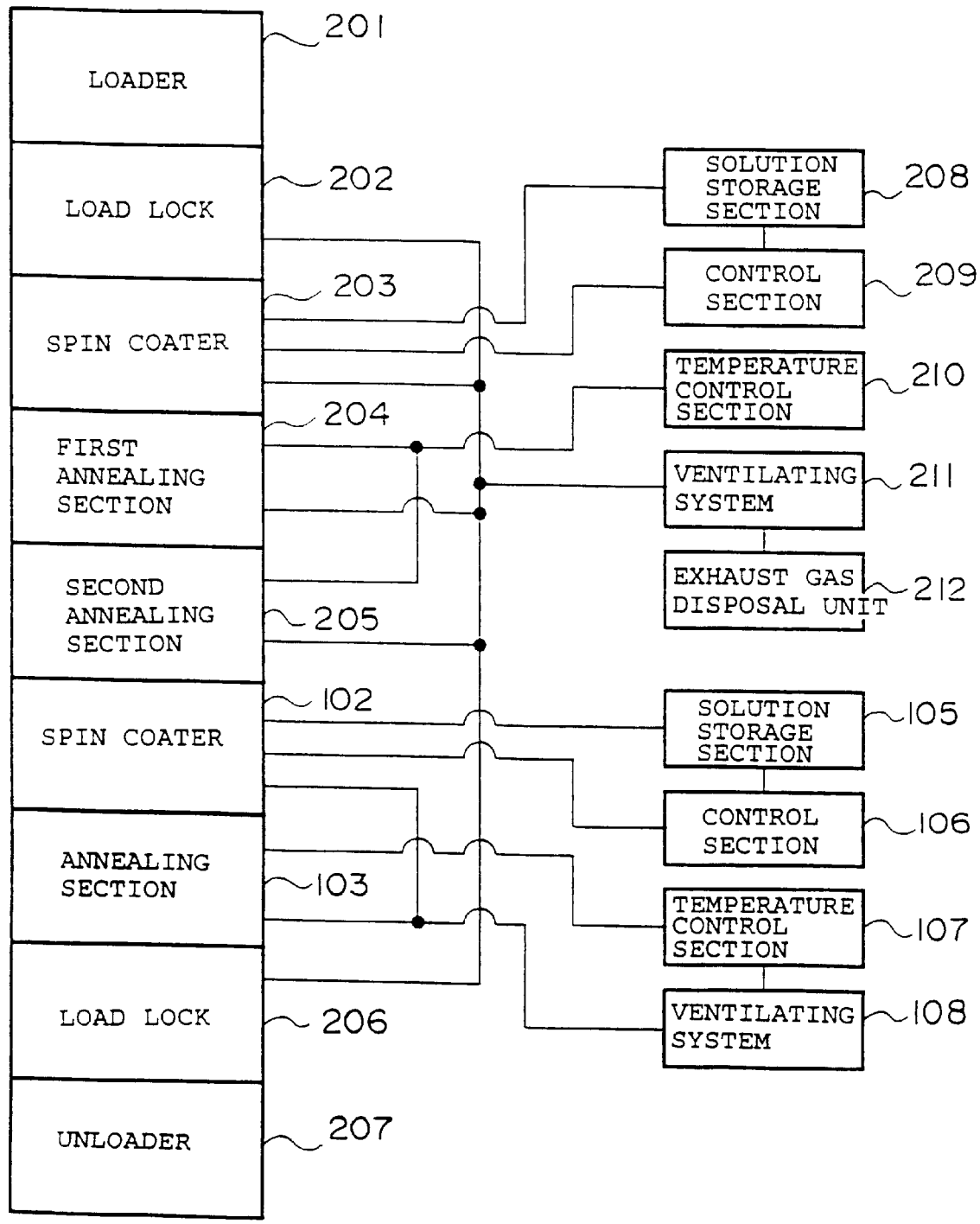
FIG. 8 is a block diagram of another silicon-coating film deposition unit used in a first embodiment in accordance with the present invention.

In FIG. 8, the silicon film deposition unit shown in FIG. 7 and the insulating film deposition unit shown in FIG. 1 are in-line-connected to each other. In other words, the spin coater 102 and the annealing section 103 shown in FIG. 1 are introduced between the second annealing section 205 and the load lock chamber 206 in FIG. 7.

In FIG. 8, the steps for crystallizing the silicon film in the second annealing section 205 by laser annealing are the same as the steps in the unit shown in FIG. 7. The crystallized silicon film is transferred onto the spin coater 102 to apply a polysilazane or inorganic SOG film. The coating film is modified into an insulating film in the annealing section 103.

The spin coater 203 and the first and second annealing sections 204 and 205, respectively, are under reduced pressure of an inert gas atmosphere as in FIG. 7. The spin coater 102 for the insulating film and the annealing section 103 are under ordinary pressure in FIG. 1, whereas those in FIG. 8 are under reduced pressure of an inert gas atmosphere. These chambers are evacuated by the ventilating system 108.

The silicon film formed by the unit shown in FIG. 8 is not exposed to open air, because the insulating film is formed on the silicon film in the inert atmosphere. The interface between the silicon film and the insulating film is therefore controlled to determine characteristics of the TFT element, resulting in improvement in the characteristics of the TFT element and uniformity of these characteristics.

In FIG. 8 the insulating film on the silicon film is formed after crystallization of the silicon film. However, the insulating film may be formed after the first annealing step of the silicon film and the silicon film may be crystallized after annealing of the insulating film. Also, in this case, the silicon film provided with the insulating cap layer is crystallized by laser annealing as in FIG. 6. Because the insulating film decreases the reflectance of the silicon surface, laser energy is effectively absorbed in the silicon film. The silicon film has a smooth surface after the laser annealing.

Method for Diffusing Impurity into Silicon Coating Film

Although an impurity may be diffused into a silicon film using a conventional ion implanting system, it is preferable that an insulating layer containing an impurity be applied onto the silicon layer and then the impurity be diffused into the underlying silicon film.

The insulating layer containing the impurity may be formed by the unit shown in FIG. 2. In this embodiment, an SOG film containing phosphorus glass or boron glass is applied as a coating film containing an impurity. When forming an n-type high-impurity region, the SOG film as a coating film containing an impurity is formed using a solution composed of a siloxane polymer and an ethanol or ethyl acetate solvent (Si content: several wt %), and containing several hundred $\mu$g of $P_2O_5$ per 100 ml of solution.

In this case, the coating solution is stored in the solution storage section 105 in FIG. 2 and applied onto the substrate by the spin coater 102. The substrate on the spin coater 102 is rotated at several thousand rpm to obtain an SOG film with a thickness of several thousand angstroms. The coating film containing the impurity is annealed at 300 to 500° C. in the first annealing section 103A to form a phosphorus glass film containing several mol percent of $P_2O_5$. The TFT substrate provided with the phosphorus glass film is annealed in the second annealing section 103B at a high temperature for a short time by laser annealing, such that the impurity in the SOG film is diffused into the underlying silicon film and a high impurity region is formed in the silicon film. The TFT substrate is stored into a cassette by the unloader 104.

In the formation of the source and drain regions, both the coating step and the annealing step at a high temperature for a short time can be completed within one minute, resulting in high productivity. Although the annealing step requires several tens of minutes, the tact time can be reduced by optimizing the length and structure of the annealing oven.

Figure 10:
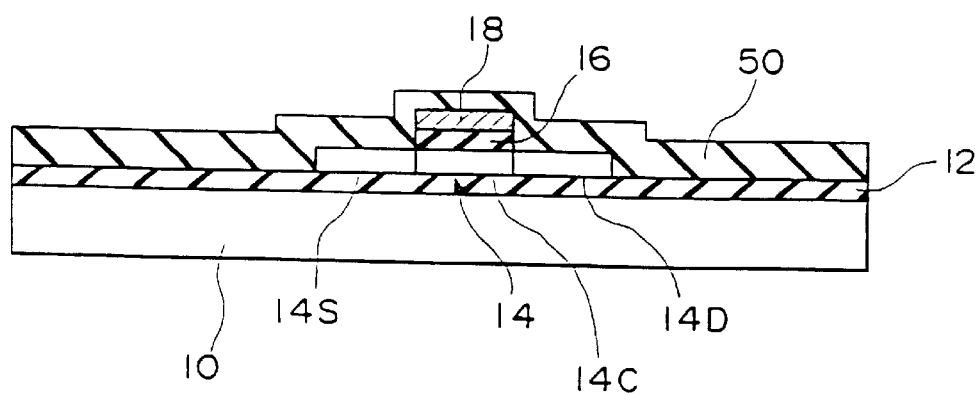
FIG. 10 is a cross-sectional view of a production step of a coplanar-type TFT using an insulating layer containing an impurity in accordance with the present invention.
Figure 11:
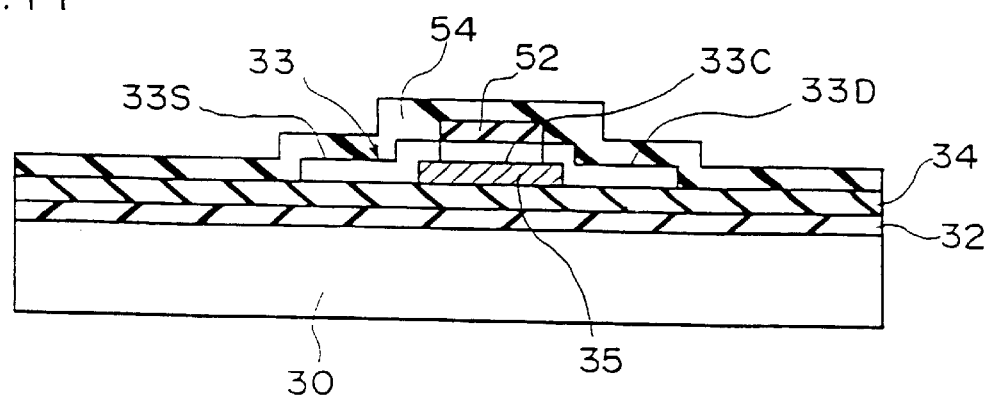
FIG. 11 is a cross-sectional view of a production step of a reverse stagger-type TFT using an insulating layer containing an impurity in accordance with the present invention.

FIGS. 10 and 11 are cross-sectional views of TFTs provided with the coating film containing the impurity. FIG. 10 shows a coplanar-type TFT corresponding to that in FIG. 3, in which an insulating underlayer 12 is formed on a glass substrate 10, and a silicon layer 14 is pattern-formed thereon. A gate insulating film 16 is removed by etching using a gate electrode 18 as a mask, a silicon layer is temporally exposed in regions which will be a source and a drain. The coating film 50 containing the impurity is formed so as to come into contact with the source and drain regions 14S and 14D, respectively, in the silicon film. Phosphorus contained in the coating film 50 is diffused into the silicon film by the high-temperature, short-time annealing step and n-type source and drain regions 14S and 14D, respectively, having sheet resistances of 1 KΩ/□ are formed.

As shown in the cross-sectional view of the TFT shown FIG. 3, the following steps include forming an interlevel insulating film, providing a contact hole, forming a pixel electrode and forming source wiring. In the formation of the interlevel insulating film, the interlevel insulating film may be formed of a coating film after the coating film 50 containing the impurity is removed, or the interlevel insulating film may be formed on the coating film 50 containing the impurity. As the method for forming the interlevel insulating film on the coating film 50 containing the impurity forms two insulating layers, the occurrence of short-circuits between the data line and the gate line in the liquid crystal display device is decreased.

FIG. 11 shows a reverse stagger-type TFT corresponding to that in FIG. 4, in which an insulating underlayer 32 is formed on a glass substrate 30, and a gate electrode 35 is formed thereon. A silicon layer 33 is pattern-formed through a gate insulating film. An insulating film 52 functions as a protective film in the channel region and also as a mask to impurity diffusion, and is formed of an insulating coating film.

An insulating film 54 containing an impurity is formed as an insulating coating film in contact with the insulating film 52 as the mask and regions of the silicon film 33 which will be a source region 33S and a drain region 33D. When the insulating film 54 containing the impurity is annealed at a high temperature for a short time, phosphorus contained in the insulating film is diffused into the silicon film 33 and n-type source and drain regions 33S and 33D, respectively, having sheet resistances of approximately 1 KΩ/□ are formed.

As shown in the cross-sectional view of the TFT shown FIG. 4, after the insulating film 54 containing the impurity is removed, a pixel electrode, source wiring, a drain electrode and connecting sections are formed in that order.

In accordance with the present invention, the source and drain regions in the coplanar-type TFT are formed by forming a coating film and the succeeding high-temperature, short-time annealing instead of a conventional ion implanting or an ion doping. Hence a TFT can be made using an inexpensive unit having a high throughput. In the reverse stagger-type TFT shown in FIG. 4, the source and drain regions are formed by the high-temperature, short-time annealing step instead of the CVD process. Hence a liquid crystal display device can be made using an inexpensive unit having a high throughput as in the coplanar-type TFT.

Method for Forming Conductive Coating Film

A method for forming a conductive coating film by applying a solution containing conductive particles will now be described. The conductive coating film is also made using the unit shown in FIG. 1 or FIG. 2. The liquid stored in the solution storage section 105 in FIG. 1 or FIG. 2 is a suspension of conductive fine particles composed of metal or the like in, for example, an organic solvent. For example, a dispersion of silver particles with a size of 80 to 100 angstroms in an organic solvent, such as terpineol or toluene, is discharged onto the substrate through the spin coater 102. The substrate is rotated at 1,000 rpm to spin-coat the coating solution on the substrate. The substrate is annealed at 250 to 300° C. in the annealing section 103 in FIG. 1 or the first annealing section 103A in FIG. 2 to form a conductive film with a thickness of several thousand angstroms. Examples of conductive materials include Au, Al, Ni, Co, Cr and ITO, and a conductive film can be formed of particles of these materials using the conductive coating film deposition unit.

Because the resulting conductive film is an aggregate of fine particles and is very active, the spin coater 102, the annealing section 103 or the first annealing section 103A must be in an inert gas atmosphere.

The resistance of the conductive coating film will be greater by one order of magnitude than the bulk resistance. In this case, the conductive coating film may be further annealed at 300 to 500° C. in the second annealing section 103B shown in FIG. 2 to decrease the resistance of the conductive film. At the same time, the contact resistance of the source region of the TFT with the data line formed of the conductive coating film, and the contact resistance of the drain region with the pixel electrode formed of the conductive coating film, can be decreased. Introduction of a high-temperature, short-time annealing step by lamp or laser annealing will further decrease the resistance of the conductive coating film and the contact resistances. Further, a plurality of layers comprising different metals may be formed in order to improve reliability. Since Ag is relatively easily oxidized in air, the formation of an Al or Cu layer, which is slightly oxidized in air, on the Ag layer is preferable.

Method for Forming Transparent Electrode

A method for forming a transparent electrode using an ITO coating film will now be described. The ITO coating film may also be formed using the unit shown in FIG. 2. The coating solution used in this embodiment contains 8% of a mixture of an organic indium and an organic tin in a ratio of 97:3 in xylene (for example, manufactured by Asahi Denka Kogyo K.K., trade name: ADEKA ITO coating film/ITO-130L). The ratio of the organic indium to the organic tin in the coating solution may be in a range from 99:1 to 90:10. The coating solution is stored in the solution storage section 105 in FIG. 2.

The coating solution is discharged onto the substrate by the spin coater 102 and spin-coated by the rotation of the substrate.

The annealing conditions of the coating film were as follows. First, the substrate was annealed in an air or oxygen atmosphere at 250° C. to 450° C. for 30 minutes to 60 minutes in the first annealing section 103A shown in FIG. 2. Next, it was annealed in a hydrogen-containing atmosphere at 200° C. to 400° C. for 30 minutes to 60 minutes in the second annealing section 103B. As a result, organic components are removed and a mixed film (ITO film) composed of indium oxide and tin oxide is formed. After the above-mentioned annealing steps, the ITO film with a thickness of approximately 500 angstroms to 2,000 angstroms has a sheet resistance of $10^2$ $\Omega/\square$ to $10^4$ $\Omega/\square$ and a light transmittance of 90% or more, and exhibits satisfactory characteristics as the pixel electrode. Although the sheet resistance of the ITO film after the first annealing step is of the order of $10^5$ $\Omega/\square$ per sheet to $10^6$ $\Omega/\square$, the sheet resistance after the second annealing step decreases to the order of $10^2$ $\Omega/\square$ to $10^4$ $\Omega/\square$.

Regarding the formation of the ITO coating film, the ITO film and the insulating coating film can be formed by an in-line process using the unit shown in FIG. 5 or FIG. 6. The active ITO film surface can therefore be immediately protected with the insulating film.

(Method for Forming Conductive Layer

This method includes the formation of a metal plating layer on the ITO coating film.

Figure 9:
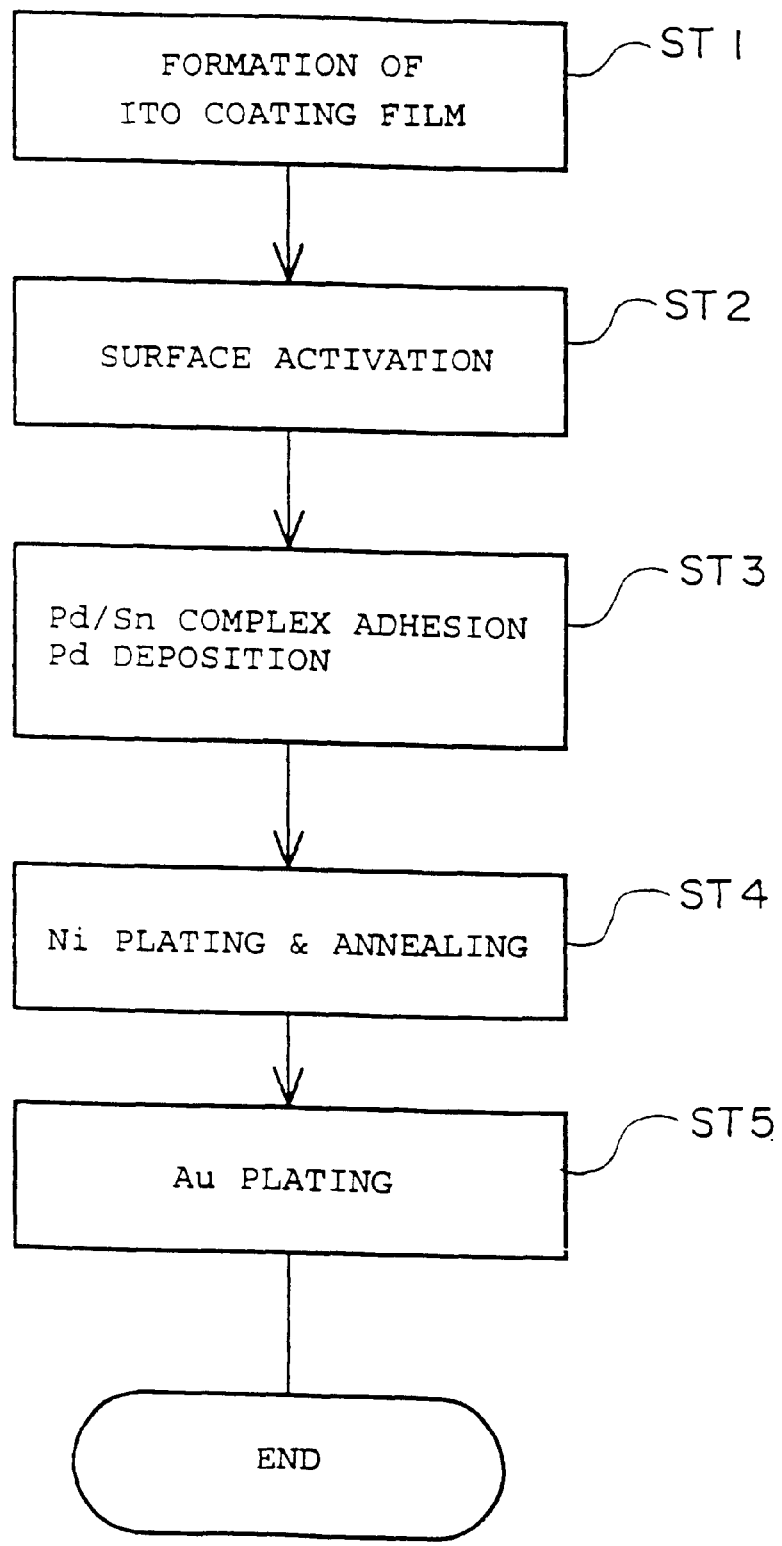
FIG. 9 is a flow chart illustrating a method for metal-plating onto an ITO coating film surface.

FIG. 9 is a flow chart of Ni plating on the ITO coating film. In Step 1 of FIG. 9, the ITO film is formed by the above-mentioned method. In Step 2, the surface of the ITO coating film is slightly etched to activate the surface. In Step 3, as a pretreatment for Ni plating in Step 4, a Pd/Sn complex is adhered onto the surface of the ITO coating film and then Pd is precipitated on the surface.

In the Ni plating of Step 4, Pd precipitated on the ITO coating film is replaced with Ni to form a Ni plating layer by, for example, an electroless plating process. The Ni plating layer becomes more dense by annealing in Step 4.

Finally, in Step 5, a noble metal plating layer, for example, an Au plating layer, as an antioxidant layer is formed on the Ni plating layer to form a conductive layer.

Conductive layers other than the transparent electrode can be formed from the ITO coating film base by forming plating layers.

Coating Method other than Spin Coating

Figure 14:
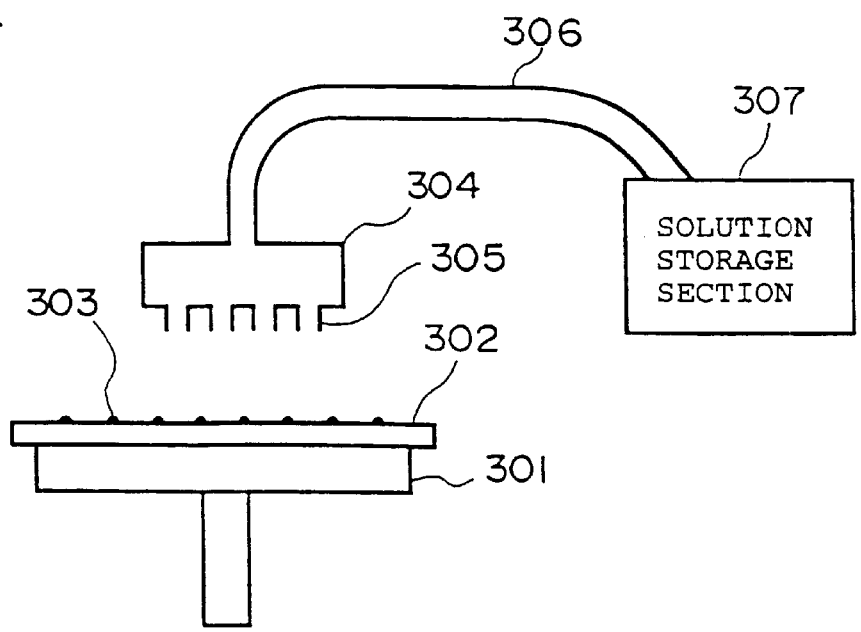
FIG. 14 is a block diagram of another solution coating unit in accordance with the present invention.
Figure 15:
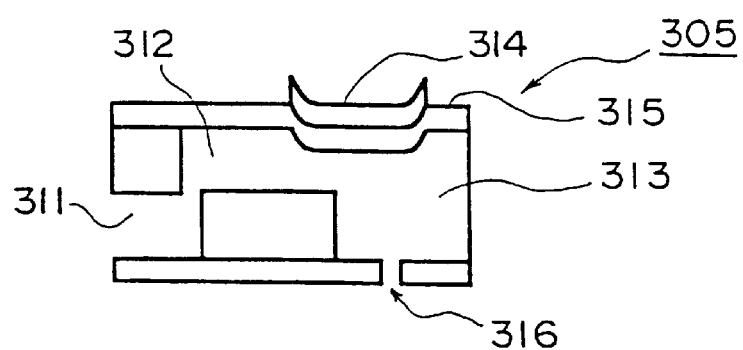
FIG. 15 is an enlarged partial view of the solution coating unit shown in FIG. 14.
Figure 16:
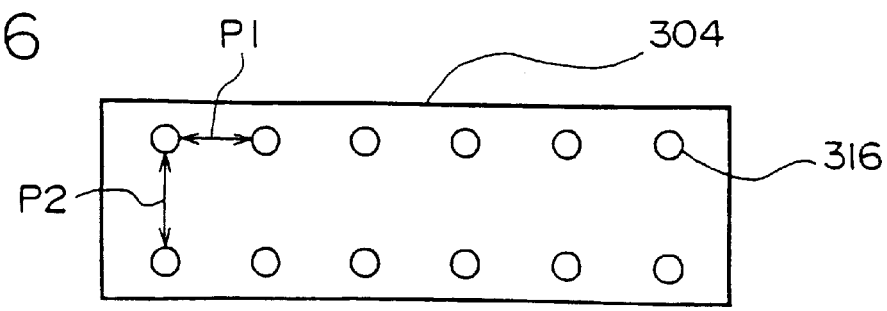
FIG. 16 is an enlarged partial view of the solution coating unit shown in FIG. 14.
Figure 17:
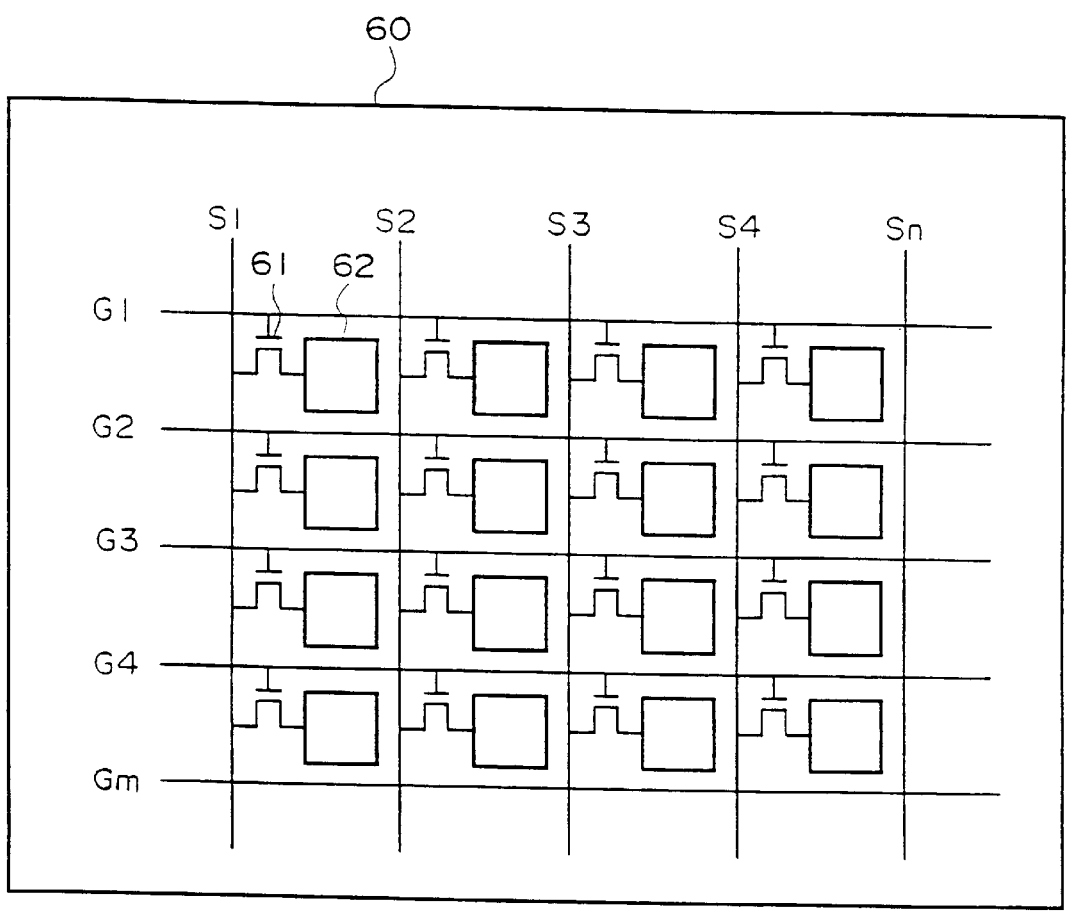
FIG. 17 is a schematic view of a TFT substrate forming a liquid crystal display device.

FIGS. 14 to 16 show a coating unit which applies a solution forming a thin film or a resist solution used as a mask in photoresist etching. In this embodiment, a resist is exemplified as the solution to be coated. The coating unit can be also applied to the formation of various coating films other than the resist coating.

In FIG. 14, a substrate 302 is fixed by vacuum on a stage 301. The resist is supplied to a dispenser head 304 through a feeding pipe 306 from a solution storage section 307. The resist is applied onto the substrate 302 as numerous dots 303 from a plurality of nozzles 305 provided on the dispenser head 301.

FIG. 15 is a detailed cross-sectional view of the nozzle 305. The nozzle structure in FIG. 15 is similar to that of an ink jet printer, and the resist is discharged by vibration of a piezoelectric element. The resist reaches a cavity section 313 through an inlet section 311 and a supply port 312. A vibration plate 315 moves in cooperation with vibration of a piezoelectric element 314 in close contact with the vibration plate 315 and the volume in the cavity 313 decreases or increases. When the volume in the cavity 313 decreases, the resist is discharged from the nozzle 316, and when the volume in the cavity 313 increases the resist is supplied to the cavity 313 from the supply port 312. As shown in FIG. 16, for example, a plurality of nozzles 316 are two-dimensionally arranged, the resist is applied onto the entire substrate as dots by relative movement of the substrate 302 or the dispenser 304, as shown in FIG. 14.

In FIG. 16, the array pitches of the nozzles 316 are several hundred $\mu$m for the lateral pitch P1 and several mm for the longitudinal pitch P2. The nozzle 316 has a bore of several tens of $\mu$m to several hundred $\mu$m. The volume of the resist discharged in a cycle ranges from several tens of ng to several hundred ng, and the diameter of the discharged droplets ranges from several tens of $\mu$m to several hundred $\mu$m.

The applied resist dot has a circular shape of several hundred $\mu$m immediately after it is discharged from the nozzle 305. When applying the resist onto the entire substrate, the pitch of the dots 303 is set to several hundred $\mu$m and the substrate is rotated at several hundred to several thousand rpm for several seconds to form a coating film having a uniform thickness. The thickness of the coating film can be controlled by the bore of the nozzle 316 and the pitch of the dots 303, as well as the rotation rate and time of the substrate.

The resist coating process is an ink jet-type liquid coating process and the resist is applied onto the entire substrate as dots. Because the substrate is moved or rotated so as to apply the resist to nonresist portions between dots 303, the resist is effectively used. This process is also applicable to the formation of the insulating film, silicon film and conductive film instead of the coating process, and thus greatly contributes to cost reductions of liquid crystal display devices.

As the bore of the nozzle 316 can be further decreased in the ink jet-type liquid coating, the solution can be applied to form a linear pattern with a width of 10 to 20 $\mu$m. Use of this process in the formation of the silicon film or a conductive film permits direct patterning which requires no photolithographic process. When the design requirement of the TFT is several tens of $\mu$m, a combination of the direct patterning with a coating-type thin film deposition process permits producing liquid crystal display devices without a CVD system, a sputtering system, an ion implanting system, an ion doping system, an exposure system and an etching system. In other words, liquid crystal display devices can be produced by an ink jet-type liquid coating unit in accordance with the present invention and an annealing unit such as a laser or lamp annealing unit.

In the first embodiment, although a TFT active matrix substrate is exemplified as a thin film device, the technologies in the first embodiment are also applicable to other active matrix substrates, two-terminal and three-terminal elements such as pixel switching elements composed of MIM (metal-insulator-metal) or MIS (metal-insulator-silicon). For example, the thin film monolithic structure of an MIM active matrix substrate includes no semiconductor layer, and consists of a conductive layer and an insulating layer, and the present invention is also applicable to such a case. Further, the present invention is applicable to various display devices other than active matrix substrates, for example, an electro-luminescence device. In addition, the present invention is applicable to thin film devices having various thin film monolithic structures comprising a conductive layer, an insulating layer and a semiconductor layer, such as semiconductor devices including TFTs and DMDs (digital mirror devices).

Second to Seventh Embodiments will now be described in which the present invention is applied to active matrix substrates for liquid crystal display devices and, in particular, pixel electrodes are formed by conductive coating films.

Second Embodiment

Figure 18:
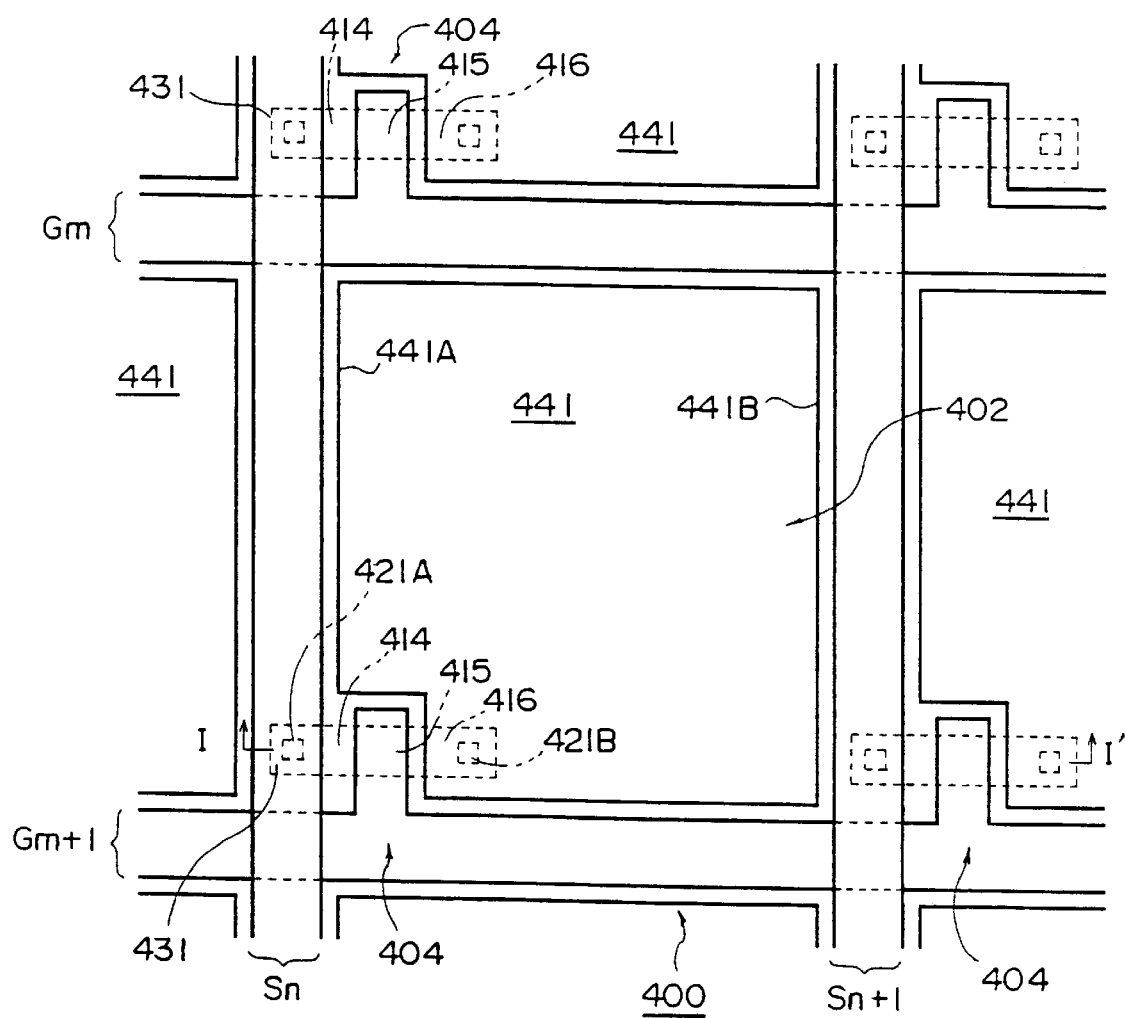
FIG. 18 is an enlarged plan view of a portion of a pixel region independently formed on an active matrix substrate for a liquid crystal display device in accordance with a second embodiment of the present invention.
Figure 19:
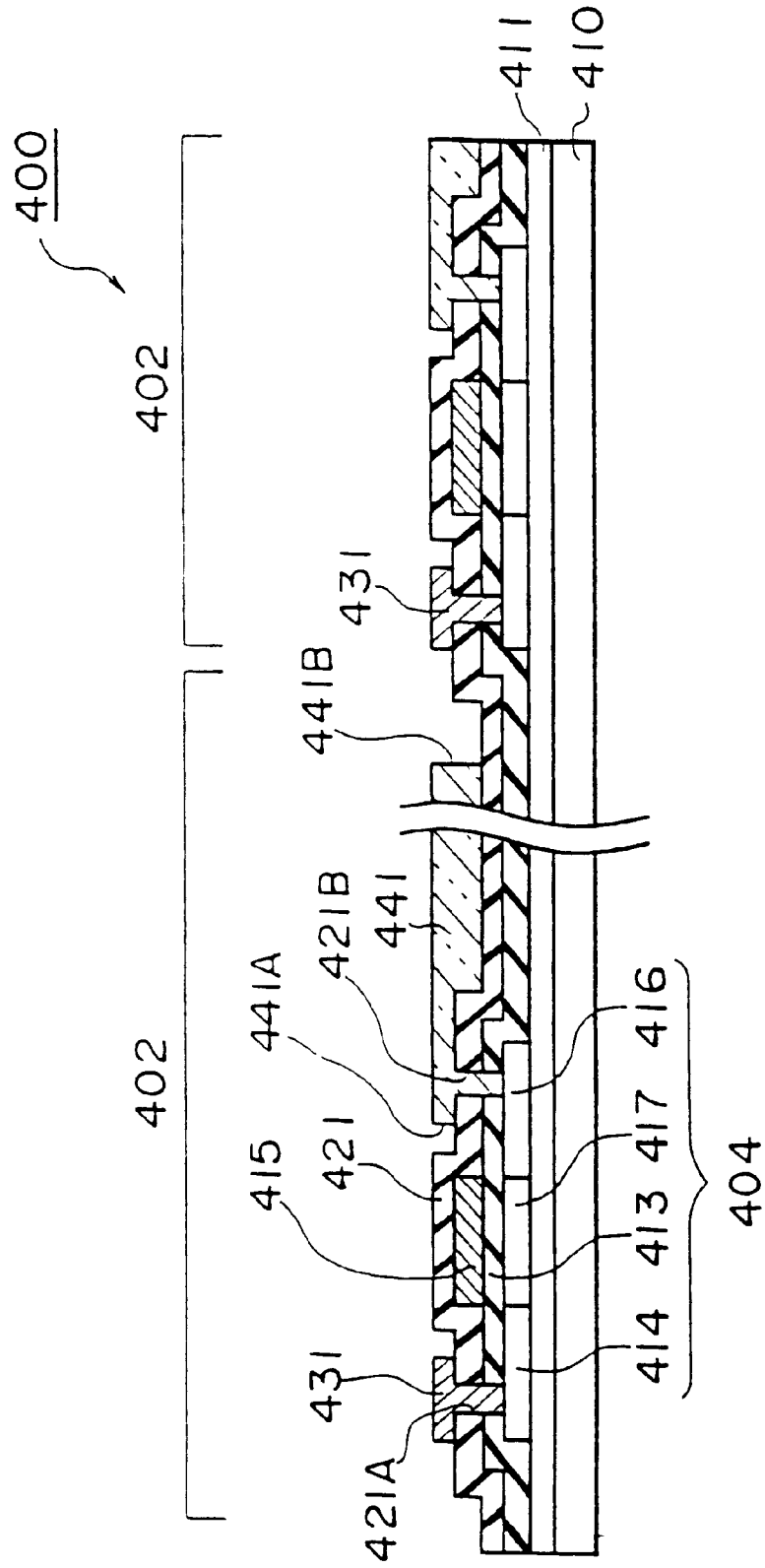
FIG. 19 is a cross-sectional view taken along section I-I' of FIG. 18.

FIG. 18 is an enlarged partial plan view of pixel regions formed on an active matrix substrate for a liquid crystal display device, and FIG. 19 is a cross-sectional view taken along section I-I' of FIG. 18.

In FIGS. 18 and 19, the active matrix substrate 400 for the liquid crystal display device is divided into a plurality of pixel regions 402 by data lines Sn, Sn+1 . . . and scanning lines Gm, Gm+1 . . . on an insulating substrate 410, and each of the pixel regions 402 is provided with a TFT 404. The TFT 404 is provided with a channel region 417 forming a channel between a source region 414 and a drain region 416, a gate electrode 415 opposing to the channel region 417 with a gate insulating film 413 formed therebetween, an interlevel insulating film 421 formed on the top face of the gate electrode 415, a source electrode 431 electrically connected to the source region 414 through a contact hole 421A formed in the interlevel insulating film 421, and a pixel electrode 441 composed of an ITO film which is electrically connected to the drain electrode 416 through a contact hole 421B formed in the interlevel insulating film 421. The source electrode 431 is a part of the data lines Sn, Sn+1 . . . , and the gate electrode 415 is a part of the scanning lines Gm, Gm+1 . . . .

The pixel electrode 441, as well as the source electrode (data line) 431, is formed on the interlevel insulating film 421. The pixel electrode 441 is therefore formed such that the peripheries 441A and 441B parallel to the data lines Sn and Sn+1 lie at positions considerably inside the data lines Sn and Sn+1 to prevent the occurrence of short-circuits between these electrodes.

FIGS. 20(A) to 20(D) and FIGS. 21(A) to 21(C) are cross-sectional views illustrating manufacturing steps of the active matrix substrate in this embodiment.

In the production of such an active matrix substrate 400, first a general-purpose nonalkaline glass is prepared as the insulating substrate 410, as shown in FIG. 20(A). After the insulating substrate 410 is cleaned, a protective underlayer 411 composed of a silicon oxide film is formed on the insulating substrate 410 by a chemical vapor deposition (CVD) process or a physical vapor deposition (PVD) process. Examples of CVD processes include a low pressure CVD (LPCVD) process and a plasma enhanced CVD (PECVD) process. A typical PVD process is a sputtering process. The protective underlayer 411 may be omitted in view of impurities contained in the insulating substrate 410 and cleanliness on the substrate surface.

Next, an intrinsic semiconductor film 406, such as a silicon film, which should be an active layer of the TFT 404, is formed. The semiconductor layer can be also formed by a CVD or PVD process. The resulting semiconductor film 406 can be used as an amorphous silicon semiconductor layer, such as a channel region of the TFT. Alternatively, as shown in FIG. 20(B), the semiconductor film 410 may be irradiated with optical energy such as laser light, or electromagnetic energy, to promote crystallization.

After a resist mask having a given pattern is formed, the semiconductor film 406 is patterned using the resist mask to form insular semiconductor films 412, as shown in FIG. 20(C). After forming the semiconductor films 412, a gate insulating film 413 is formed by a PVD or CVD process.

A thin film as a gate electrode composed of an aluminum film or the like is formed by a sputtering process. In general, the gate electrode and gate lead are formed of a common metal material by the same process. After depositing the gate electrode thin film, as shown in FIG. 20(D), gate electrodes 415 are formed by patterning. Scanning lines are also formed in this step. Impurity ions are introduced into each semiconductor film to form a source region 414 and a drain region 416. A section not doped with impurity ions functions as a channel region 417. As the gate electrode 415 functions as a mask of ion implanting in this method, the TFT has a self-alignment structure in which the channel region 417 is formed only under the gate electrode 415; however, the TFT may be an offset gate structure or an LDD structure. Impurity ions may be introduced by an ion doping process which implants hydride of the impurity element and hydrogen using a mass-nonseparation-type ion implanting system, or by an ion implanting system which implants only predetermined impurity ions using a mass-separation-type ion implanting system. Examples of material gases used in the ion doping process include hydrides of implanted impurities, such as phosphine ($PH_3$) and diborane ($B_2H_6$) which are diluted in hydrogen to a concentration of approximately 0.1%.

Next, as shown in FIG. 21(A), an interlevel insulating film 421 composed of a silicon oxide film is formed by a CVD or PVD process. After ion implantation and forming the interlevel insulating film 421, the interlevel insulating film 421 is annealed at a temperature of 350° C. or less for several tens of minutes to several hours in a given thermal environment to activate the implanted ions and to bake the interlevel insulating film 421.

Next, as shown in FIG. 21(B), contact holes 421A and 421B are formed at positions of the interlevel insulating film 421 corresponding to the source region 414 and the drain region 416. An aluminum film or the like is formed by a sputtering process, and patterned to form a source electrode 431. A data line is also formed in this step.

Next, as shown in FIG. 21(C), an ITO film 408 is formed on the entire interlevel insulating film 421 by a coating process.

Various liquid or paste coating materials can be used in the coating process. Among these coating materials, liquid materials are applicable to a dipping or spin coating process, paste materials are applicable to a screen printing process. The coating material used in the Second Embodiment contains 8% of a mixture of an organic indium and an organic tin in a ratio of 97:3 in xylene (for example, manufactured by Asahi Denka Kogyo K.K., trade name: ADEKA ITO coating film/ITO-130L), as in the First Embodiment, and is spin-coated on the top face of the insulating substrate 410 (on the interlevel insulating film 421). The ratio of the organic indium to the organic tin in the coating material may be in a range from 99:1 to 90:10.

In the Second Embodiment, the film coated on the insulating substrate 410 is annealed (baked) after removing the solvent and drying it. After the film is annealed in an air or oxygen atmosphere at 250° C. to 450° C. for 30 minutes to 60 minutes, it is reannealed in a hydrogen atmosphere at 200° C. to 400° C. for 30 minutes to 60 minutes. As a result, organic components are removed and a mixed film (ITO film) of indium oxide and tin oxide is formed. After the above-mentioned annealing steps, the ITO film with a thickness of approximately 500 angstroms to 2,000 angstroms has a sheet resistance of $10^2$ Ω/□ to $10^4$ Ω/□ and a light transmittance of 90% or more, and exhibits satisfactory characteristics as the pixel electrode 441. Although the sheet resistance of the ITO film after the first annealing step is of the order of $10^5$ $\Omega/\square$ to $10^6$ $\Omega/\square$, the sheet resistance after the second annealing step decreases to the order of $10^2$ $\Omega/\square$ to $10^4$ $\Omega/\square$.

After forming the ITO film 408 in such a manner, the pixel electrode 441 is formed by patterning, as shown in FIG. 19, and thus a TFT 404 is formed in the pixel region 402. When the TFT 404 is driven by control signals supplied through the scanning line Gm, image information for displaying is input to the liquid crystal cell encapsulated between the pixel electrode 441 and a counter electrode (not shown in the drawings) from the data line Sn through the TFT 404.

In the Second Embodiment as described above, as a liquid coating material is applied onto the insulating substrate 410 by a coating process, such as a spin coating process, which is suitable for treatment of large substrates, to form the ITO film for forming the pixel electrode 441, the ITO film can be formed by an inexpensive system, without using a large film deposition system provided with a vacuum unit, such as a sputtering system.

In the coating method, the liquid or paste coating material fills up the contact hole 421B as shown in FIG. 25(B) when it is applied onto the interlevel insulating film 421. The surface shape of the resulting pixel electrode 441 is only slightly affected by the unevenness of the layers thereunder. As a result, a flat pixel electrode 441 (conductive film) with no surface steps can be formed, rubbing can be stably achieved, and the occurrence of reverse-tilt domains can be prevented. According to the Second Embodiment, the display quality is improved.

In contrast, when the pixel electrode is formed by an ITO sputtering film 450 as shown in FIG. 25(A), the resulting ITO sputtering film 450 is formed according to the steps of the surface thereunder. Such steps on the ITO sputtering film 450 result in unstable rubbing and the occurrence of reverse-tilt domains, and thus decrease display quality. Further, because it is difficult to form the ITO sputtering film so that it fills up the entire contact hole 421B, an opening is formed there. Such an opening also results in unstable rubbing and the occurrence of reverse-tilt domains. Accordingly, it is useful to form a pixel electrode 441 by an ITO coating film, as shown in FIG. 25(B).

Third Embodiment

Figure 22:
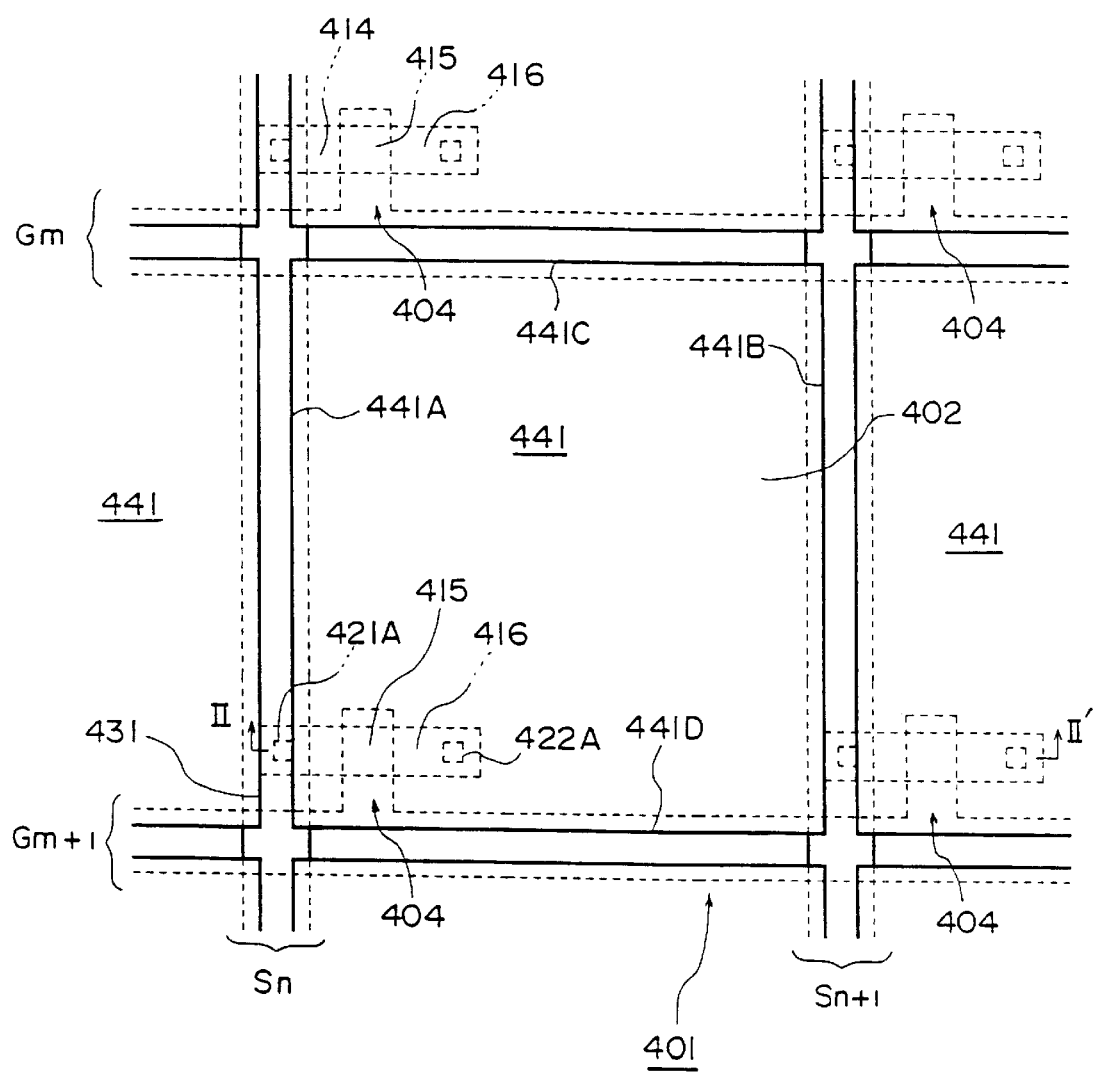
FIG. 22 is an enlarged plan view of a portion of a pixel region independently formed on an active matrix substrate for a liquid crystal display device in accordance with a third embodiment of the present invention.
Figure 23:
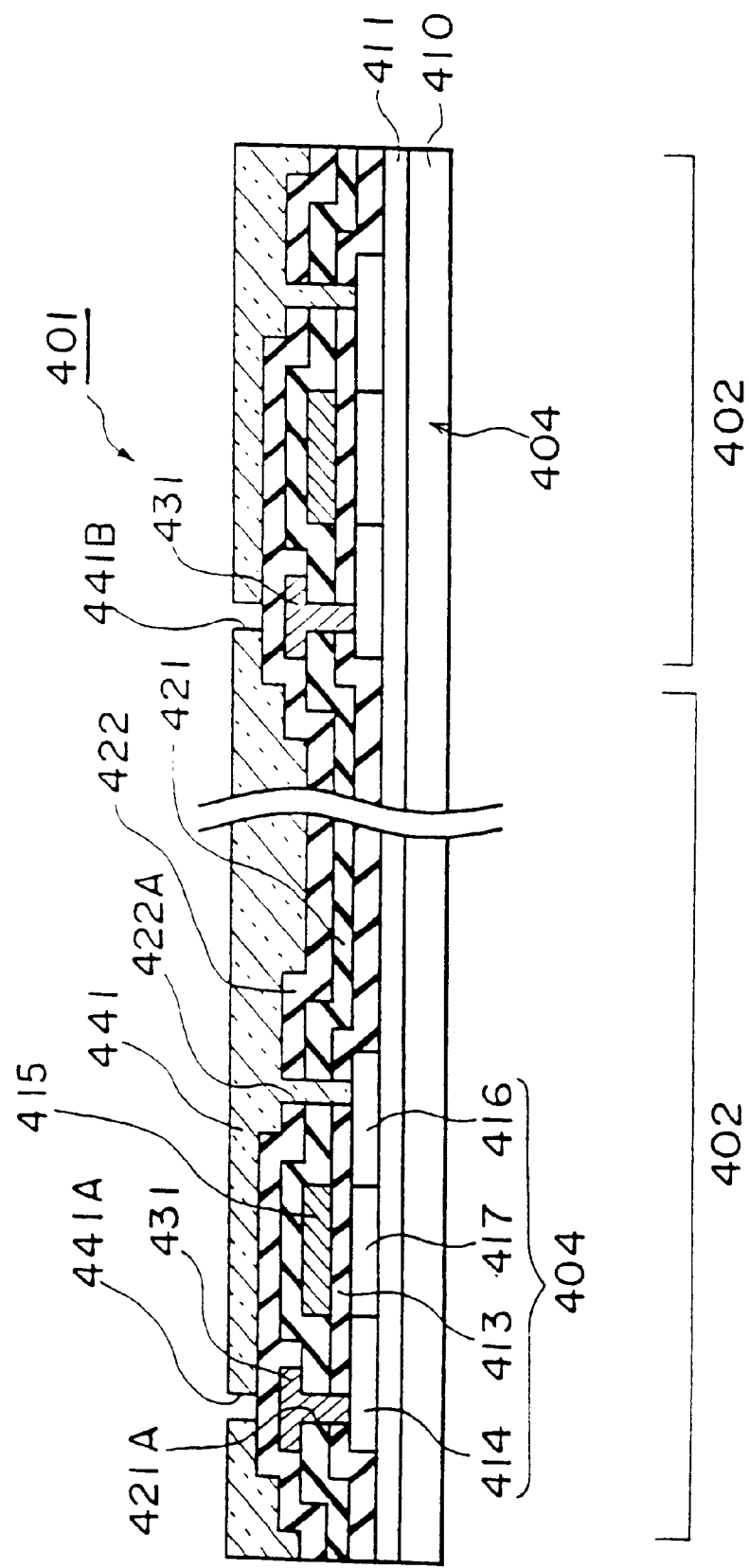
FIG. 23 is a cross-sectional view taken along section II-II' of FIG. 22.

FIG. 22 is an enlarged partial plan view of pixel regions formed on an active matrix substrate for a liquid crystal display device, and FIG. 23 is a cross-sectional view taken along section II-II' of FIG. 22.

In FIGS. 22 and 23, differences between the thin film device configuration on the active matrix substrate 401 for the liquid crystal display device in accordance with the Third Embodiment and the thin film device configuration on the active matrix substrate 400 for the liquid crystal display device in accordance with the Second Embodiment are as follows.

The Third Embodiment employs a double-layer-structure interlevel insulating film including a lower interlevel insulating film 421 formed on a gate electrode 415 and an upper interlevel insulating film 422 formed on the lower interlevel insulating film 421. A source electrode 431 is therefore formed on the lower interlevel insulating film 421 and is electrically connected to a source region 414 through a contact hole 421A in the lower interlevel insulating film 421.

On the other hand, a pixel electrode 441 is formed on the upper interlevel insulating film 422, and is electrically connected to a drain region 416 through a contact hole 422A in the upper interlevel insulating film 422 and the lower interlevel insulating film 421. Because the pixel electrode 441 and the source electrode 431 are formed on different layers from each other, these electrodes do not short-circuit each other.

In the Third Embodiment, as shown in FIG. 22, two peripheral sides 441A and 441B, parallel to data lines Sn and Sn+1, respectively, of the pixel electrode 441 in each pixel region 402 lie above the respective data lines Sn and Sn+1. Further two peripheral sides 441C and 441D, parallel to scanning lines Gm and Gm+1, respectively, of the pixel electrode 441 lie above the respective scanning lines Gm and Gm+1. In other words, a part of the pixel electrode 441 is formed on the data lines Sn and Sn+1 and the scanning lines Gm and Gm+1. No gap is therefore formed between the four peripheral sides 441A to 441D and the data lines Sn and Sn+1 or the scanning lines Gm and Gm+1 in the plan view. As a result, the data lines Sn and Sn+1 and the scanning lines Gm and Gm+1 function as a black matrix, and high quality display can be achieved without providing additional steps for forming a black matrix layer.

The manufacturing process of such an active matrix substrate 401 also include the steps shown in FIGS. 20(A) to 20(D) for the Second Embodiment. The following steps after the steps shown in FIGS. 20(A) to 20(D) will be described with reference to FIGS. 24(A) to 24(D).

As shown in FIG. 24(A), after forming a source region 414, a drain region 416, a channel region 417, a gate region 413 and a gate electrode 415, a lower interlevel insulating film 421 composed of a silicon oxide film is formed by a CVD or PVD process.

Next, as shown in FIG. 24(B), a contact hole 421A is formed at a position of the lower interlevel insulating film 421, corresponding to the source region 414. An aluminum film is formed by a sputtering process and then is patterned to form a source electrode 431 and data lines Sn, Sn+1 . . . .

Next, as shown in FIG. 24(C), an upper interlevel insulating film 422 composed of a silicon oxide film is formed on the lower interlevel insulating film 421 by a CVD or PVD process. A contact hole 422A is formed at positions of the lower interlevel insulating film 421 and the upper interlevel insulating film 422, corresponding to the drain region 416.

Next, as shown in FIG. 24(D), an ITO film 409 is formed by coating on the entire surface of the interlevel insulating film 422.

The coating film can be also formed with various liquid and paste coating materials as in the First and Second Embodiments. Among these coating materials, liquid materials are applicable to a dipping or spin coating process, and paste materials are applicable to a screen printing process.

In the Third Embodiment, the resulting ITO coating film 409 is subjected to first and second annealing processes as described above to decrease its sheet resistance.

Then, the ITO film 409 is patterned to form a pixel electrode 441 as shown in FIG. 23. As described with reference to FIG. 22, in each pixel region 402, the ITO film 409 is patterned such that the four peripheral sides 441A to 441D of the pixel electrode 441 lie above the data lines Sn and Sn+1 and the scanning lines Gm and Gm+1. As the data lines and the scanning lines are generally formed of a metal film, these data lines and scanning lines can be used as a black matrix. As a result, high quality display can be achieved without further steps.

Further, the pixel region 441 is expanded as much as possible so as to overlap with the data lines and the scanning lines, hence the pixel region 402 has a high aperture ratio. The display quality is further improved thereby.

In the Third Embodiment, because the ITO film for forming the pixel electrode 441 is formed on the insulating substrate 410 by a spin coating process (coating film deposition method) which is suitable for treatment of a large substrate, using a liquid coating material, the pixel electrode 441 has, as shown in FIG. 23, a large thickness at an indented portion of the lower layer and a small thickness at a protruding portion of the lower layer. As a result, unevenness due to the data lines is not reflected on the surface of the pixel electrode 441. The formation of a flat pixel electrode 441 without surface steps can stabilize rubbing and prevent the occurrence of reverse-tilt domains. Such advantages hold on the upper layer side of the scanning lines. The present invention therefore improves display quality.

Further, because a liquid coating material is applied onto the insulating substrate 410 by a spin coating process, the ITO film for forming the pixel electrode 441 can be formed by an inexpensive film coating system, differing from a sputtering process requiring a large film deposition system provided with a vacuum unit.

Additionally, the coating method has excellent characteristics for covering steps, hence large unevenness of the contact holes 421A and 422A in the lower and upper interlevel insulating films 421 and 422 does not affect the surface shape of the pixel electrode 441 (ITO film). Because the two interlevel insulating films, that is, the lower interlevel insulating film 421 and the upper interlevel insulating film 422 are formed, a flat pixel electrode 441 without surface steps can be formed regardless of large unevenness due to the contact holes 421A and 422A. In such a configuration, the pixel electrode 441 is directly connected to the drain region 416 and no repeater electrode (via) electrically connected to the drain region 416 is formed between the lower interlevel insulating film 421 and the upper interlevel insulating film 422, resulting in simplified production steps.

In the formation of the pixel electrode in the Third Embodiment, although a spin coating process is employed to form the ITO film using a liquid coating material, the ITO film can be formed by a printing process using a paste coating material. As the paste coating material can also be applicable to a screen printing process, a paste coating material is applied onto only the region forming the pixel electrode 441, followed by drying and annealing, and the printed region can be used as the pixel electrode 441 without further steps. Because patterning of the ITO by an etching process is not required in this case, the production costs can be drastically decreased.

In the Second and Third Embodiments, coplanar-type TFTs are exemplified, in which the surface shape of the pixel electrode 441 is greatly affected by the contact holes in the interlevel insulating film. When the present invention is applied to the formation of a pixel electrode on a lower layer having unevenness in a reverse stagger-type TFT, the effect of such unevenness on the surface shape of the pixel electrode can be removed.

Fourth Embodiment

Figure 26:
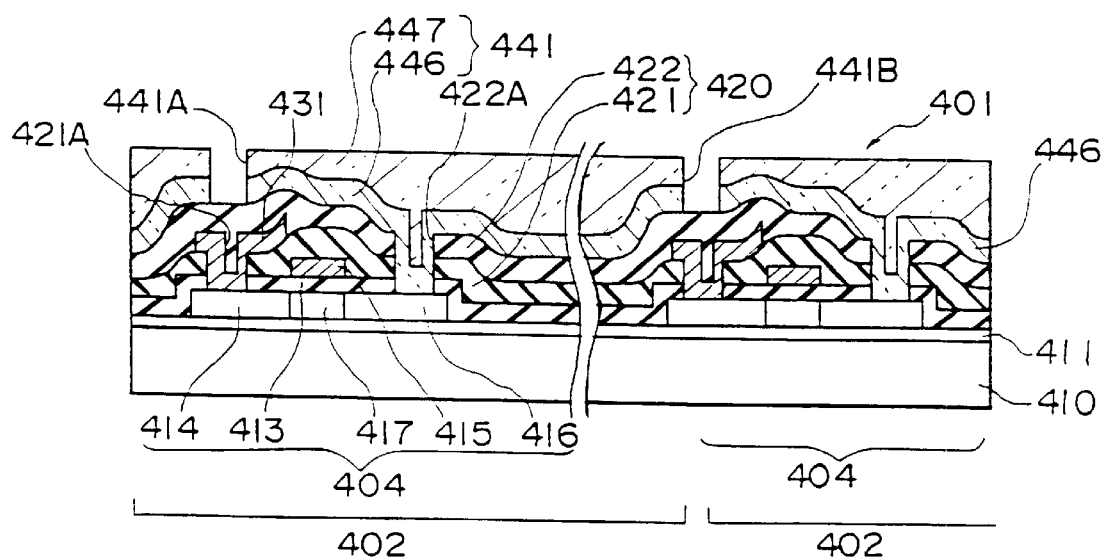
FIG. 26 is a cross-sectional view of a structure in accordance with a fourth embodiment of the present invention, taken along section II-II' of FIG. 22.

FIG. 26 is a cross-sectional view taken along section II-II' of FIG. 22, showing a configuration according to the Fourth Embodiment which is different from that in FIG. 23.

The Fourth Embodiment also employs two interlevel insulating films 420 composed of a lower interlevel insulating film 421 and an upper interlevel insulating film 422 deposited on the lower interlevel insulating film 421.

The configuration shown in FIG. 26 is different from the configuration in FIG. 23 in that the pixel electrode 441 has a double layer structure consisting of an ITO sputtering film 446 (conductive sputtering film) formed on the upper interlevel insulating film 422 by a sputtering process, and an ITO coating film 447 (conductive transparent coating film) formed on the ITO sputtering film 446.

The ITO coating film 447 is therefore electrically connected to the drain region 416 through the ITO sputtering film 446 lying thereunder. Because the ITO sputtering film 446 and the ITO coating film 447 are simultaneously pattern-formed as described below, these have a common forming region.

Because other portions are the same as those in FIG. 23, the same identification numbers are used without detailed description.

The planar layout of the configuration of the Fourth Embodiment is the same as that of the Third Embodiment, shown in FIG. 22, and thus data lines Sn, Sn+1 . . . and scanning lines Gm, Gm+1 . . . function as a black matrix. As a result, high quality display can be achieved without increasing steps.

In the Third Embodiment, the ITO coating film 447 in contact with the drain region 416 tends to have a higher contact resistance compared to the ITO sputtering film. In the Fourth Embodiment, the ITO coating film 447 is electrically connected to the drain region 416 through the ITO sputtering film 446, and such a configuration does not cause a high contact resistance.

A method for making such an active matrix substrate 401 will now be described with reference to FIGS. 27(A) to 27(E) and FIGS. 28(A) to 28(E). Because the FIGS. 27(A) to 27(E) are the same as FIGS. 20(A) to 20(D) and FIG. 24(A) for the steps of the Third Embodiment, respectively, the description is omitted. Also, the FIGS. 28(B) and 28(C) are the same as FIGS. 24(B) and 24(C), respectively, for the steps of the Third Embodiment.

FIG. 28(A) shows a resist pattern-forming step before the step in FIG. 28(B). In order to form the source electrode 431 (data line) shown in FIG. 28(B), an aluminum film 460 is formed by a sputtering process in FIG. 28(A). A patterned resist mask 461 is formed on the aluminum film 460. The source electrode 431 (data line), as shown in FIG. 28(B), are formed by etching the aluminum film 460 using the resist film 461.

Next, as shown in FIG. 28(C), the upper interlevel insulating film 422 composed of a silicon oxide film is deposited on the lower interlevel insulating film 421 by a CVD or PVD process. After ion implantation and forming the interlevel insulating films, the substrate is annealed in a given thermal environment at 350° C. or less for several tens of minutes to several hours to activate the implanted ions and to bake the interlevel insulating film 420 (the lower interlevel insulating film 421 and the upper interlevel insulating film 422). A contact hole 422A is formed at positions, corresponding to the drain region 416, in the lower interlevel insulating film 421 and the upper interlevel insulating film 422.

Next, as shown in FIG. 28(D), an ITO sputtering film 446 (conductive sputtering film) is formed on the entire interlevel insulating film 420 composed of the lower interlevel insulating film 421 and the upper interlevel insulating film 422 by a sputtering process.

Next, as shown in FIG. 28(E), an ITO coating film 447 (conductive transparent coating film) is formed on the ITO sputtering film 446.

The ITO coating film 447 can be formed under the same process conditions as in the First to Third Embodiments. The liquid or paste coating film applied on the top face in the Fourth Embodiment is annealed in an annealing chamber after the solvent is removed by drying. The coating film is annealed or fired at a temperature of 250° C. to 500° C. and preferably 250° C. to 400° C. for 30 minutes to 60 minutes in air or an oxygen-containing or nonreducing atmosphere, and then annealed at a temperature of 200° C. or more and preferably 200° C. to 350° C. for 30 minutes to 60 minutes in a hydrogen-containing atmosphere. The temperature of the second annealing step is set to be lower than that of the first annealing step to prevent thermal degradation of the coating film stabilized in the first annealing step. By such annealing steps, organic components are removed, and the coating film is converted to a mixed film (ITO coating film 447) of indium oxide and tin oxide. As a result, the ITO coating film 447 with a thickness of approximately 500 angstroms to 2,000 angstroms has a sheet resistance of $10^2$ $\Omega/\square$ to $10^4$ $\Omega/\square$ per sheet and a light transmittance of 90% or more, and this and the ITO sputtering film 446 can form a pixel electrode 441 exhibiting satisfactory characteristics.

Next, the insulating substrate 410 is maintained in the nonreductive atmosphere used in the second annealing step or a nonoxidative atmosphere such as a gaseous nitrogen atmosphere until the substrate temperature decreases to 200° C. or less, and taken out to open air from the annealing chamber when the substrate temperature reaches 200° C. or less. When the insulating substrate 410 is exposed to open air after the temperature reached 200° C. or less, the coating film having a decreased resistance by the thermal reduction during the second annealing step is prevented from reoxidation and thus the ITO coating film 447 has a low sheet resistance. It is more preferable that the temperature when the insulating substrate 410 is taken out from the annealing chamber to open air be 100° C. or less in order to prevent reoxidation of the ITO coating film 447. Because the specific resistance of the ITO coating film 447 decreases as oxygen defects in the film increase, reoxidation of the ITO coating film 447 due to oxygen in air increases the specific resistance.

After forming the ITO sputtering film 446 and the ITO coating film 447 in such a manner, a resist film 462 is formed, and these films are collectively patterned with an etching solution, such as aqua regia or a HBr solution, or by dry etching using $CH_4$ or the like, to form the pixel electrode 441 as shown in FIG. 26. A TFT is thereby formed in each pixel electrode 402. When driving the TFT in response to a control signal supplied through the scanning line Gm, image information is input into the liquid crystal encapsulated between the pixel electrode 441 and the counter electrode (not shown in the drawing) from the data line Sn through the TFT to display a given image.

In this embodiment, the ITO coating film 447 is used to form the pixel electrode 441. Because the film deposition by coating exhibits excellent characteristics for covering the steps, a liquid or paste coating material to form the ITO coating film 447 can satisfactorily compensate unevenness on the surface of the ITO sputtering film 446 caused by the contact hole 422. Further, the coating material is coated such that the ITO coating film 447 has a large thickness at an indented portion and a small thickness at a protruded portion. Unevenness due to the data line 431 does not therefore replicate the surface of the pixel electrode 441. The same relationship holds in the upper layer of the gate electrode (scanning line) 415. Accordingly, a pixel electrode 441 having a flat surface without steps can be formed, resulting in stable rubbing and prevention of the occurrence of reverse-tilt domains. The present invention therefore improves image quality.

Figure 39A:
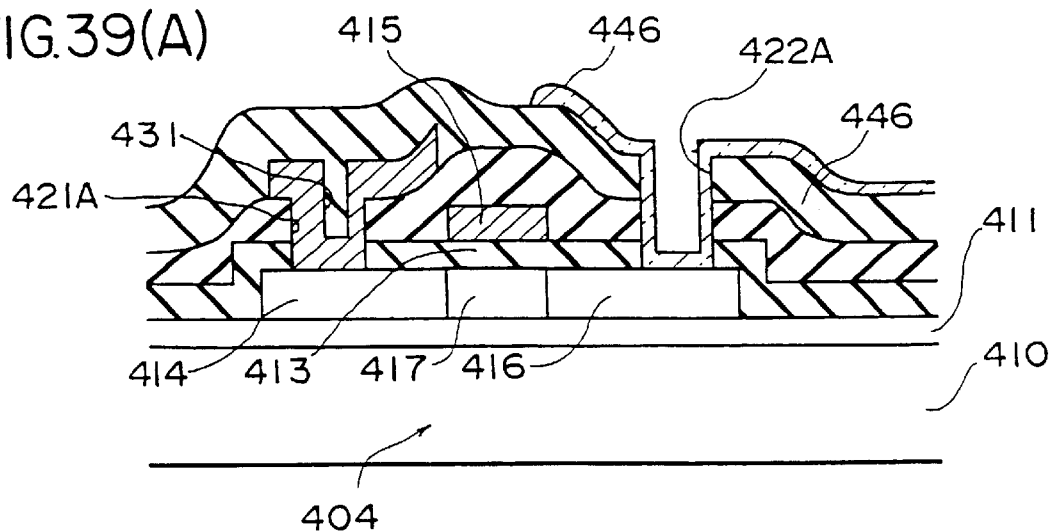
FIGS. 39(A) and 39(B) are enlarged longitudinal cross-sectional views near contact holes of a comparative example and an example in accordance with the present invention, respectively.
Figure 39B:
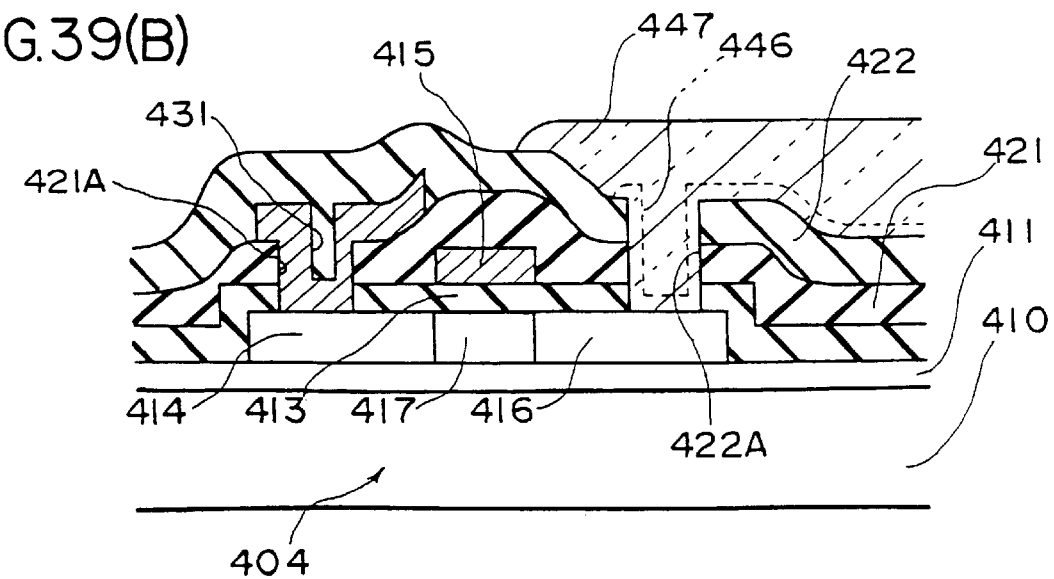

In contrast, when forming the pixel electrode by only an ITO sputtering film 446 as shown in FIG. 39A, the ITO sputtering film 446 is replicated by the steps on the surface on which the ITO sputtering film 446 is formed. The steps formed on the surface of the ITO sputtering film 446 cause unstable rubbing and the occurrence of reverse-tilt domains, and thus deteriorate display quality. Further, it is difficult to form the ITO sputtering film 446 so as to fill the entire contact hole 422A, hence an opening is inevitably formed. Such an opening also causes unstable rubbing and the occurrence of reverse-tilt domains. The formation of the ITO coating film 447 therefore is useful.

As shown in the Fourth Embodiment, when the interlevel insulating film 420 has a double layer structure for the purpose of forming the pixel electrode 441 and the source electrode 431 on different interlayers, the aspect ratio of the contact hole 422A increases; however, the ITO coating film 447 can form a flat pixel electrode 441 regardless of this.

The ITO sputtering film 446 has a trend of poor adhesion to a resist mask compared to the ITO coating film 447; however, the resist mask 462 is formed on the ITO coating film 447 in this embodiment, and accuracy of patterning is not deteriorated. A pixel electrode 441 having a high definition pattern can therefore be formed.

Fifth Embodiment

Figure 29:
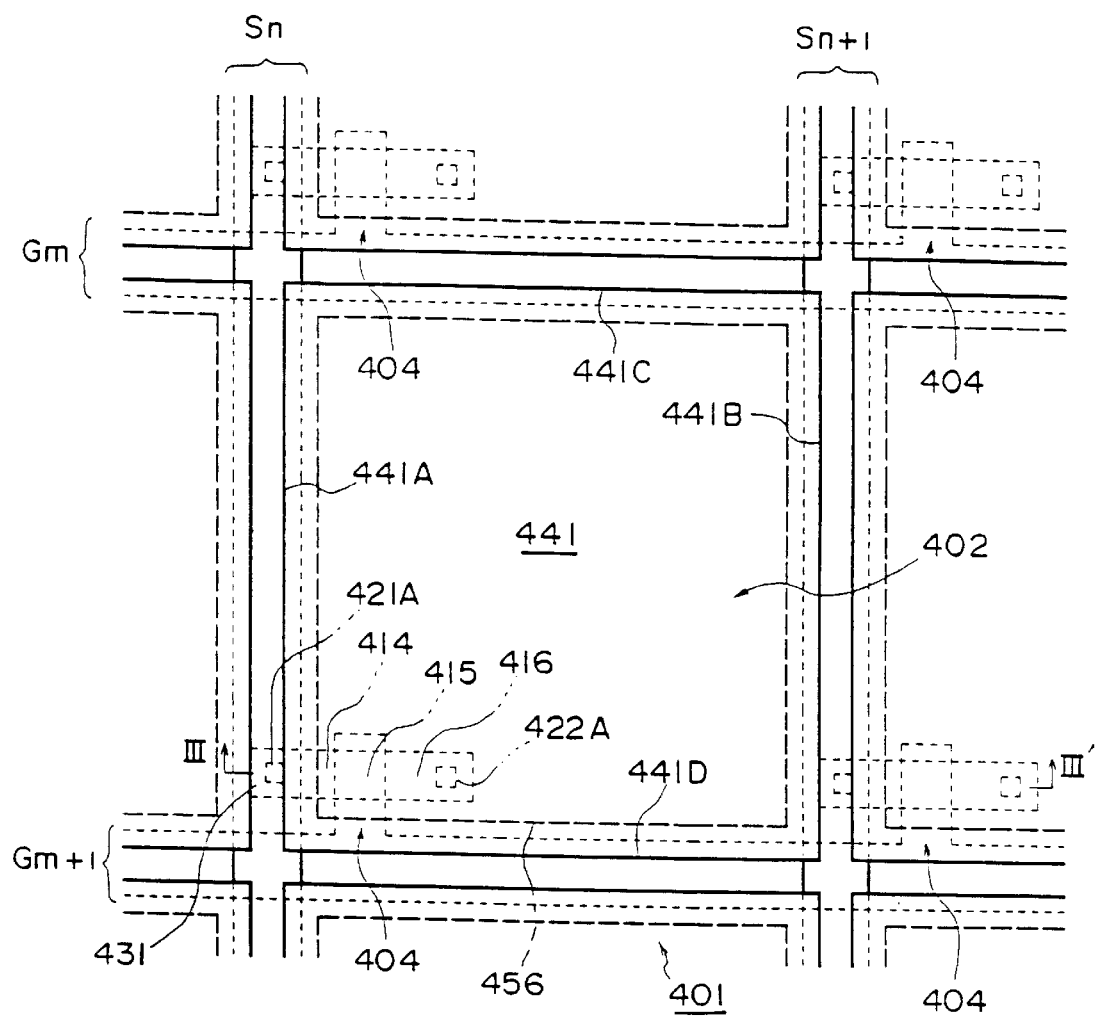
FIG. 29 is an enlarged plan view of a portion of a pixel region independently formed on an active matrix substrate for a liquid crystal display device in accordance with a fifth embodiment of the present invention.
Figure 30:
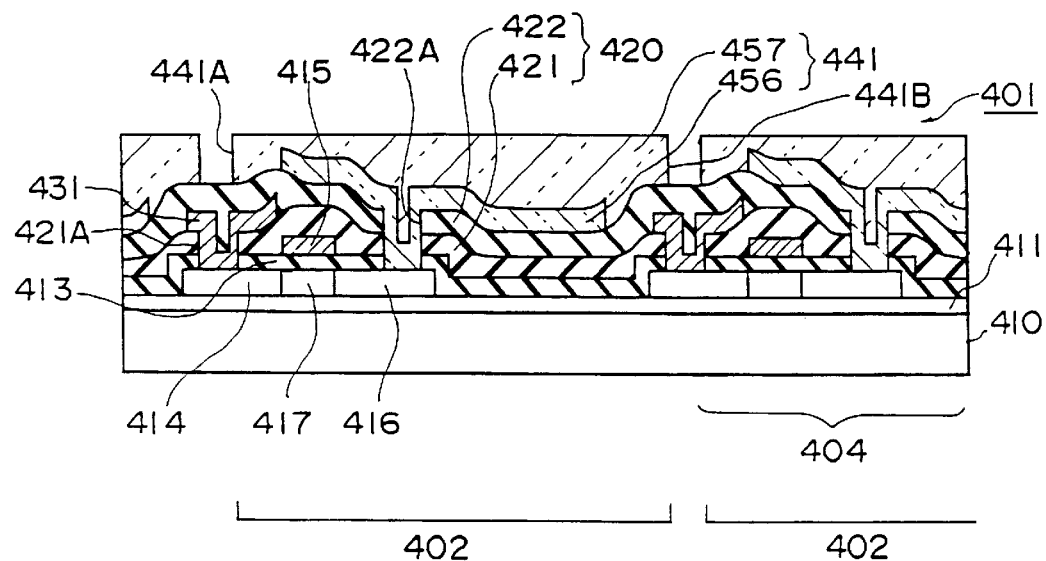
FIG. 30 is a cross-sectional view taken along section III-III' of FIG. 29.

FIG. 29 is an enlarged plan view of a part of a pixel region formed on an active matrix substrate for a liquid crystal display in accordance with the present invention, and FIG. 30 is a cross-sectional view taken along section III-III' of FIG. 29. In the Fifth Embodiment, parts having the same function as in the Fourth Embodiment are referred to with the same identification numbers, and a detailed description thereof with reference to drawings is omitted. In FIG. 29, the active matrix substrate 401 for a liquid crystal display in accordance with the Fifth Embodiment is also provided with a plurality of pixel electrode regions 402 formed by data line Sn, and scanning line Gm on an insulating substrate 410, and a TFT is formed on each of the pixel electrode regions 402.

The planar layout in the Fifth Embodiment other than the ITO sputtering film is identical to the configuration shown in FIG. 22 for illustrating the Third and Fourth Embodiments, hence data lines Sn, Sn+1 . . . and scanning lines Gm, Gm+1 . . . function as a black matrix. High quality image display therefore can be achieved without additional steps.

Because in the Fifth Embodiment an ITO sputtering film 456 and an ITO coating film 457 are separately patterned as described below in contrast to the Fourth Embodiment, their regional areas are different from each other. That is, the regional area of the ITO coating film 457 is larger than the regional area of the ITO sputtering film 456.

When forming the ITO coating film and the ITO sputtering film on a common region as in the Fourth Embodiment, these two ITO films can be simultaneously patterned. The resist mask is formed only on the ITO coating film having excellent adhesiveness to the resist mask, and is not formed on the ITO sputtering film having poor adhesiveness to the resist mask. High definition patterning can therefore be achieved.

In contrast, in the Fifth Embodiment, a resist mask must be formed also on the surface of the ITO sputtering film. When the regional area of the ITO coating film is larger than the regional area of the ITO sputtering film, the accuracy of patterning of the ITO coating film having excellent adhesiveness to the resist mask determine a final pattern. Hence high definition patterning can be achieved even if the ITO sputtering film has poor adhesiveness to the resist mask.

Figure 31A:
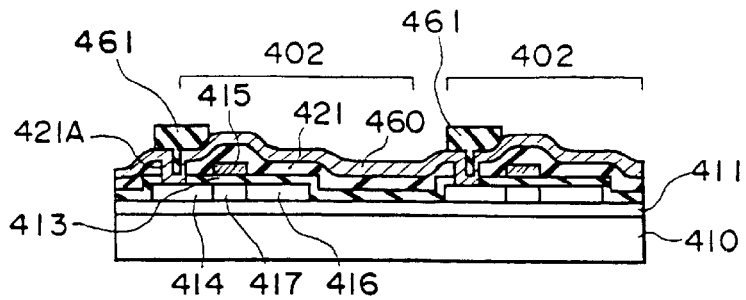
FIGS. 31(A) to 31(F) are cross-sectional views illustrating the steps performed after the steps shown in FIG. 27 in the production of the active matrix substrate shown in FIG. 29.
Figure 31B:
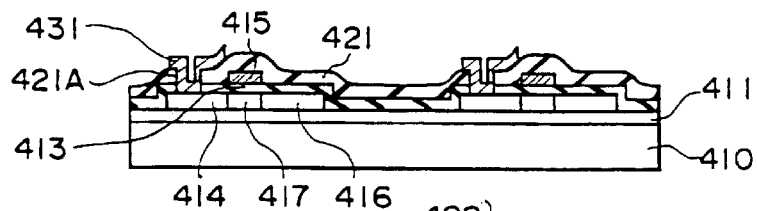
Figure 31C:
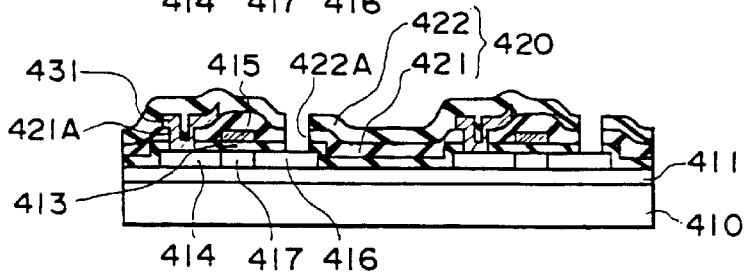

The steps shown in FIGS. 31(A) to 31(C) for a manufacturing method of such an active matrix substrate is similar to FIGS. 27(A) to 27(E) for the Fourth Embodiment. Thus, only the steps shown in FIGS. 31(D) to 31(F) will now be described.

In FIG. 31(C), an upper interlevel insulating film 422 composed of a silicon oxide film is formed on a lower interlevel insulating film 421, and then a contact hole 422A is formed.

Figure 31D:
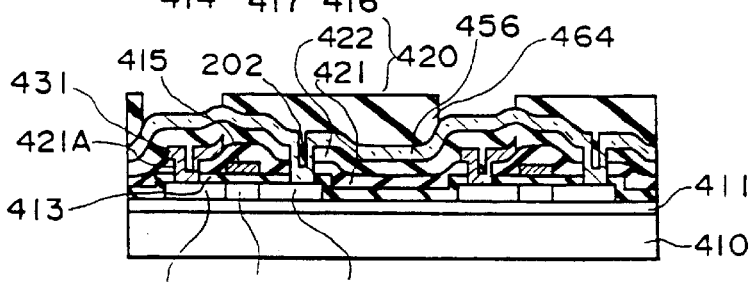
Figure 31E:
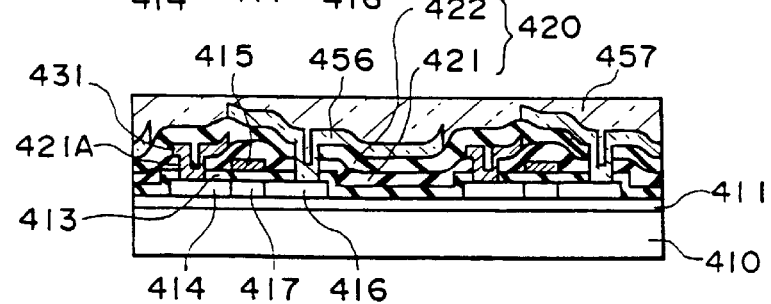

Next, as shown in FIG. 31(D), an ITO film 456 (conductive sputtering film) is formed by a sputtering process on the entire surface of the interlevel insulating film 420 composed of the lower interlevel insulating film 421 and the upper interlevel insulating film 422. These steps is also identical to the Fourth Embodiment.

In the Fifth Embodiment, however, only the ITO sputtering film 456 is patterned with an etching solution, such as aqua regia or a HBr solution, or by dry etching using $CH_4$ or the like. After forming the ITO sputtering film 456, a resist mask 464 is formed as shown FIG. 31(D) and is patterned. The ITO sputtering film 456 is etched using the resist mask 464 such that the ITO sputtering film 456 remains in a region which is narrower than the region of a pixel electrode 441 to be formed. An ITO coating film (conductive transparent coating film) is formed on the top face of the ITO sputtering film 456. The coating materials described in the above-mentioned Embodiments can be used for forming the ITO coating film 457.

Figure 31F:
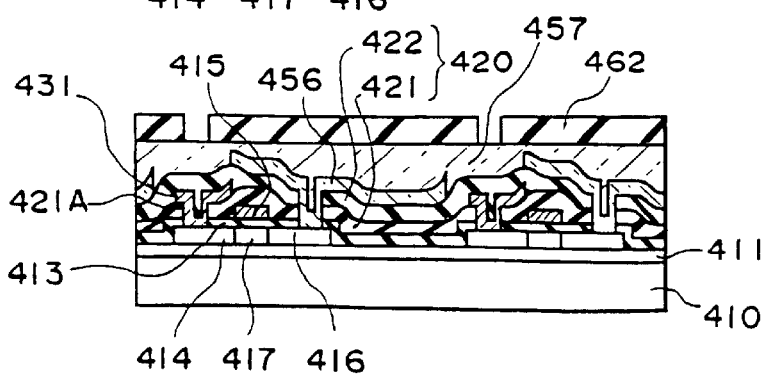

After forming the ITO coating film 457 in such a manner, a resist mask 462 is formed as shown in FIG. 31(F) and is patterned with an etching solution, such as aqua regia or a HBr solution, or by dry etching using $CH_4$ or the like to form a pixel electrode 441 as shown in FIG. 30.

The configuration in the Fifth Embodiment has similar advantages to that in the Fourth Embodiment. In particular, although the ITO coating film 457 in contact with a drain region has a higher contact resistance than the ITO sputtering film, the ITO coating film 457 in the Fifth Embodiment is electrically connected to the drain region 416 through the ITO sputtering film 456 to cancel such a high contact resistance. Because the ITO sputtering film can be thin, it can be etched within a short time without preventing patterning, regardless of poor adhesiveness to the resist mask 464. Because the ITO coating film 457 having high accuracy for patterning determines final accuracy of the pixel electrode 40 for patterning, high accuracy patterning can be achieved.

Sixth Embodiment

Figure 32:
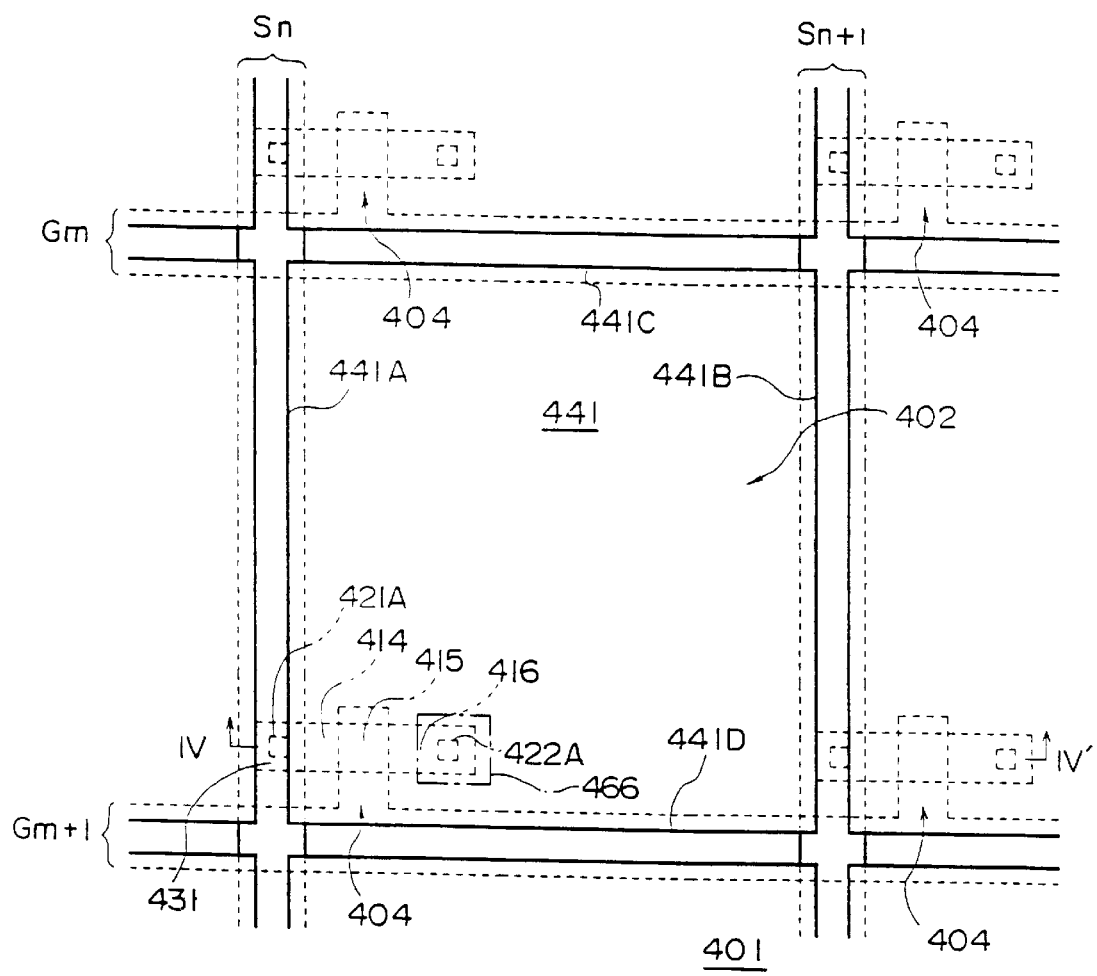
FIG. 32 is an enlarged plan view of a portion of a pixel region independently formed on an active matrix substrate for a liquid crystal display device in accordance with a sixth embodiment of the present invention.

FIG. 32 is an enlarged plan view of a part of a pixel region formed on an active matrix substrate for a liquid crystal display in accordance with the present invention, and FIG. 33 is a cross-sectional view taken along section IV-IV' of FIG. 30.

The arrangement in the Sixth Embodiment is characterized in that a pixel electrode 441 is composed of an ITO coating film (conductive transparent coating film) 468 formed by coating on an upper interlevel insulating film 422, and the ITO coating film 468 is electrically connected to a repeater electrode 466 composed of an aluminum film formed on a lower interlevel insulating film 421 by a sputtering process through a contact hole 422A in the upper interlevel insulating film 422. The repeater electrode 466 is electrically connected to a drain region 416 through a contact hole 421B in the lower interlevel insulating film 421. As a result, the pixel electrode 441 is electrically connected to the drain electrode 416 through the repeater electrode 466 lying thereunder.

Because the repeater electrode 466 composed of an aluminum film does not have light transmitting characteristics, the region for forming it is limited to the interior and periphery of the contact hole 421 so as not to decrease the aperture ratio.

The steps shown in FIGS. 27(A) to 27(E) for the Fourth Embodiment can be employed for the manufacturing method of such an active matrix substrate 401. The succeeding steps after the step in FIG. 27(E) will now be described with reference to FIGS. 34(A) to 34(D).

Figure 34A:
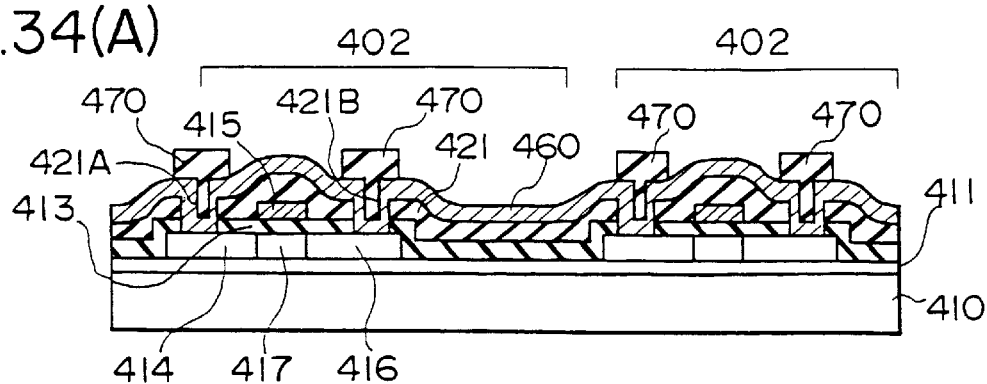
FIGS. 34(A) to 34(D) are cross-sectional views illustrating the steps performed after the steps shown in FIG. 27 in the production of the active matrix substrate shown in FIG. 32.
Figure 34B:
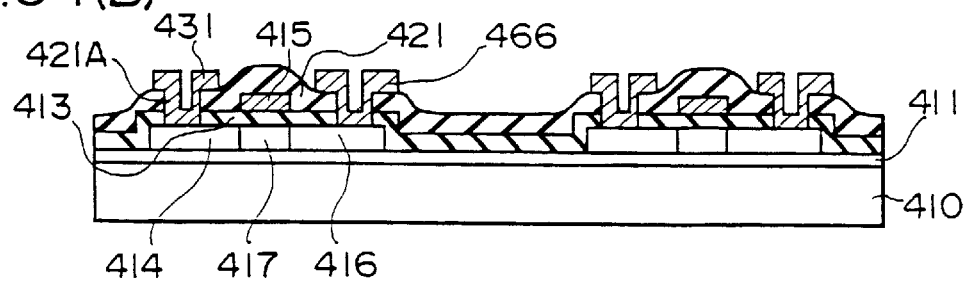

As shown FIG. 34(A), after contact holes 421A and 421B are formed at positions corresponding to a source region 414 and a drain region 416, respectively, in the lower interlevel insulating film 421, an aluminum film 460 (conductive sputtering film or metal film) is formed by sputtering to form a source electrode 431 and data lines. Next, a resist mask 470 is formed and the aluminum film 460 is patterned using the resist mask 470. As a result, as shown in FIG. 34(B), the source electrode 431, the data lines and the repeater electrode 466 are simultaneously formed.

Figure 34C:
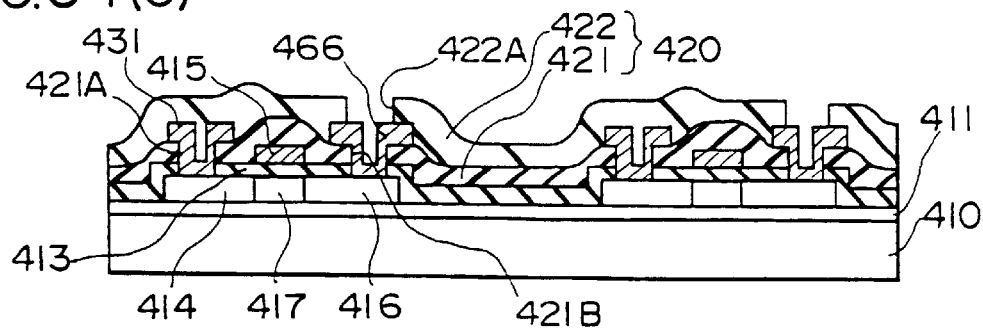

Next, as shown in FIG. 34(C), an upper interlevel insulating film 422 of a silicon oxide film is formed on the surface of the lower interlevel insulating film 421 by a CVD or PVD process. A contact hole 422A is formed at a position corresponding to the repeater electrode 466 (a position corresponding to the drain region 416) in the upper interlevel insulating film 422.

Figure 34D:
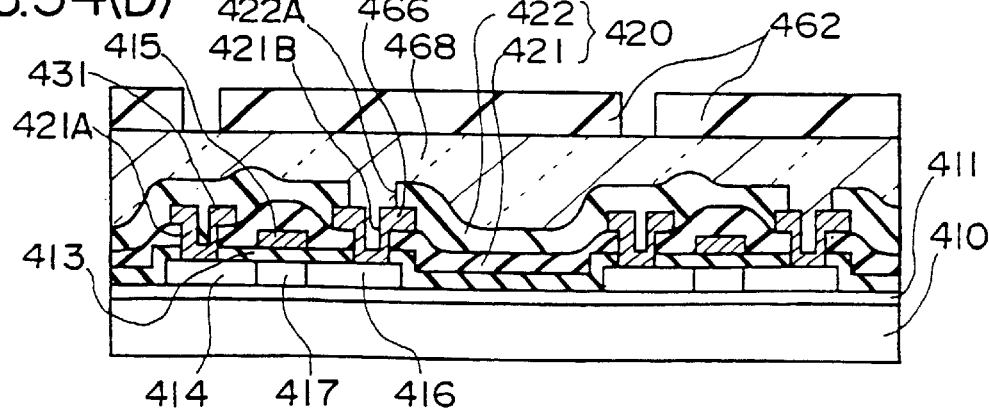

Next, as shown in FIG. 34(D), an ITO coating film 468 (conductive transparent coating film) is formed on the entire interlevel insulating film 420 consisting of the lower interlevel insulating film 421 and the upper interlevel insulating film 422.

The coating material described in the above-mentioned embodiments can be used for forming the ITO coating film 468.

After forming the ITO film 468 in such a manner, a resist mask 462 is formed and patterned to form a pixel electrode 441 as shown in FIG. 33.

As shown in FIG. 32, data lines Sn, Sn+1 . . . and scanning lines Gm, Gm+1 . . . function as a black matrix. Further, the aperture ratio of the pixel region 402 can be increased and a pixel electrode 441 having a flat surface without steps can be formed. Hence rubbing is stabilized and the occurrence of reverse-tilt domains can be prevented.

Although the pixel electrode 441 composed of the ITO coating film 468 has a higher contact resistance with the drain region 416 (silicon film) than the ITO sputtering film, the ITO coating film 468 in the Sixth Embodiment is electrically connected to the drain region 416 through the repeater electrode 466 composed of the aluminum film formed by sputtering to counter such a high contact resistance.

Although aluminum is used for the repeater electrode 466 in this embodiment, use of a dual layer film composed of aluminum and a high melting point metal can further decrease the contact resistance with the ITO coating film 468. The high melting point metal, such as tungsten or molybdenum, is difficult to oxidize as compared to aluminum, and even if it comes into contact with the ITO coating film 468 containing a large amount of oxygen, no oxidation occurs. The contact resistance between the repeater electrode 466 and the ITO coating film 468 can therefore be reduced.

Seventh Embodiment

Figure 35:
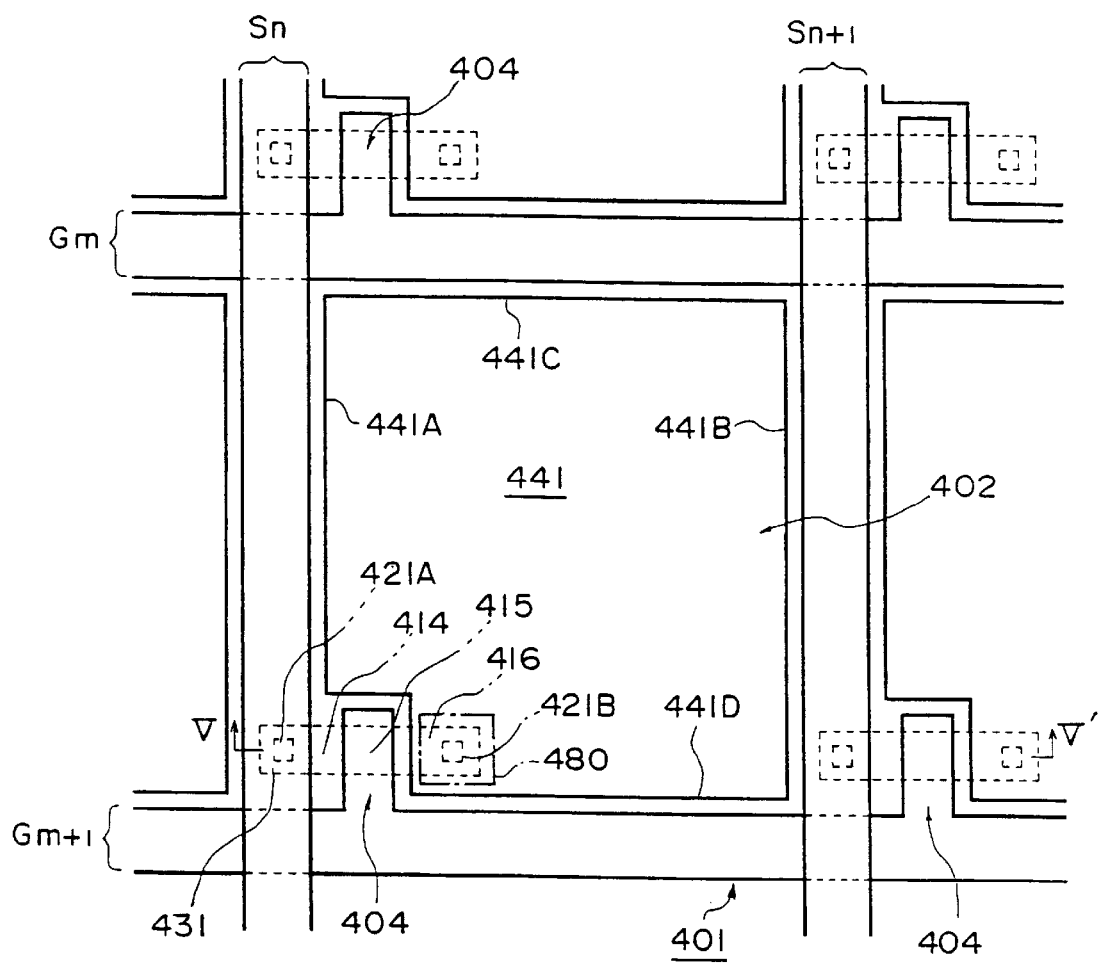
FIG. 35 is an enlarged plan view of a portion of a pixel region independently formed on an active matrix substrate for a liquid crystal display device in accordance with a seventh embodiment of the present invention.
Figure 36:
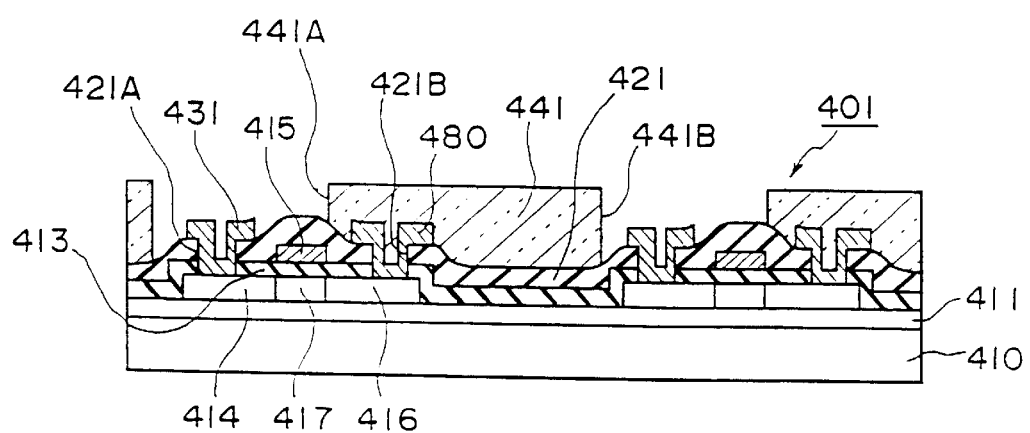
FIG. 36 is a cross-sectional view taken along section V-V' of FIG. 35.

FIG. 35 is an enlarged plan view of a part of a pixel region formed on an active matrix substrate for a liquid crystal display in accordance with the present invention, and FIG. 36 is a cross-sectional view taken along section V-V' of FIG. 35.

The Seventh Embodiment includes a modified configuration of Second Embodiment shown in FIG. 18 and FIG. 19, in which a repeater electrode 480 achieves electrical connection between an ITO coating film 441 and a drain region 416.

In FIG. 35, an active matrix substrate 401 in accordance with the Seventh Embodiment is also provided with a plurality of pixel regions 402 formed by data lines Sn and scanning lines Gm on an insulating substrate 410, and each of the pixel regions 402 is provided with a TFT (a nonlinear element for pixel switching). If only planarization of the pixel electrode and reduction of the contact resistance are intended, the following configuration is available.

As shown in FIG. 36, in the Seventh Embodiment, an interlevel insulating film 421 is composed of one silicon oxide layer.

The pixel electrode 441 composed of the ITO coating film is formed on the top face of the repeater electrode 480 composed of an aluminum film (conductive sputtering film or metal film) which is formed on the interlevel insulating film 421 by a sputtering process. The pixel electrode 441 is therefore electrically connected to the drain region 416 through the repeater electrode 480. Because the repeater electrode 480 composed of an aluminum film does not have light transmitting characteristics, the region for forming it is limited to the interior and periphery of the contact hole 421B.

Because the pixel electrode 441 and the source electrode 431 are formed between two common layers in the Seventh Embodiment, such that these two electrodes are not short-circuited (refer to FIG. 35 and FIG. 36).

Such an active matrix substrate 401 is manufactured according to the steps shown in FIGS. 27(A) to 27(B) for the Fourth Embodiment. The succeeding steps after FIG. 27(E) will now be described with reference to FIGS. 37(A) to 37(C).

Figure 37A:
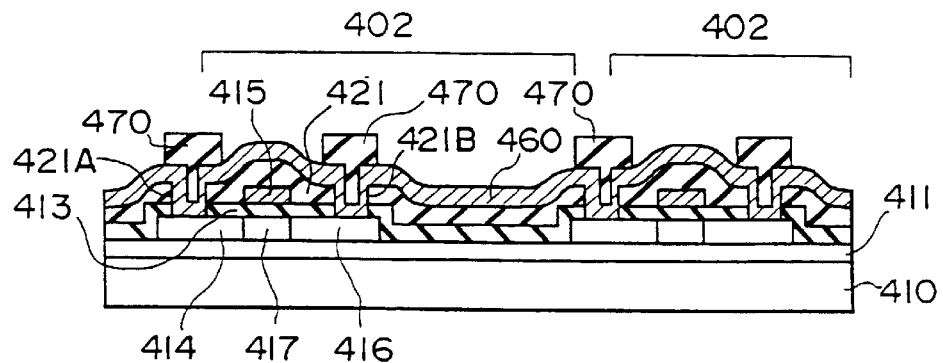
FIGS. 37(A) to 37(C) are cross-sectional views illustrating the steps performed after the steps shown in FIG. 27 in the production of the active matrix substrate shown in FIG. 35.
Figure 37B:
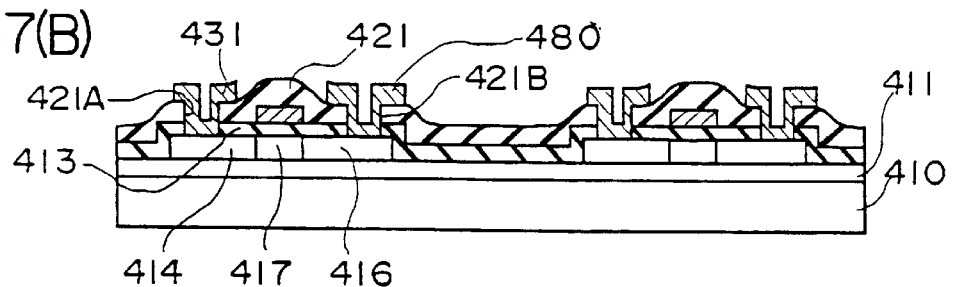

As shown in FIG. 37(A), contact holes 421A and 421B are formed at positions corresponding to a source region 414 and a drain region 416, respectively, in the interlevel insulating film 421. After forming by sputtering an aluminum film 460 for forming the source electrode 431 and data lines, a resist mask 470 is formed. Next, the aluminum film 460 is patterned using the resist mask 470 to form the source electrode 431, the data lines and the repeater electrode 480 as shown in FIG. 37(B).

Figure 37C:
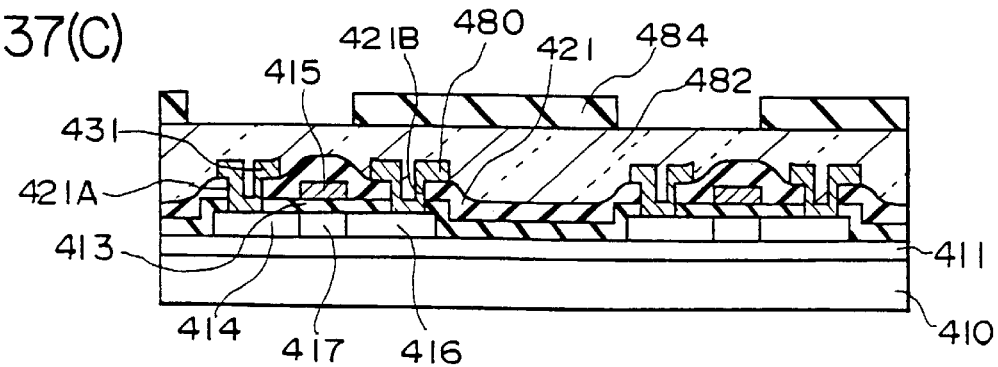

Next, as shown in FIG. 37(C), an ITO coating film 482 (conductive transparent electrode) is formed on the entire top face of the interlevel insulating film 421. The coating films used in the above-mentioned embodiments can be used for forming the ITO coating film 482.

After forming the ITO coating film 482 in such a manner, a resist mask 484 is formed and the ITO coating film 482 is patterned using the resist mask 484 to form a pixel electrode 441 as shown in FIG. 36.

Accordingly, a pixel electrode 441 having a flat surface without steps can be formed, resulting in stable rubbing and prevention of the occurrence of a reverse-tilt domain. Further, an increase in the contact resistance between the pixel electrode composed of the ITO coating film formed by a coating process and the drain region 416 can be prevented.

The present invention is not limited the above-described embodiments and can include various modifications within the scope of the present invention.

For instance, in the Sixth and Seventh Embodiments, the repeater electrodes 466 and 480, the source electrode 431 and the data lines are simultaneously formed of the common metal film (aluminum film). Instead, when the interlevel insulating film 420 includes a lower interlevel insulating film 421 and an upper interlevel insulating film 422, both the pixel electrode 441 composed of the ITO film by a coating process and the repeater electrode 486 composed of a conductive sputtering film may be formed on the upper insulating film 422. Such a configuration can extend the region forming the pixel electrode 441, differing from the Sixth Embodiment, and thus data lines and scanning lines function as a black matrix. Because the repeating electrode 486 (conductive sputtering film) and the source electrode 431 are formed by different steps, the material for the repeating electrode 486 may be the same as or different from the material for the source electrode 431.

In both the Sixth and Seventh Embodiments, although planar-type TFTs are described in which the contact holes in the interlevel insulating films greatly affect the surface shapes of the pixel electrodes, the present invention can also be applied to a reverse stagger-type TFT. When the pixel electrode is forced to be formed on an uneven surface, the surface of the pixel electrode formed of a conductive transparent coating film by a coating process as in the present invention is not affected by such unevenness.

Figure 38A:
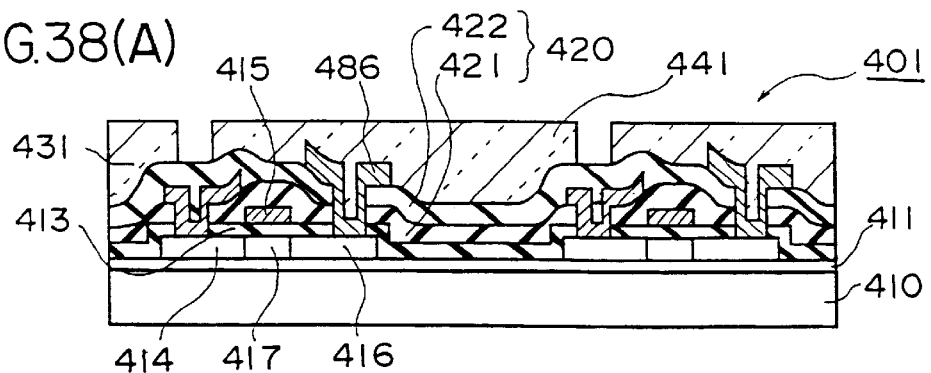
FIGS. 38(A) and 38(B) are schematic views of active matrix substrates for liquid crystal display devices in accordance with another embodiment.
Figure 38B:
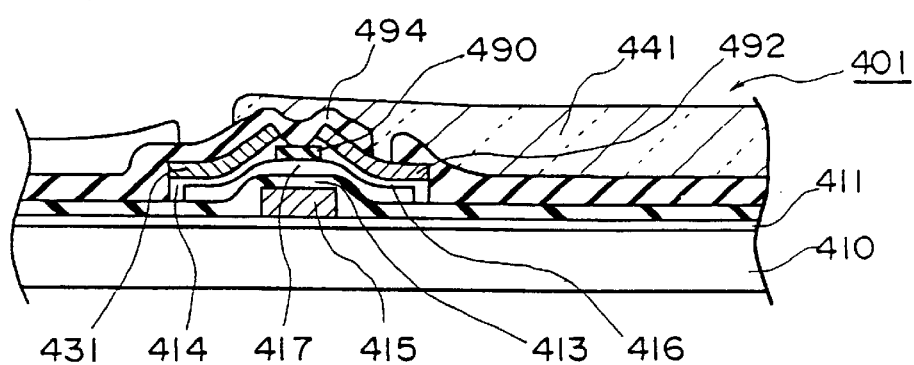

For example, an ITO coating film is used as the pixel electrode 441 in a reverse stagger-type TFT shown in FIG. 38(B) for the purpose of planarization of the surface of the pixel electrode 441. In the TFT shown in FIG. 38(B), a protective underlayer 411, a gate electrode 415, a gate insulating film 413, an intrinsic amorphous silicon film forming a channel region 417 and an insulating film 490 for protecting the channel are deposited in that order on an insulating substrate 410. Source and drain regions 414 and 416, respectively, composed of a high concentration n-type amorphous silicon film are formed on both sides of the insulating film 490 for protecting the channel, and a source electrode 431 and a repeater electrode 492 composed of a sputtering film such as chromium, aluminum or titanium are formed on the respective source and drain regions 414 and 416. Further, an interlevel insulating film 494 and a pixel electrode 441 are formed thereon. Because the pixel electrode 441 is composed of an ITO coating film, it has a flat surface. The pixel electrode 441 is electrically connected to the repeater electrode 486 through a contact hole in the interlevel insulating film 441. Because the pixel electrode 441 is electrically connected to the drain region 416 through the repeater electrode 486 composed of the sputtering film, the problem of high contact resistance between the pixel electrode 441 composed of the ITO coating film and the drain region 416 (silicon film) can be solved. Because the pixel electrode 441 and the source electrode 431 are arranged between different layers, these electrode does not short-circuit. As a result, the pixel electrode 441 can be formed in a wide range so as to cover the data lines and the scanning lines (not shown in the drawing). Hence the data lines and the scanning lines functions as a black matrix and the aperture ratio of the pixel region can be increased.

Although the ITO coating film for forming the pixel electrode is deposited with a liquid coating material by a spin coating process, the ITO coating film may be deposited using a paste coating material by a printing process. Further use of the paste coating material enables a screen printing process, in which the paste coating material is printed only on the region to form the pixel electrode followed by drying and annealing, and the resulting film can be used as the pixel electrode. Because this case does not require patterning of the ITO film, the production costs can be drastically reduced.

Although only the pixel electrode is formed of a coating film in the Second to Seventh Embodiments, any one of an insulating layer, a conductive layer and a semiconductive layer, as well as the pixel electrode, can be, of course, formed of a coating film, as described in the First Embodiment.

Eighth Embodiment

Figure 40:
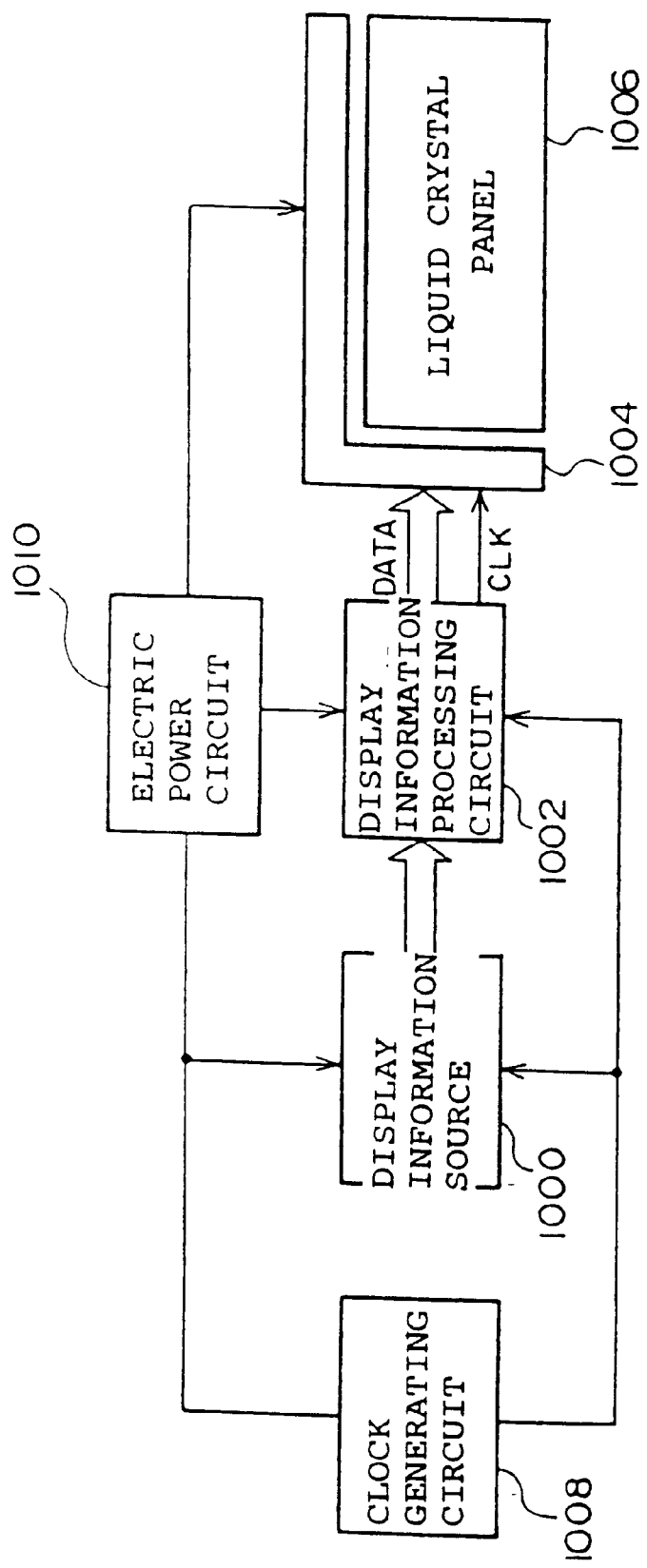
FIG. 40 is a block diagram of a liquid crystal display device included in an electronic device in accordance with an eighth embodiment of the present invention.

An electronic device formed of a liquid crystal display device in accordance with any of the above-mentioned embodiments includes, as shown in FIG. 40, a display information source 1000, a display information processing circuit 1002, a display driving circuit 1004, a display panel 1006 such as a liquid crystal panel, a clock generating circuit 1008 and an electric power circuit 1010. The display information source 1000 includes memories such as ROM and RAM, and a tuning circuit for tuning and outputting the television signals, and output display information such as video signals based on a clock from the clock generating circuit 1008. The display information processing circuit 1002 processes and output the display information based on the clock from the clock generating circuit. The display information processing circuit 1002 may include, for example, an amplification and polarity inversion circuit, a circuit with parallel data input, a rotation circuit, a gamma correction circuit and a clamping circuit. The display driving circuit 1004 includes a scanning line driving circuit and a data line driving circuit and drives to display the liquid crystal panel 1006. The electric power circuit 1010 supplies electric power to the above-mentioned circuits.

Figure 41:
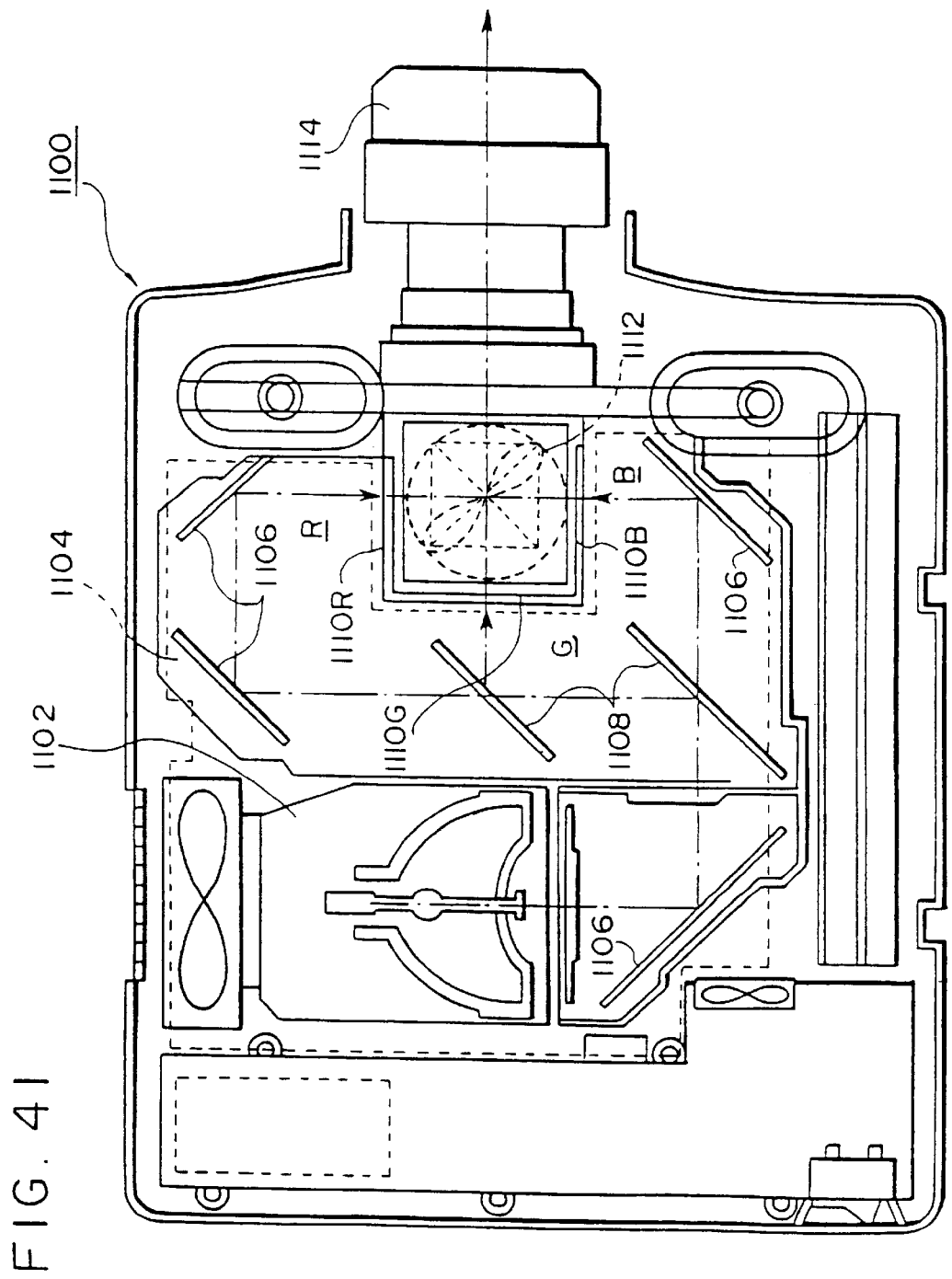
FIG. 41 is an outlined cross-sectional view of a projector as an example of the electronic device using the liquid crystal display device of FIG. 40.
Figure 42:
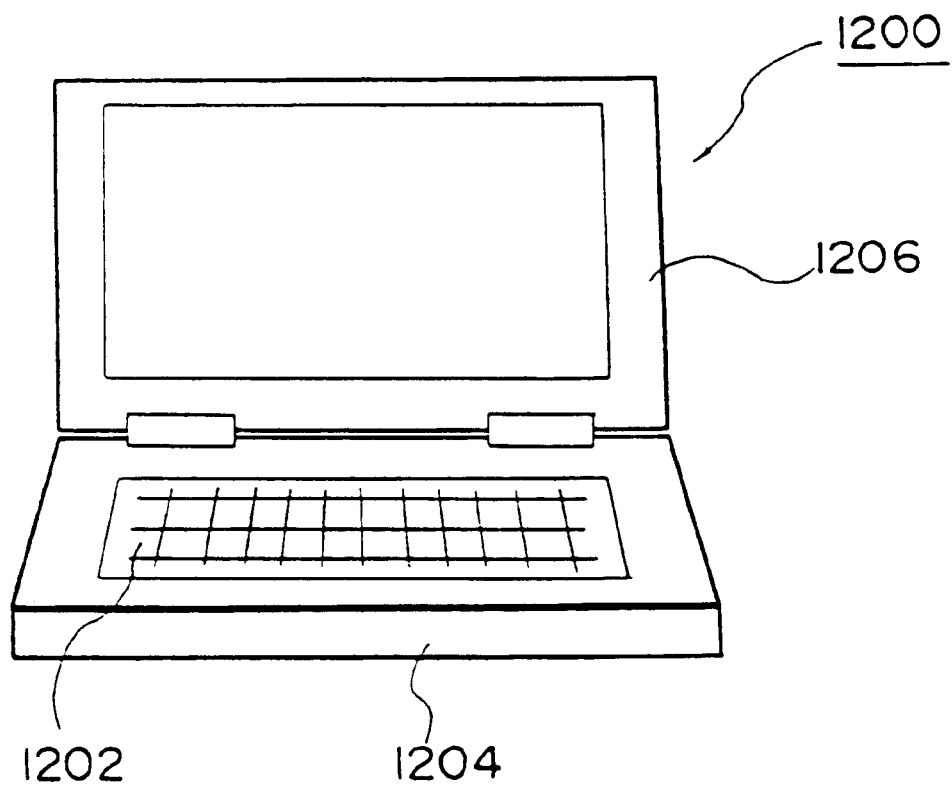
FIG. 42 is a schematic view of a personal computer as another example of the electronic device.
Figure 43:
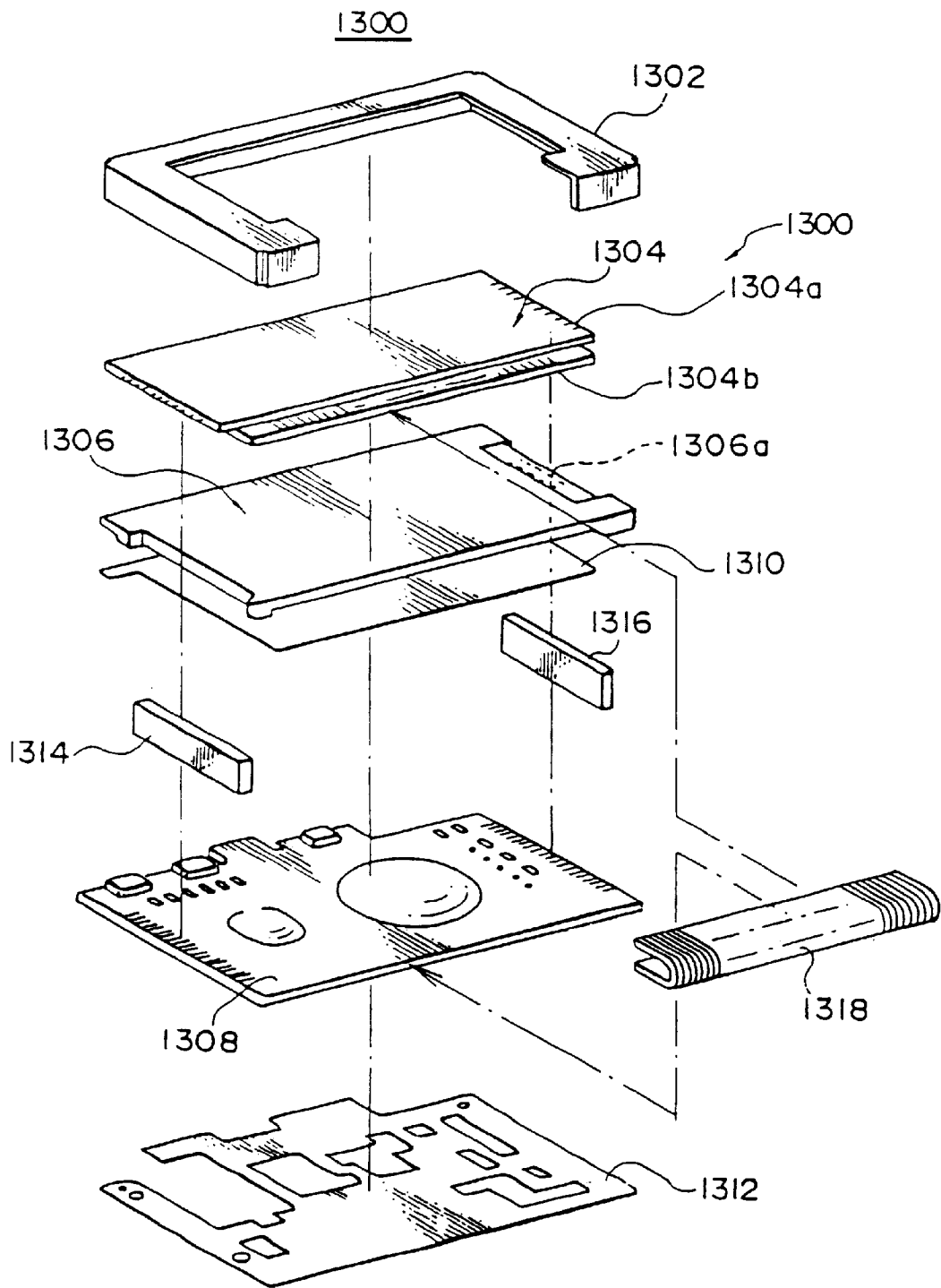
FIG. 43 is an assembly view of a pager as a further example of the electronic device.

Examples of electronic devices having such a configuration include liquid crystal projectors as shown in FIG. 41, personal computers (PCs) as shown in FIG. 42, and engineering work stations (EWSs) responding to multimedia pagers as shown in FIG. 43 and portable phones, word processors, televisions, view finder-type and monitor-type video taperecorders, electronic notebooks, electronic desktop calculators, car navigation systems, POS terminals, and apparatuses provided with touch panels.

The liquid crystal projector shown in FIG. 41 is a projection type-projector using a transparent liquid crystal panel as a light valve and includes, for example, a three-plate prism-type optical system.

In the projector 1100 shown in FIG. 41, projection light emerging from a lamp unit 1102 provided with a white light source is divided into three primary colors, R, G and B by a plurality of mirrors 1106 and two dichroic mirrors 1108 in a light guide 1104, and the three primary colors are introduced to three color liquid crystal panels 1110R, 1110G and 1110B for displaying their respective colors. The light beams modulated by the liquid crystal panels 1110R, 1110G and 1110B are incident on a dichroic prism 1112 from three directions. In the dichroic prism 1112, as the red R and blue B light beams are reflected by 90°, whereas the green G light beam travels straight, images of these colors are combined and, thus, a color image is projected on a screen or the like through a projection lens.

The personal computer 1200 shown in FIG. 42 includes a main body 1204 provided with a key board 1202 and a liquid crystal display screen 1206.

The pager 1300 shown in FIG. 43 includes a liquid crystal display board 1304, a light guide 1306 provided with a back light 1306a, a circuit board 1308, a first shield plate 1310 and a second shield plate 1312, two elastic conductors 1314 and 1316 and a film carrier tape 1318, which are provided in a metallic frame 1302. The two elastic conductors 1314 and 1316 and the film carrier tape 1318 are provided for connecting the liquid crystal display board 1304 to the circuit board 1308.

The liquid crystal display board 1304 is composed of a liquid crystal encapsulated between two transparent substrates 1304a and 1304b and forms at least a dot-matrix liquid crystal panel. One of the transparent substrates may be provided with a driving circuit 1004 shown in FIG. 40, and additionally, a display information processing circuit 1002. Circuits not mounted in the liquid crystal display board 1304 can be mounted in the circuit board 1308 shown in FIG. 43 as an external circuit of the liquid crystal display board.

Figure 44:
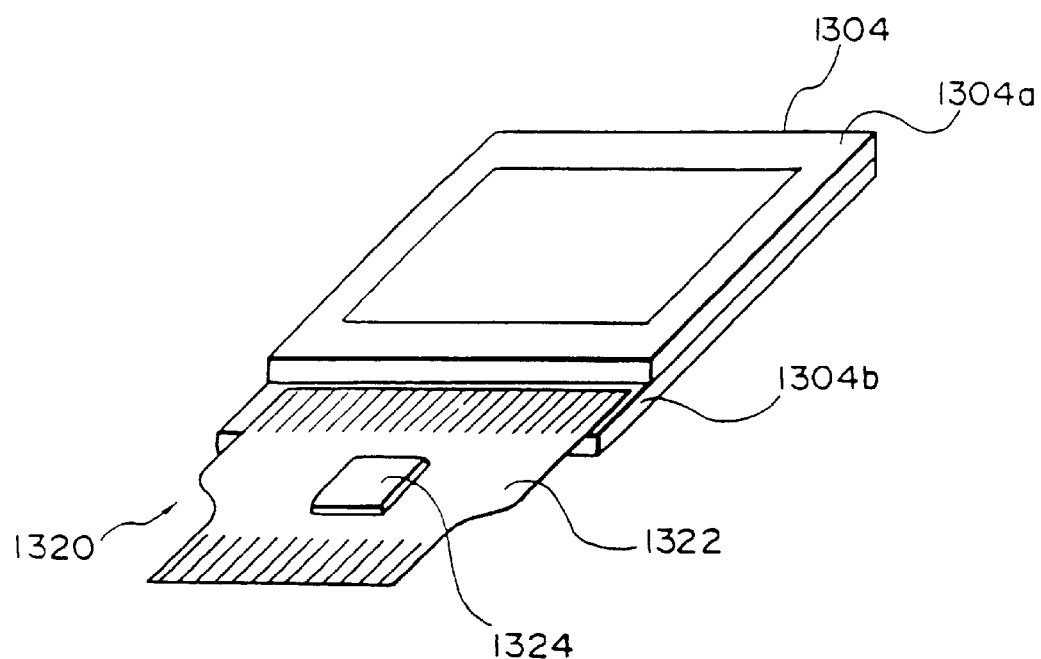
FIG. 44 is a schematic view of a liquid crystal display device provided with a TCP.

The pager configuration shown in FIG. 43 further requires a circuit board 1308, as well as the liquid crystal display board 1304, and when a liquid crystal display device is used as one unit in an electronic device and when a display driving circuit is mounted onto a transparent board, the minimum unit of the liquid crystal display device is the liquid crystal display board 1304. Alternatively, the liquid crystal display board 1304 fixed into the metallic frame 1302 can be used as a liquid crystal display device which is a part of an electronic device. Further a back-light-type liquid crystal display device can be formed by assembling the liquid crystal display board 1304, and a light guide 1306 provided with a back light 1306a into the metallic frame 1302. Instead, as shown in FIG. 44, a tape carrier package (TCP) 1320, in which an IC chip 1324 is packaged onto a polyimide tape 1322 provided with a metallic conductive film, may be connected to one of the two transparent substrates 1304a and 1304b of the liquid crystal display board 1304 to be used as a liquid crystal display device as a part of the electronic device.

We claim:

1. A thin film device having a thin film monolithic structure comprising a plurality of thin films including at least one insulating layer and at least one conductive layer,
   at least one of said thin films in said thin film monolithic structure is formed of a coating film (excluding a spin-on-glass film having a basic structure comprising siloxane bonds), which is obtained by applying a solution containing a constituent of said at least one thin film followed by annealing
wherein at least two of said thin films included in said thin film monolithic structure are formed of said coating film.

2. A thin film device according to claim 1, wherein said thin film monolithic structure comprises a semiconductor layer.

3. A thin film device according to claim 2, wherein said thin film monolithic structure comprises a thin film transistor comprising:
   a silicon semiconductor layer including a source region, a drain region and a channel region therebetween;
   a gate insulating layer; and
   a gate electrode.

4. A thin film device according to claim 3, wherein said thin film monolithic structure further comprises an insulating underlayer formed under said thin film transistor.

5. A thin film device according to claim 3, wherein said thin film monolithic structure further comprises:
   a source electrode connected to said source region;
   a drain electrode connected to said drain region; and at least one interlevel insulating film which insulates said gate electrode, said source electrode and said drain electrode.

6. A thin film device according to claim 3, wherein said thin film monolithic structure further comprises a protective insulating layer on said thin film transistor.

7. A thin film device according to claim 3, wherein all of said insulating layers included in said thin film monolithic structure are formed of said coating film.

8. A thin film device according to claim 4, wherein all of said insulating layers other than said gate insulating layer are formed of said coating film.

9. A thin film device according to claim 1, wherein said at least one insulating layer is formed of a $SiO_2$ coating film which is obtained by applying a solution containing a polymer having Si-N bonds and performing a first annealing process in an oxygen atmosphere.

10. A thin film device according to claim 9, wherein said at least one insulating layer is subjected to a second annealing process after said first annealing process at a temperature higher than a temperature used in said first annealing process, so that an interface is further cleaned compared to that after said first annealing process.

11. A thin film device according to claim 2, wherein said semiconductor layer comprises a silicon coating film which is obtained by applying a solution containing silicon particles and performing a first annealing process, the silicon coating film including an impurity.

12. A thin film device according to claim 11, wherein said semiconductor layer is subjected to a second annealing process after said first annealing process at a temperature higher than a temperature used in said first annealing process, so that the crystallinity of said semiconductor layer is improved compared to that after said first annealing process.

13. A thin film device according to claim 1, wherein said at least one conductive layer is formed of a conductive coating film obtained by applying a solution containing conductive particles and performing a first annealing process.

14. A thin film device according to claim 13, wherein said at least one conductive layer is subjected to a second annealing process after said first annealing process at a temperature higher than a temperature used in said first annealing process, so that a resistance of said conductive layer is reduced as compared to a resistance after said first annealing process.

15. A thin film device according to claim 13, wherein said conductive coating film is an ITO (indium tin oxide) coating film.

16. A thin film device according to claim 15, wherein a surface of said ITO coating film is metal-plated.

17. A thin film device according to claim 12, wherein said at least one conductive layer comprises a conductive sputtering film formed on a contact face of said conductive layer by a sputtering process.

18. A thin film device according to claim 1, wherein said thin film monolithic structure further comprises a plurality of pixel switching elements arranged at corresponding pixels formed near intersections of a plurality of data lines with a plurality of scanning lines, and pixel electrodes connected thereto.

19. A thin film device according to claim 18, wherein each of said pixel switching elements is a thin film transistor.

20. A thin film device according to claim 19, wherein said thin film transistor comprises:
   a source region electrically connected to one of said data lines;
   a gate electrode electrically connected to one of said scanning lines; and
   a drain region electrically connected to one of said pixel electrodes, wherein
   one of said pixel electrodes is formed of a conductive coating film.

21. A thin film device according to claim 20, wherein said at least one conductive layer is an ITO (indium tin oxide) coating film.

22. A thin film device according to claim 20, wherein said thin film transistor further comprises an interlevel insulating film formed on a top face of said gate electrode, and said one of said data lines and one of said pixel electrodes are electrically connected to said source region and said drain region, respectively, through respective contact holes formed in said interlevel insulating film.

23. A thin film device according to claim 22, wherein said interlevel insulating film comprises a lower interlevel insulating film lying at a lower side and an upper interlevel insulating film formed on said lower interlevel insulating film,
   each of said data lines is electrically connected to said source region through a first contact hole formed in said lower interlevel insulating film,
   each of said pixel electrodes is electrically connected to said drain region through a second contact hole formed in said lower interlevel insulating film and said upper interlevel insulating film, and
   the periphery of said one of said pixel electrodes lies above said data lines and said scanning lines.

24. A thin film device according to claim 22, wherein each of said pixel electrodes formed of said conductive coating film is electrically connected to said drain region through a conductive sputtering film.

25. A thin film device according to claim 24, wherein said conductive sputtering film is an ITO (indium tin oxide) sputtering film.

26. A thin film device according to claim 24, wherein said conductive coating film and said conductive sputtering film have a common pattern.

27. A thin film device according to claim 24, wherein a periphery of said conductive coating film lies outside a periphery of said conductive sputtering film.

28. A thin film device according to either claim 24, wherein said conductive sputtering film and said data lines lie in a common layer and are formed of a common metallic material.

29. A thin film device according to claim 24, wherein said conductive sputtering film lies above said data lines.

30. A thin film device according to claim 22, wherein said interlevel insulating film comprises a lower interlevel insulating film lying at a lower side and an upper interlevel insulating film formed on said lower interlevel insulating film, a conductive sputtering film formed on said upper interlevel insulating film, said conductive sputtering film and said data lines lying in a common layer,
   each of said data lines is electrically connected to said source region through a first contact hole formed in said lower interlevel insulating film,
   said conductive sputtering film is electrically connected to said drain region through a second contact hole formed in said upper interlevel insulating film and said lower interlevel insulating film, and
   said conductive coating film is deposited on said conductive sputtering film.

31. A thin film device according to claim 22, wherein said interlevel insulating film comprises a lower interlevel insulating film lying at a lower side and an upper interlevel insulating film formed on said lower interlevel insulating film, a conductive sputtering film formed on said lower interlevel insulating film, said conductive sputtering film and said data lines lying in a common layer, each of said data lines is electrically connected to said source region through a first contact hole formed in said lower interlevel insulating film, said conductive sputtering film is electrically connected to said drain region through a second contact hole formed in said lower interlevel insulating film, and said conductive coating film is deposited on said upper interlevel insulating film and electrically connected to said conductive sputtering film through a third contact hole formed in said upper interlevel insulating film.

32. A liquid crystal panel comprising:

an active matrix substrate including a thin film device according to claim 18;

a counter substrate facing said active matrix substrate, and a liquid crystal layer encapsulated between said active matrix substrate and said counter substrate.

33. An electronic device comprising the liquid crystal panel described in claim 32.

34. A method for making a thin film device having a thin film monolithic structure comprising a plurality of thin films including at least one insulating layer and at least one conductive layer, the method comprising:

manufacturing at least one of said thin films in said thin film monolithic structure by the steps comprising:

applying a coating solution containing a constituent of said at least one thin film onto a substrate; and forming a coating film (excluding a spin-on-glass film having a basic structure comprising siloxane bonds) by annealing the coated surface on said substrate, wherein said thin film monolithic structure further comprises a silicon semiconductor layer and said silicon semiconductor layer being manufactured by the steps comprising:

applying a coating solution containing silicon particles onto said substrate;

applying a first annealing process to the coated surface to form a silicon coating film; and implanting an impurity into said silicon coating film to form said silicon semiconductor layer.

35. A method for making a thin film device according to claim 34, wherein said at least one insulating layer is manufactured by the steps comprising:

applying a coating solution containing a polymer having Si-N bonds onto said substrate; and applying a first annealing process to the coated surface in an oxygen atmosphere to form a $SiO_2$ insulating coating film;

wherein said at least one insulating layer is formed of said insulating coating film.

36. A method for making a thin film device according to claim 35, further comprising applying a second annealing process to said substrate after said first annealing process at a temperature higher than a temperature used in said first annealing process, so that an interface of said at least one insulating layer is further cleaned compared to that after said first annealing process.

37. A method for making a thin film device according to claim 36, wherein said second annealing process is performed by laser annealing or lamp annealing.

38. A method for making a thin film device according to claim 35, wherein said silicon coating film is subjected to a second annealing process at a temperature higher than a temperature used in said first annealing process so as to improve the crystallinity in said silicon coating film as compared to that after said first annealing process.

39. A method for making a thin film device according to claim 38, wherein said second annealing process is performed by laser annealing or lamp annealing.

40. A method for making a thin film device according to claim 35, wherein the step of implanting further comprises:

forming a layer containing an impurity by coating onto said silicon coating film; and heating said layer containing said impurity to diffuse said impurity into said silicon coating film.

41. A method for making a thin film device according to claim 34, wherein said at least one conductive layer is manufactured by the steps comprising:

applying a coating solution containing conductive particles onto said substrate; and applying a first annealing process onto the coated surface to form a conductive coating film;

said at least one conductive layer being formed of said conductive coating film.

42. A method for making a thin film device according to claim 41, further comprising subsequent to said first annealing process, performing a second annealing process at a temperature higher than a temperature used in said first annealing process is performed after said second annealing process so as to reduce the resistance of said conductive coating film compared to that after said first annealing process.

43. A method for making a thin film device according to claim 42, wherein said second annealing process is performed by laser annealing or lamp annealing.

44. A method for making a thin film device according to claim 34, wherein said at least one conductive layer is manufactured by the steps comprising:

a first annealing step of annealing said coated surface in an oxygen atmosphere or in a nonreductive atmosphere; and a second annealing step of annealing said coated surface in a hydrogen atmosphere or a reductive atmosphere;

said at least one conductive layer being formed of a transparent conductive coating film.

45. A method for making a thin film device according to claim 44, wherein the annealing temperature in said second annealing step is lower than the annealing temperature in said first annealing step.

46. A method for making a thin film device according to claim 44, wherein subsequent to said second annealing steps said substrate is maintained in a nonoxidative atmosphere until the temperature of said substrate decreases to 200° C. or less.

47. A method for making a thin film device according to claim 44, wherein a coating solution containing indium (In) and tin (Sn) is applied onto said substrate to form said transparent conductive coating film by an ITO (indium tin oxide) coating film.

48. A method for making a thin film device according to claim 47, further comprising applying a metal-plating on a surface of said ITO coating film subsequent to said second annealing step.

49. A method for making a thin film device according to claim 47, further comprising forming a conductive sputtering film onto the contact face of said ITO coating film by a sputtering process.

50. A method for making a thin film device according to claim 34, wherein said coating solution is applied onto only a coating region on said substrate to form a patterned coating film on said substrate.

51. A method for making a thin film device comprising:

providing a coating solution-dispenser head including a plurality of nozzles;

providing a substrate having a coating region; and discharging a coating solution onto only said coating region on said substrate while simultaneously changing a relative position between said substrate and said plurality of nozzles to form a patterned coating film on said substrate.

52. A method for making a thin film device according to claim 51, wherein said plurality of nozzles are selectively independently controlled in discharging states or nondischarging states, and the relative position between said substrate and said plurality of nozzles is changed while simultaneously controlling the coating timing at individual nozzles.

53. A method for making a thin film device according to claim 51, wherein said coating solution is a resist solution, and said resist solution is applied in a pattern and then annealed to pattern-form a resist film.

54. A method for making a thin film device according to claim 51, wherein said coating solution contains a constituent of a thin film which is pattern-formed onto said substrate, and said coating solution is applied in a pattern and then annealed to pattern-form said thin film.

55. A method for making a thin film device according to claim 54, wherein said thin film is a conductive layer.

56. A method for making a thin film device according to claim 54, wherein said thin film is an insulating layer pattern.

57. A method for making a thin film device according to claim 56, wherein a contact hole is formed in said insulating layer.

* * * * *